(12) United States Patent
Sugahara et al.

(10) Patent No.: US 12,321,262 B2
(45) Date of Patent: Jun. 3, 2025

(54) MEMORY SYSTEM WHICH ORDERS DATA FETCHING FROM A LATCH CIRCUIT DURING EXECUTION OF A READ OPERATION

(71) Applicant: Kioxia Corporation, Tokyo (JP)

(72) Inventors: Akio Sugahara, Kanagawa (JP); Masaki Fujiu, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 19 days.

(21) Appl. No.: 18/267,975

(22) PCT Filed: Dec. 28, 2020

(86) PCT No.: PCT/JP2020/049130
§ 371 (c)(1),
(2) Date: Jun. 16, 2023

(87) PCT Pub. No.: WO2022/144969
PCT Pub. Date: Jul. 7, 2022

(65) Prior Publication Data
US 2024/0111671 A1  Apr. 4, 2024

(51) Int. Cl.
*G06F 12/02* (2006.01)

(52) U.S. Cl.
CPC .............................. *G06F 12/0246* (2013.01)

(58) Field of Classification Search
CPC ..... G06F 12/0246; G11C 16/08; G11C 16/26; G11C 16/32; G11C 16/0483
See application file for complete search history.

(56) References Cited

U.S. PATENT DOCUMENTS

| 11,423,958 | B2 | 8/2022 | Sugahara |
| 12,087,396 | B2 * | 9/2024 | Kurosawa ............... G11C 7/222 |
| 2003/0147297 | A1 | 8/2003 | Shiota et al. |
| 2005/0210163 | A1 | 9/2005 | Suzuki et al. |

(Continued)

FOREIGN PATENT DOCUMENTS

| JP | 2003233529 A | 8/2003 |
| JP | 2005267148 A | 9/2005 |
| JP | 2021174565 A | 11/2021 |

OTHER PUBLICATIONS

International Search Report (ISR) (and English translation thereof) dated Feb. 16, 2021, issued in International Application No. PCT/JP2020/049130.

*Primary Examiner* — Sean D Rossiter
(74) *Attorney, Agent, or Firm* — Holtz, Holtz & Volek PC

(57) ABSTRACT

A memory system according to an embodiment includes: a first chip including a first plane and a first input/output circuit; and a controller which is capable of issuing a command for controlling the first chip. The first plane includes: a first memory cell array having a plurality of first memory cell transistors; and a first latch circuit which is capable of storing first read data read from the first memory cell array. The first input/output circuit includes a first FIFO circuit which is capable of fetching the first read data from the first latch circuit. The controller is capable of transmitting to the first chip a first command for ordering fetching of the first read data from the first latch circuit to the first FIFO circuit during a period in which a read operation is executed on the first plane.

12 Claims, 40 Drawing Sheets

(56) References Cited

U.S. PATENT DOCUMENTS

| | | | |
|---|---|---|---|
| 2007/0076474 A1* | 4/2007 | Fujisawa | G11C 7/1069 365/185.03 |
| 2013/0145085 A1* | 6/2013 | Yu | G06F 12/0246 711/103 |
| 2014/0250260 A1 | 9/2014 | Yap | |
| 2014/0269073 A1 | 9/2014 | Itagaki | |
| 2017/0269669 A1* | 9/2017 | Choi | G06F 3/0688 |
| 2019/0080763 A1 | 3/2019 | Kajiyama et al. | |
| 2019/0294345 A1* | 9/2019 | Yu | G06F 12/0638 |
| 2021/0103407 A1* | 4/2021 | Na | G06F 1/06 |
| 2021/0335398 A1* | 10/2021 | Sugahara | G11C 16/26 |
| 2024/0305576 A1* | 9/2024 | Frankenfield | G06F 9/3867 |

* cited by examiner

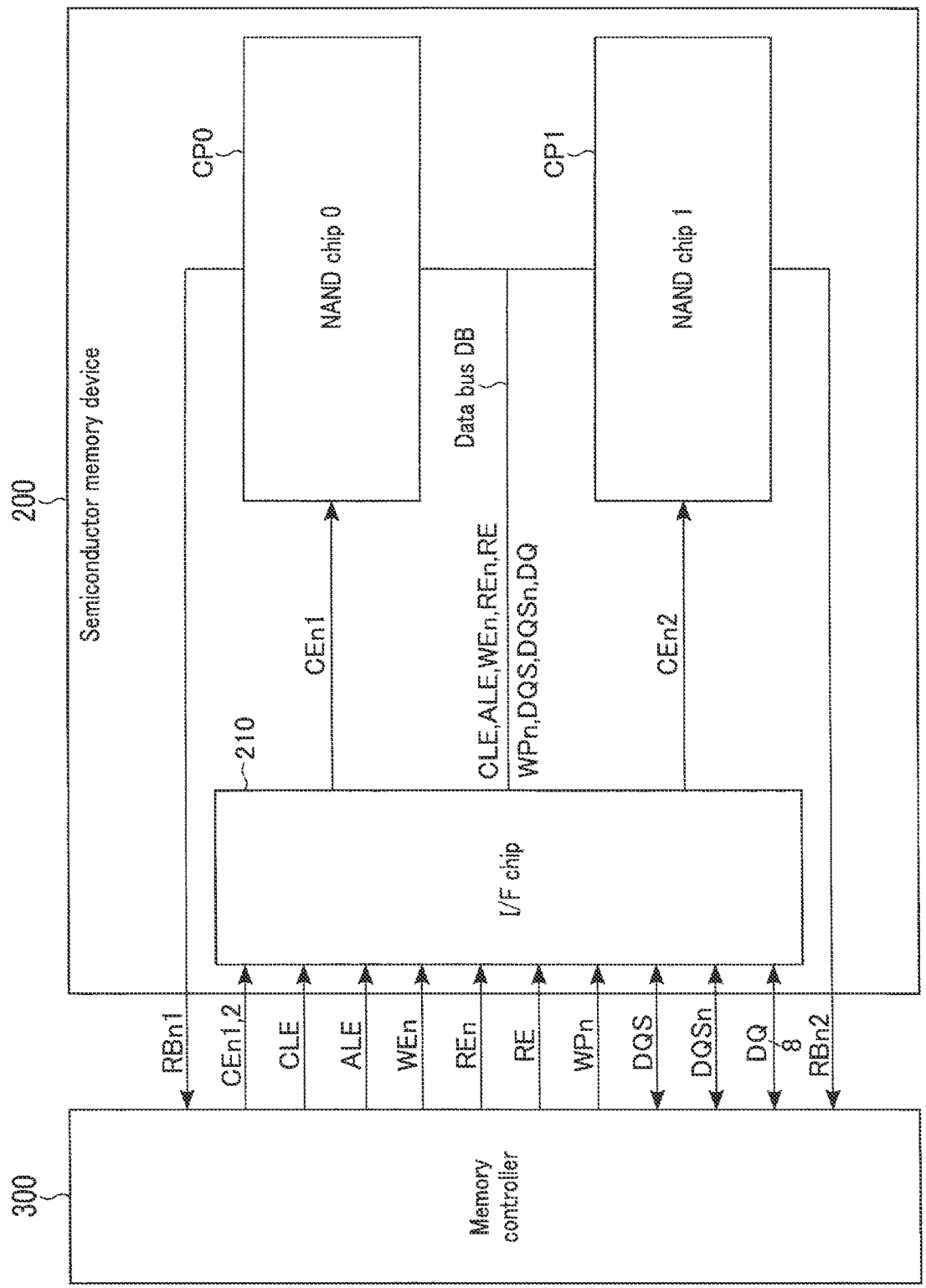
F I G. 2

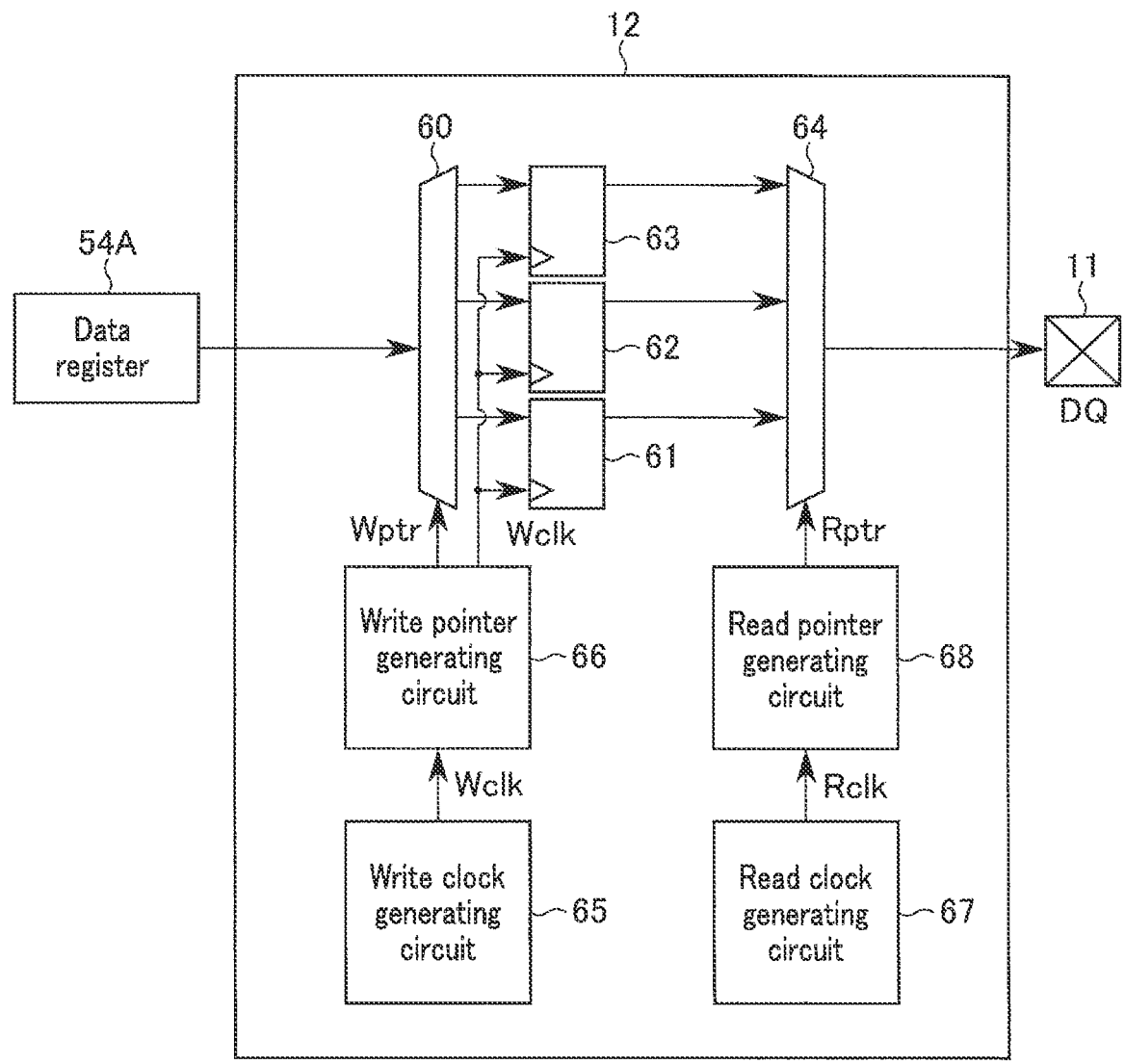
F I G. 7

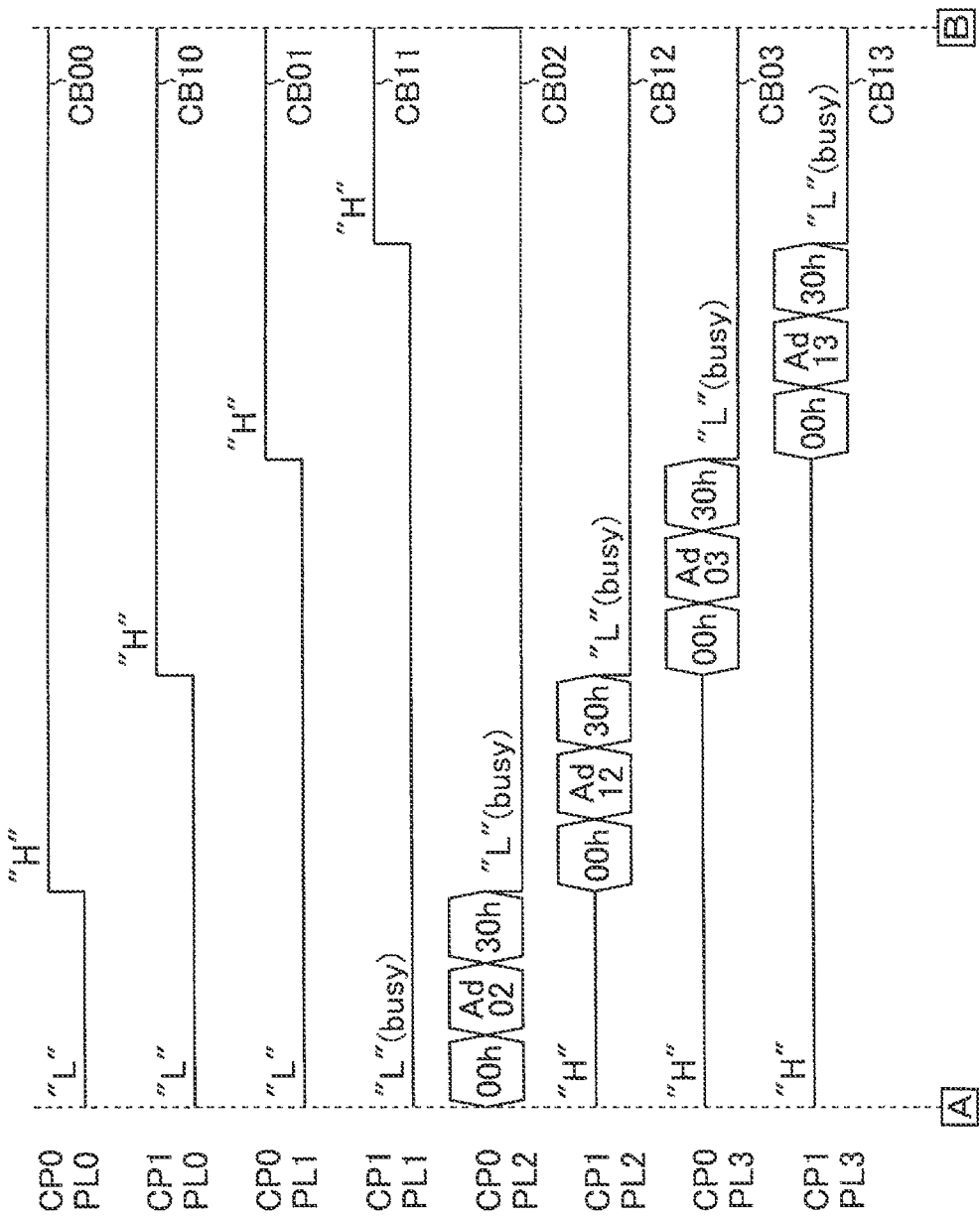
F I G. 9

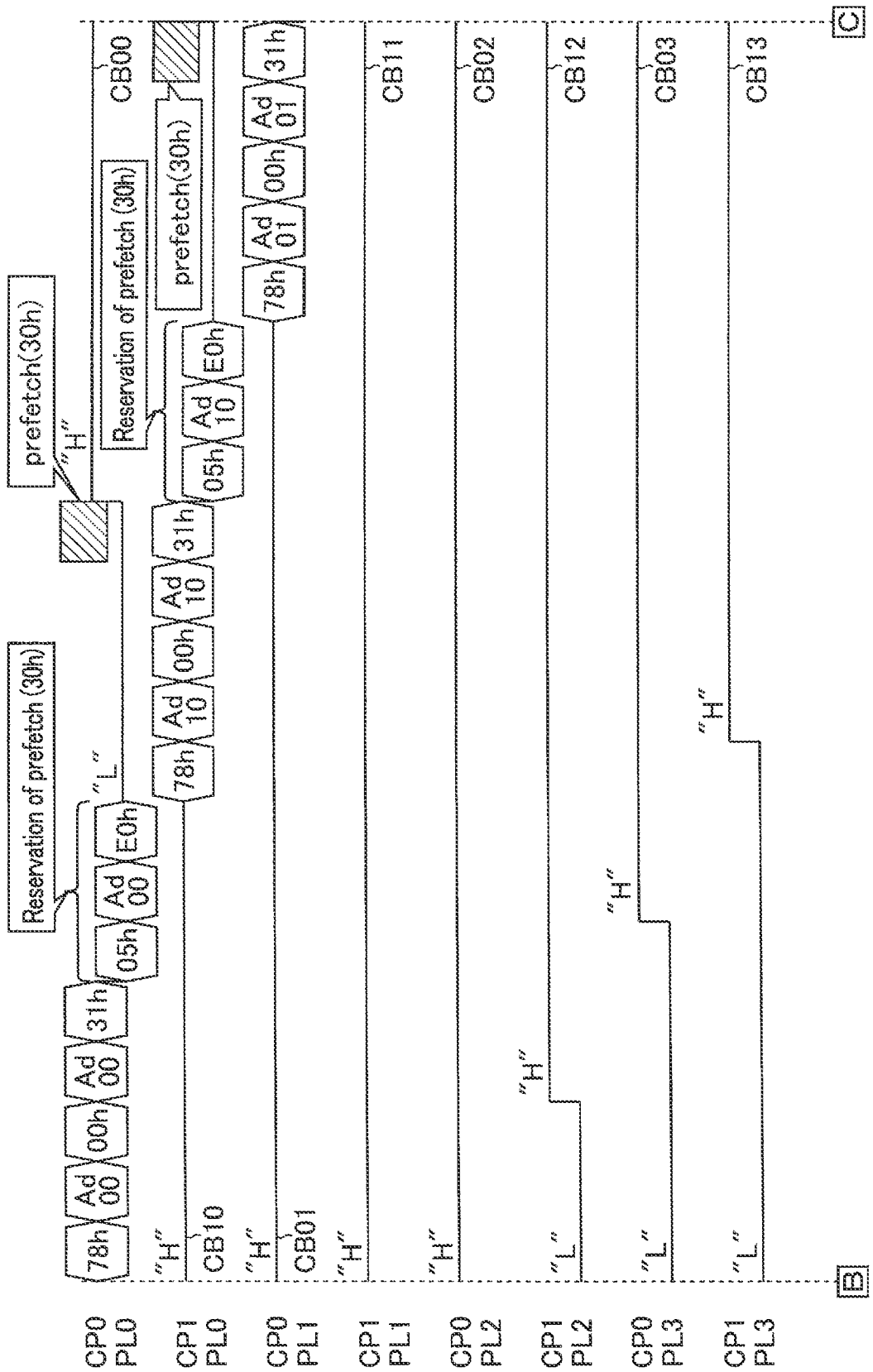
F I G. 10

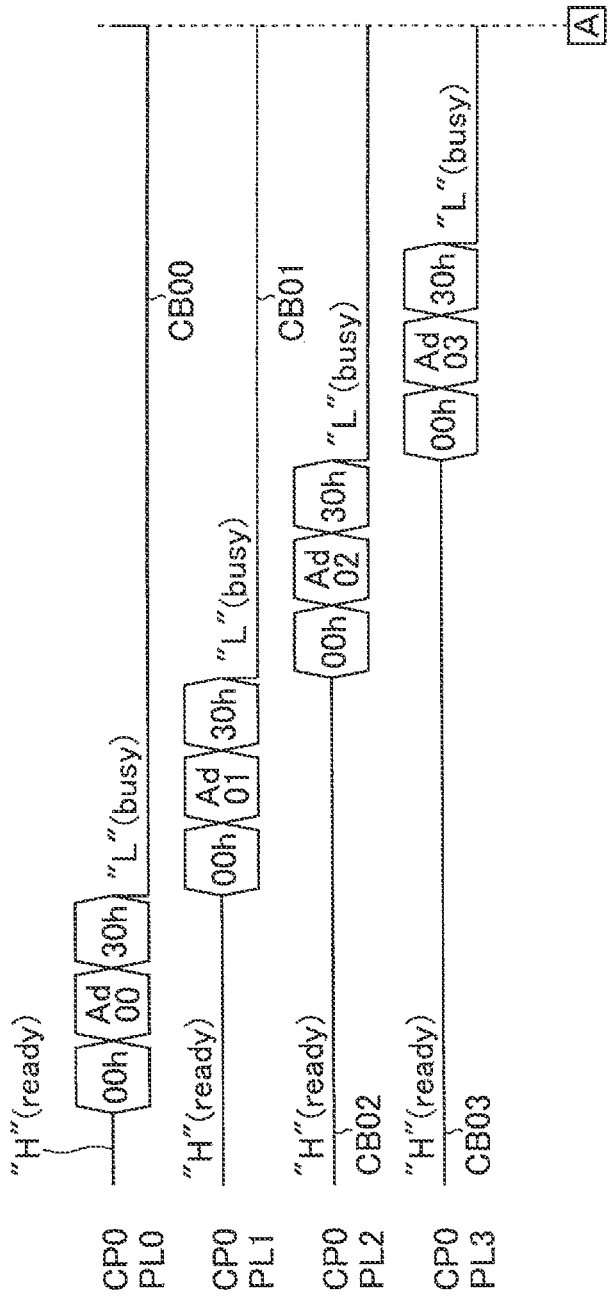
F I G. 19

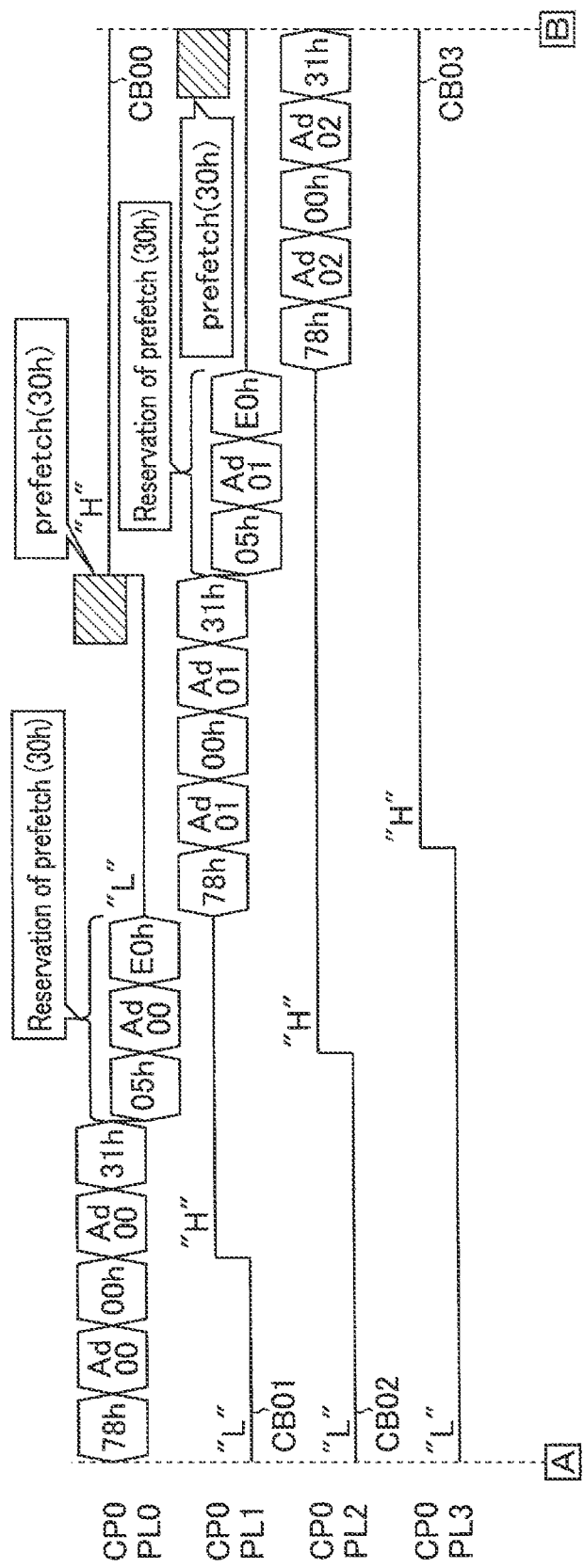
F I G. 20

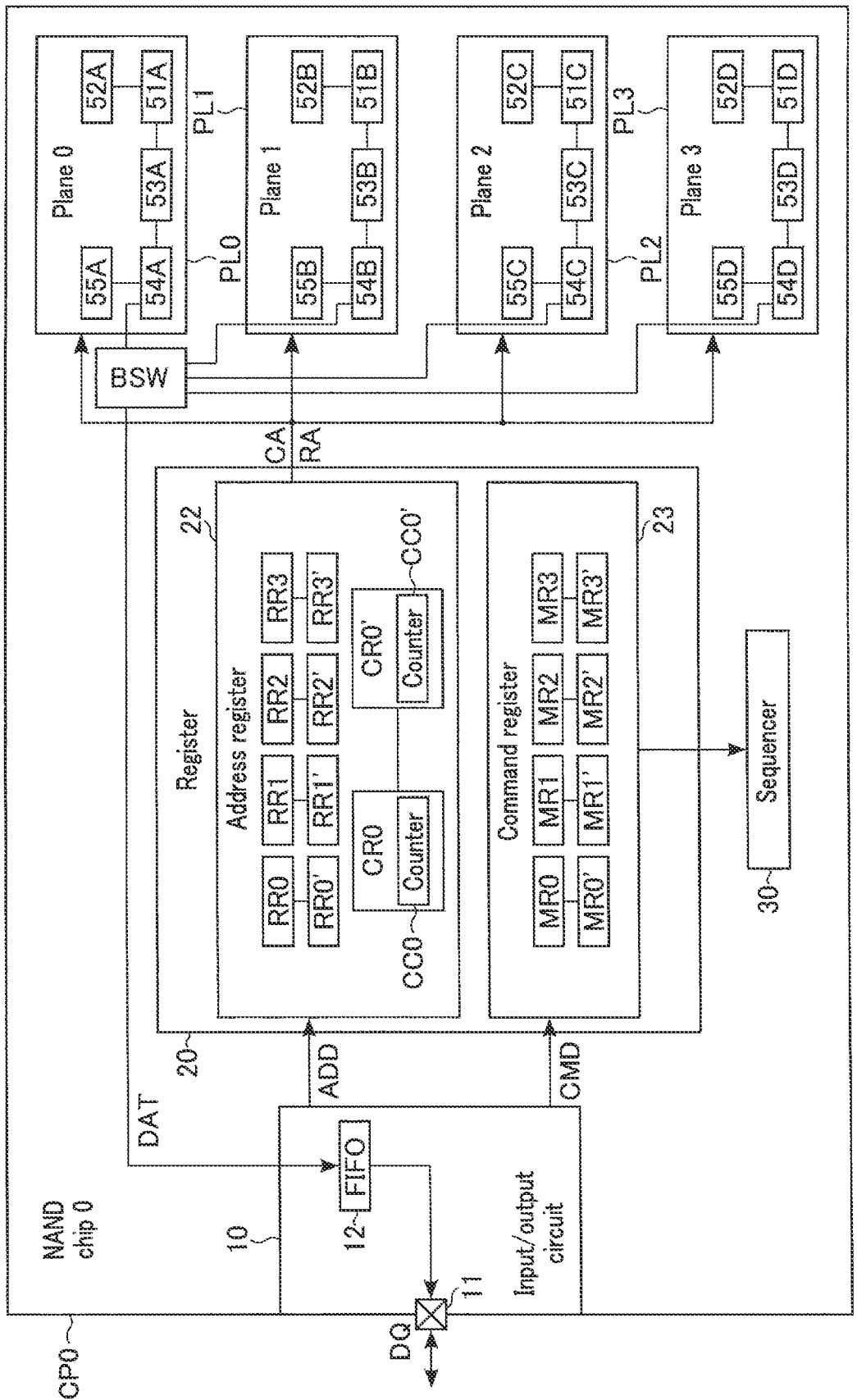
F I G. 24

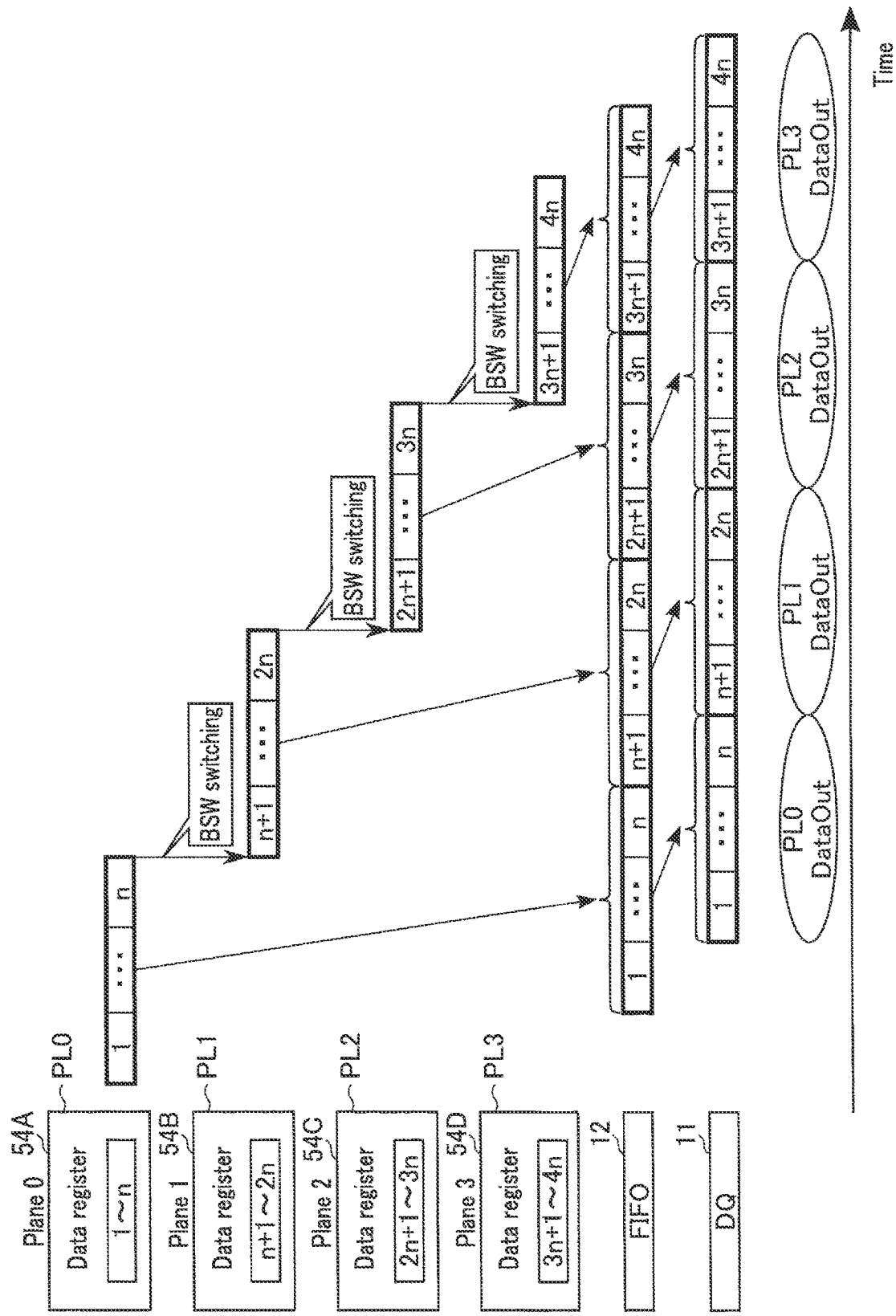
F I G. 25

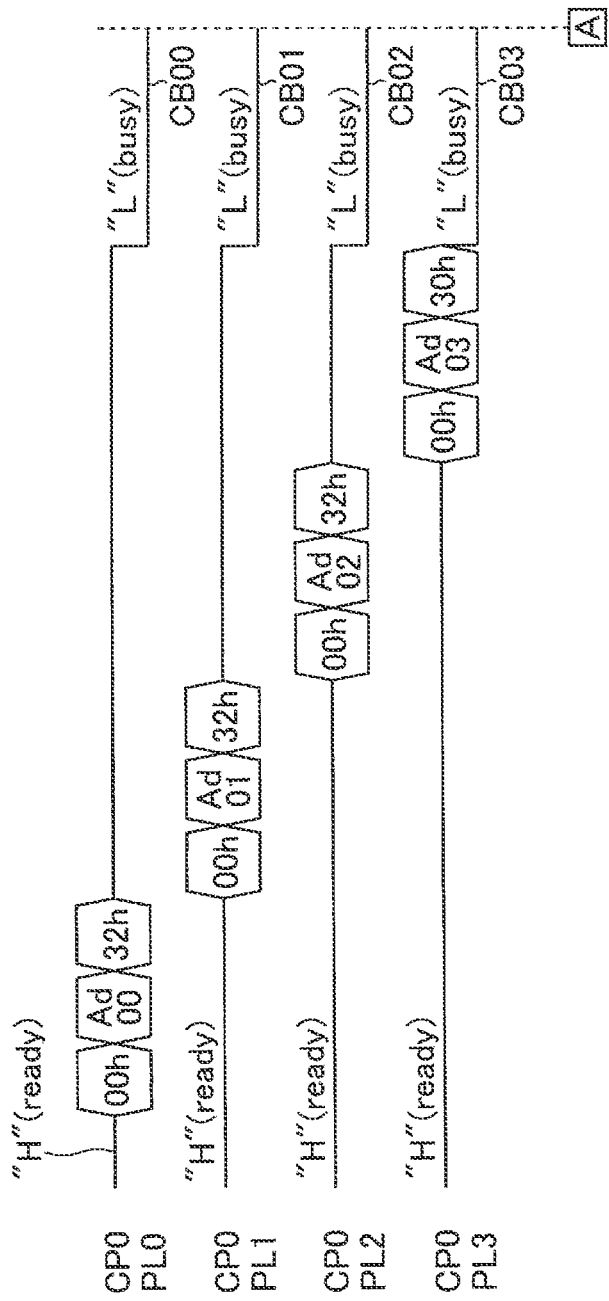
F I G. 26

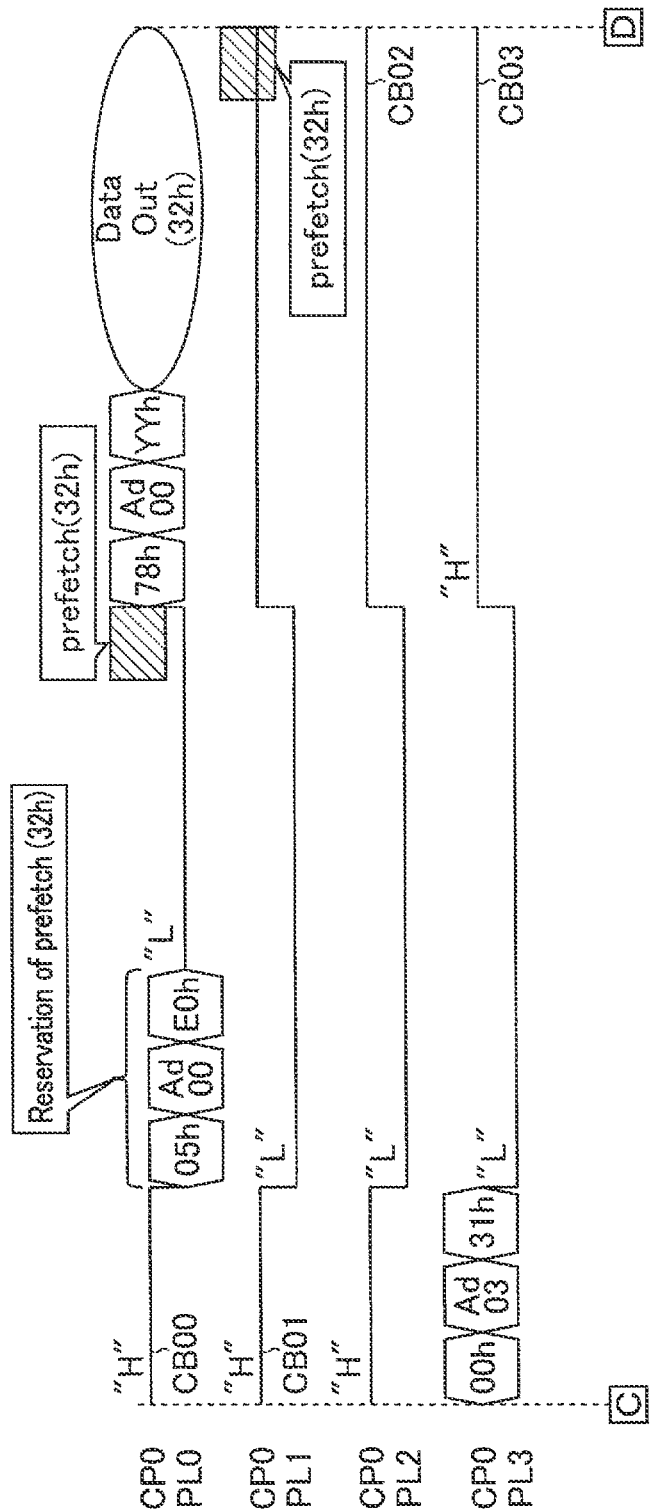
F I G. 28

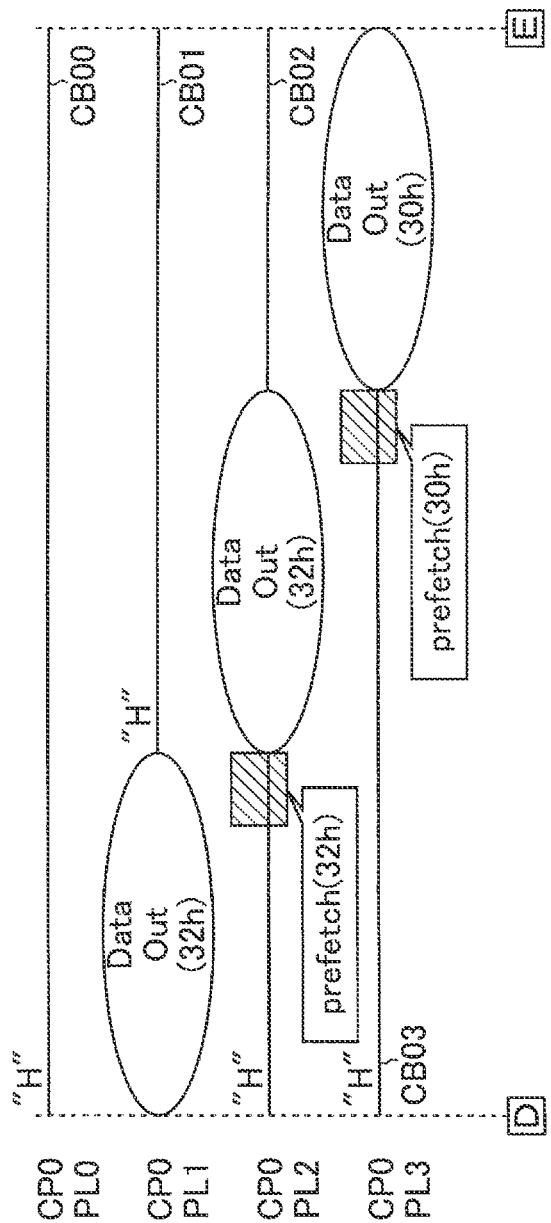
F I G. 29

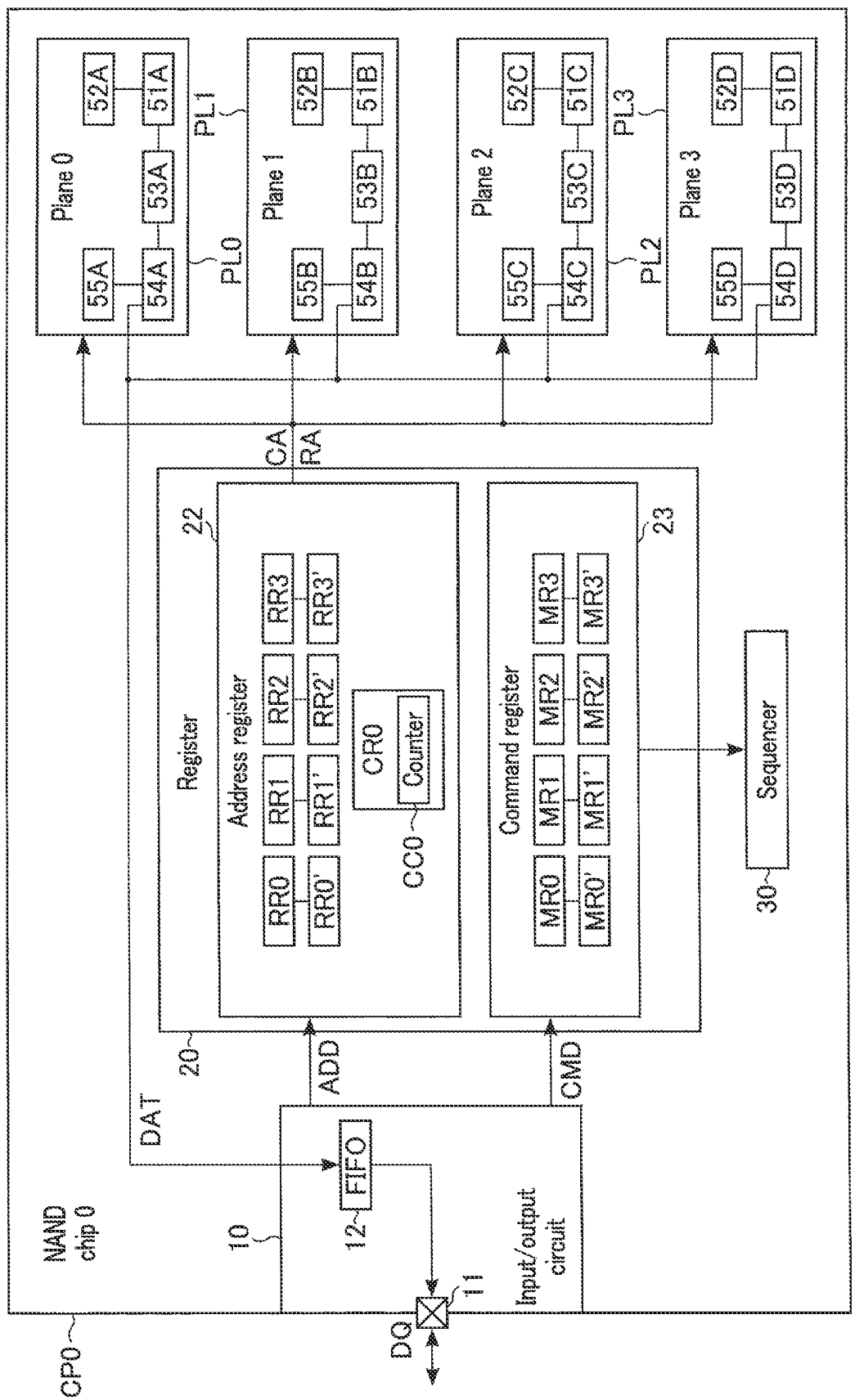
F I G. 30

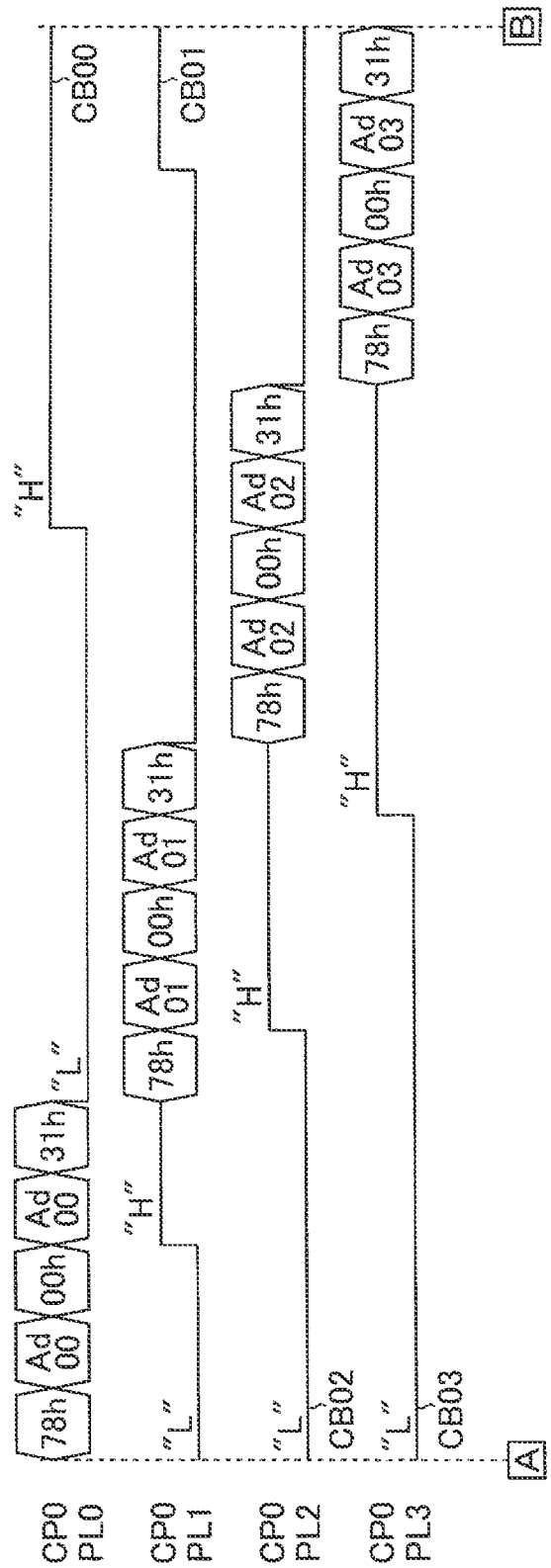
F I G. 31

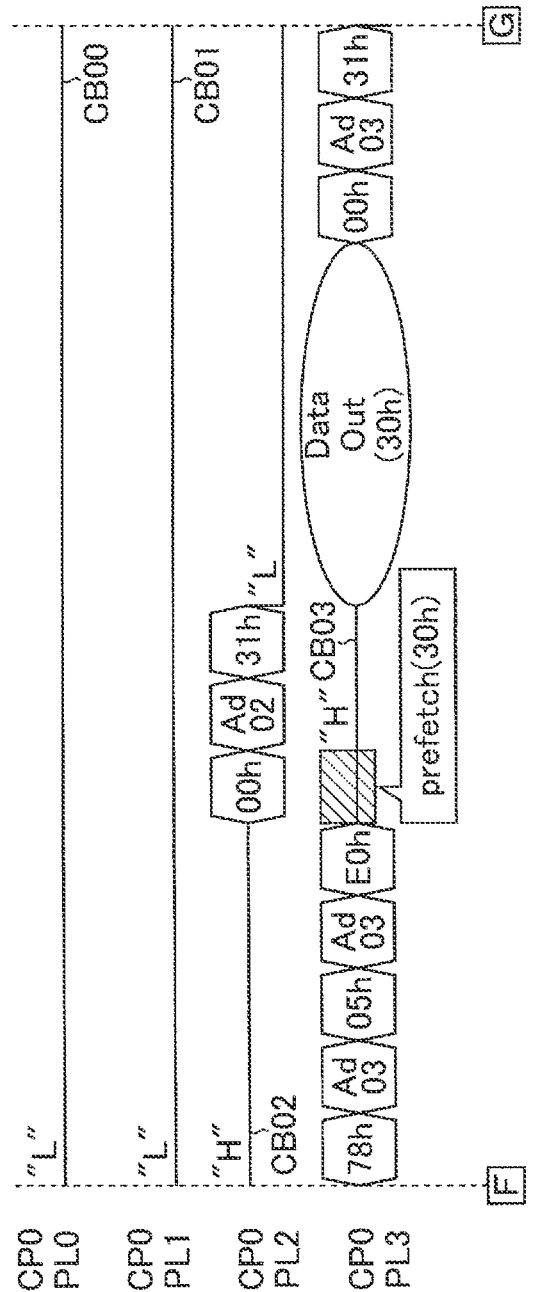
F I G. 35

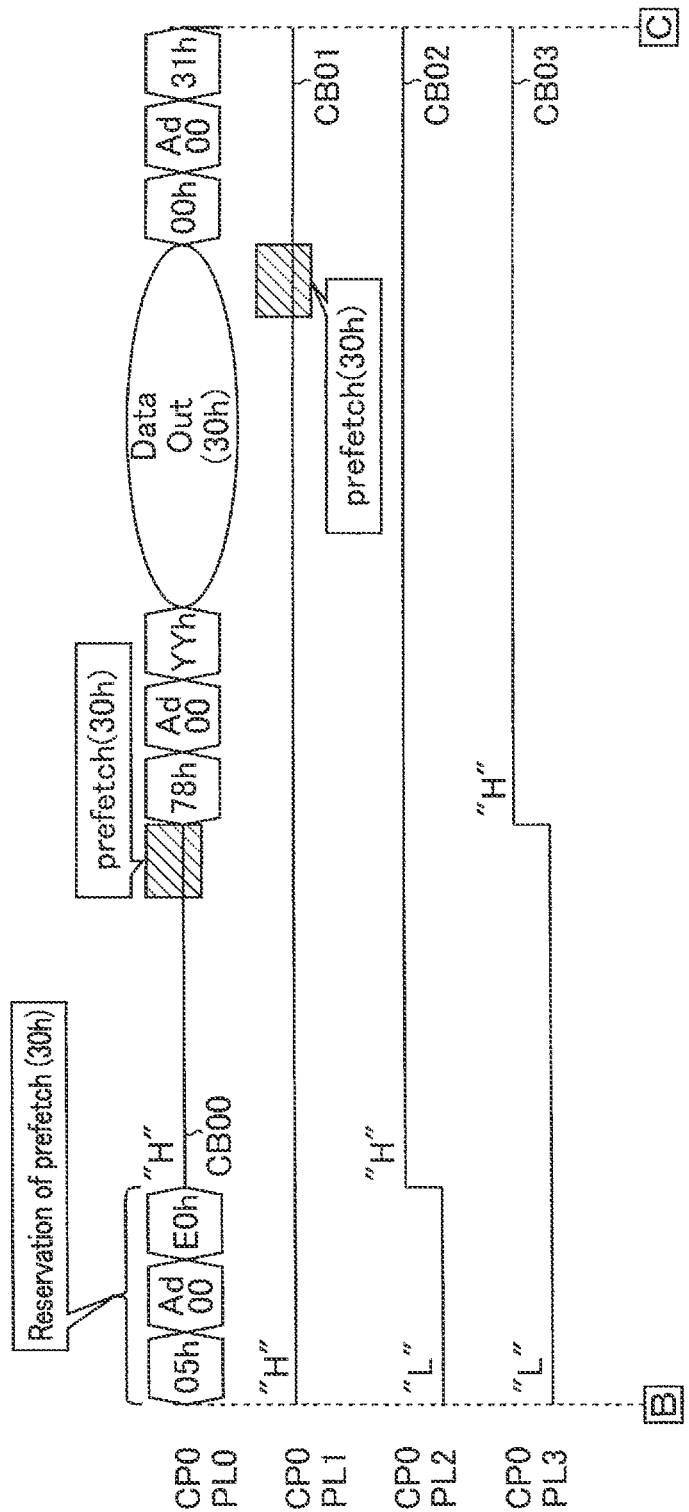
F I G. 36

MEMORY SYSTEM WHICH ORDERS DATA FETCHING FROM A LATCH CIRCUIT DURING EXECUTION OF A READ OPERATION

CROSS REFERENCE

This is a U.S. national phase application under 35 USC 371 of International Application PCT/JP2020/049130 (not published in English), filed Dec. 28, 2020.

FIELD

Embodiments relate to a memory system and a semiconductor memory device included in the memory system.

BACKGROUND

A memory system including a NAND flash memory is known as a semiconductor memory device.

CITATION LIST

Patent Literature

US Patent Application Publication No. 2019/0080763

SUMMARY

Technical Problem

A memory system capable of enhancing the operation speed is provided.

Solution to Problem

A memory system according to an embodiment includes: a first chip including a first plane and a first input/output circuit; and a controller which is capable of issuing a command for controlling the first chip. The first plane includes: a first memory cell array having a plurality of first memory cell transistors; and a first latch circuit which is capable of storing first read data read from the first memory cell array. The first input/output circuit includes a first FIFO circuit which is capable of fetching the first read data from the first latch circuit. The controller is capable of transmitting to the first chip a first command for ordering fetching of the first read data from the first latch circuit to the first FIFO circuit during a period in which a read operation is executed on the first plane.

BRIEF DESCRIPTION OF THE DRAWINGS

FIG. 2 is a block diagram of a semiconductor memory device included in the memory system according to the first embodiment.

FIG. 7 is a block diagram showing an example of a First In First Out (FIFO) circuit in the input/output circuit included in the memory system according to the first embodiment.

FIG. 9 is a diagram showing an example of the command sequence in the read operation of the memory system according to the first embodiment.

FIG. 10 is a diagram showing an example of the command sequence in the read operation of the memory system according to the first embodiment.

FIG. 19 is a diagram showing an example of a command sequence in a read operation of the memory system according to the second embodiment.

FIG. 20 is a diagram showing an example of the command sequence in the read operation of the memory system according to the second embodiment.

FIG. 24 is a block diagram showing a configuration of a NAND chip included in a memory system according to a third embodiment, focusing on an input/output circuit and a register.

FIG. 25 is a diagram illustrating an overview of a data flow in a read operation of the memory system according to the third embodiment.

FIG. 26 is a diagram showing an example of a command sequence in the read operation of the memory system according to the third embodiment.

FIG. 28 is a diagram showing an example of the command sequence in the read operation of the memory system according to the third embodiment.

FIG. 29 is a diagram showing an example of the command sequence in the read operation of the memory system according to the third embodiment.

FIG. 30 is a block diagram showing a configuration of a NAND chip included in a memory system according to a fourth embodiment, focusing on an input/output circuit and a register.

FIG. 31 is a diagram showing an example of a command sequence in a read operation of the memory system according to the fourth embodiment.

FIG. 35 is a diagram showing an example of the command sequence in the read operation of the memory system according to the fourth embodiment.

FIG. 36 is a diagram showing an example of a command sequence in a read operation of a memory system according to a fifth embodiment.

DETAILED DESCRIPTION

Hereinafter, embodiments will be described with reference to the drawings. In the description, common parts are assigned common reference signs throughout the drawings.

1. First Embodiment

Figure 1:
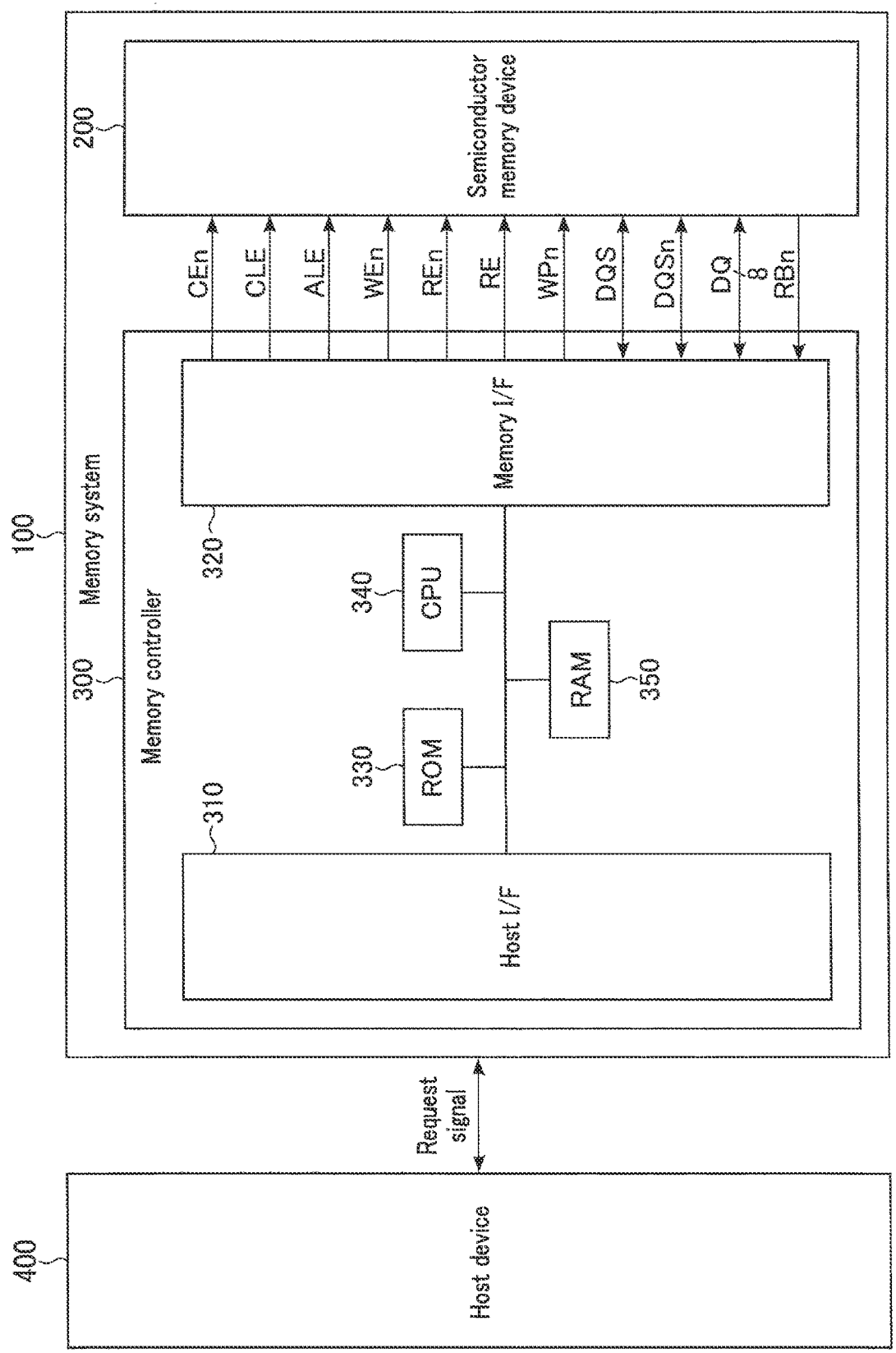
FIG. 1 is a block diagram of a memory system according to a first embodiment.

A memory system according to the first embodiment will be described. In the following, a memory system including a NAND flash memory (hereinafter referred to as a "NAND chip") as a semiconductor memory device will be described as an example.
1.1 Configuration
1.1.1 Overall Configuration of Memory System An overall configuration of a memory system according to the present embodiment will be described with reference to FIG. 1. FIG. 1 is a block diagram of the memory system according to the present embodiment.

A memory system 100 includes a semiconductor memory device 200 and a memory controller 300. The memory system 100 is controlled by a host device (hereinafter, simply referred to as a "host") 400. The memory system 100 performs processing based on a request signal received from the host 400. The memory system 100 is, for example, a solid state drive (SSD), a universal serial bus (USB) memory, a multi-media card (MMC), or an SD™ card. The host 400 is, for example, a digital camera or a personal computer.

For example, the semiconductor memory device 200 includes an I/F chip and a NAND chip, and stores data in a nonvolatile manner. A plurality of NAND chips may be provided inside the semiconductor memory device 200. The I/F chip may be omitted. In such a case, the NAND chip functions as the semiconductor memory device. The semiconductor memory device 200 is controlled by the memory controller 300. A plurality of semiconductor memory devices 200 may be provided inside the memory system 100. In such a case, each of the semiconductor memory devices 200 is independently operable under the control of the memory controller 300.

The memory controller 300 receives the request signal from the host 400 via a host bus. The type of the host bus and the request signal transmitted via the host bus depend on an application applied in the memory system 100. In the case of the memory system 100 being the SSD, for example, an interface under the serial attached SCSI (SAS), serial ATA (SATA), programmable communications interface express (PCIe™), or universal flash storage (UFS) standard is used for the host bus. In the case of the memory system 100 being the USB memory, a USB is used for the host bus. In the case of the memory system 100 being the MMC, an interface under the eMMC standard is used for the host bus. In the case of the memory system 100 being the SD™ card, an interface under the SD™ standard is used for the host bus.

The memory controller 300 controls the semiconductor memory device 200 based on the request signal received from the host 400. For this, the memory controller 300 is coupled to the semiconductor memory device 200 via a NAND bus. The NAND bus performs signal transmission/reception in compliance with a NAND interface. Specific examples of such signal include a chip enable signal CEn, a command latch enable signal CLE, an address latch enable signal ALE, a write enable signal WEn, read enable signals REn and RE, a write protect signal WPn, data strobe signals DQS and DQSn, an input/output signal DQ, and a ready/busy signal RBn.

The signal CEn is a signal for enabling the NAND chip inside the semiconductor memory device 200, and is asserted at, for example, a Low ("L") level. The term "assert" means that a signal (or logic) is in a valid (active) state. The signal CLE is a signal indicating that the signal DQ is a command, and is asserted at, for example, a High ("H") level. The signal ALE is a signal indicating that the signal DQ is an address, and is asserted at, for example, the "H" level. The signal WEn is a signal for fetching a received signal to the semiconductor memory device 200, and is asserted at, for example, the "L" level. Every time the signal WEn is toggled, the semiconductor memory device 200 fetches the signal DQ. The signals REn and RE are each a signal for the memory controller 300 to read data from the semiconductor memory device 200. The signal REn is an inversion signal of the signal RE. Every time the signals REn and RE are toggled, the semiconductor memory device 200 outputs the signal DQ to the memory controller 300. The signal WPn is a signal for prohibiting a write or erase with respect to the semiconductor memory device 200, and is asserted at, for example, the "L" level. The signals CEn, CLE, ALE, WEn, REn, RE, and WPn are each transmitted from the memory controller 300 to the semiconductor memory device 200.

The signals DQS and DQSn are used to control a timing of transmitting and receiving the signal DQ. The signal DQSn is an inversion signal of the signal DQS. For example, when data is written, the signals DQS and DQSn are transmitted together with the write data DQ from the memory controller 300 to the semiconductor memory device 200. The semiconductor memory device 200 receives the write data DQ in synchronization with the signals DQS and signal DQSn. When data is read, the signals DQS and DQSn are transmitted together with the read data DQ from the semiconductor memory device 200 to the memory controller 300. The signals DQS and DQSn are generated based on the aforementioned signal REn. The memory controller 300 receives the read data DQ in synchronization with the signals DQS and DQSn.

The input/output signal DQ is, for example, an eight-bit signal (hereinafter, these eight signals DQ will be respectively referred to as signals DQ0 to DQ7 when they are distinguished from each other, and will be simply referred to as a signal DQ when they are not distinguished from each other). The input/output signal DQ is an entity of data transmitted and received between the semiconductor memory device 200 and the memory controller 300, and is, for example, a command CMD, an address ADD, write data or read data DAT, and status information STS.

The signal RBn is a signal indicating whether the NAND chip inside the semiconductor memory device 200 is in a busy state or in a ready state, and the signal RBn is set to the "L" level when the NAND chip is, for example, in the busy state. The NAND chip is capable of receiving a command from the memory controller 300 in the case of the signal RBn being in the ready state, and is incapable of receiving a command from the memory controller 300 in the case of the signal RBn being in the busy state. The signal RBn is transmitted from the semiconductor memory device 200 to the memory controller 300.

The memory controller 300 includes a host interface circuit (host I/F) 310, a memory interface circuit (memory I/F) 320, a read only memory (ROM) 330, a central processing unit (CPU) 340, and a random access memory (RAM) 350.

The host interface circuit 310 is coupled to the host 400 via the host bus, and controls communications between the memory controller 300 and the host 400.

The memory interface circuit 320 is coupled to the semiconductor memory device 200 via the NAND bus, and controls communications between the memory controller 300 and the semiconductor memory device 200.

The ROM 330 stores firmware (programs) for the memory controller 300 to execute various operations and some of the functions of the host interface circuit 310 and the memory interface circuit 320. Firmware is configured to allow the memory controller 300 to perform the operations described as each of embodiments.

The CPU 340 controls the operation of the entire memory controller 300. When receiving, for example, the request signal relating to a read from the host 400, the CPU 340 causes, based on the received request signal, the memory interface circuit 320 to issue a read command with respect to the semiconductor memory device 200. The CPU 340 performs a similar operation when receiving the request signal relating to a write from the host 400.

The RAM 350 is used as a work area of the CPU 340. The RAM 350 is a semiconductor memory such as a DRAM, an SRAM, etc. The RAM 350 stores, for example, the aforementioned firmware. The aforementioned firmware is loaded by the memory controller 300 into the RAM 350, for example, immediately after the memory system 100 is powered on.

1.1.2 Configuration of Semiconductor Memory Device 200

A configuration of the semiconductor memory device 200 will be described with reference to FIG. 2. FIG. 2 is a block diagram of the semiconductor memory device 200 included in the memory system 100 according to the present embodiment.

The semiconductor memory device 200 includes an I/F chip 210, a NAND chip 0 (CP0), and a NAND chip 1 (CP1). The I/F chip 210 is coupled to the memory controller 300 via the NAND bus and controls communications between the memory controller 300 and the NAND chips 0 and 1 (CP0 and CP1). The NAND chip 0 (CP0) and the NAND chip 1 (CP1) are each a NAND flash memory. Hereinafter, the "NAND chip 0" and the "NAND chip 1" may be simply referred to as a "chip 0" and a "chip 1", respectively. The number of NAND chips provided inside the semiconductor memory device 200 is not limited to two, and may be one, or two or more. The NAND chip 0 (CP0) and the NAND chip 1 (CP1) are controlled by the memory controller 300. The NAND chip 0 (CP0) and the NAND chip 1 (CP1) are coupled to a common data bus DB. The NAND chips are not necessarily coupled to the common data bus DB, and it suffices that the plurality of NAND chips are coupled to a single data bus DB.

The memory controller 300 may transmit a different signal CEn for each NAND chip, and may transmit a common signal CEn for the plurality of NAND chips. For example, in the case of transmitting the signal CEn, which is different for each NAND chip, the signal CEn includes signals CEn1 and CEn2 respectively corresponding to the NAND chip 0 (CP0) and the NAND chip 1 (CP1). In the case of transmitting the signal CEn, which is common for the plurality of NAND chips, the NAND chip is selected based on the signal CEn and an address that designates the NAND chip. The signal RBn includes signals RBn1 and RBn2 respectively corresponding to the NAND chip 0 (CP0) and the NAND chip 1 (CP1). The number of signals RBn is the same as the number of NAND chips provided inside the semiconductor memory device 200.

The I/F chip 210 receives the signals CEn1, CEn2, CLE, ALE, WEn, REn, RE, WPn, DQS, DQSn, and DQ from the memory controller 300. The I/F chip 210 transmits the received signals CLE, ALE, WEn, REn, RE, WPn, DQS, DQSn, and DQ to the NAND chip 0 (CP0) and the NAND chip 1 (CP1) via the data bus DB. The I/F chip 210 transmits the received signal CEn1 to the NAND chip 0 (CP0). The I/F chip 210 transmits the received signal CEn2 to the NAND chip 1 (CP1).

The I/F chip 210 receives the signals DQS, DQSn, and DQ from the NAND chip 0 (CP0) and the NAND chip 1 (CP1). The I/F chip 210 transmits the received signals DQS, DQSn, and DQ to the memory controller 300.

The NAND chip 0 (CP0) transmits the signal RBn1 to the memory controller 300. The NAND chip 1 (CP1) transmits the signal RBn2 to the memory controller 300.

Data is written into a selected one of the NAND chip 0 (CP0) and the NAND chip 1 (CP1). Data is read from a selected one of the NAND chip 0 (CP0) and the NAND chip 1 (CP1).

1.1.3 Configuration of NAND Chip 0 (CP0)

Figure 3:
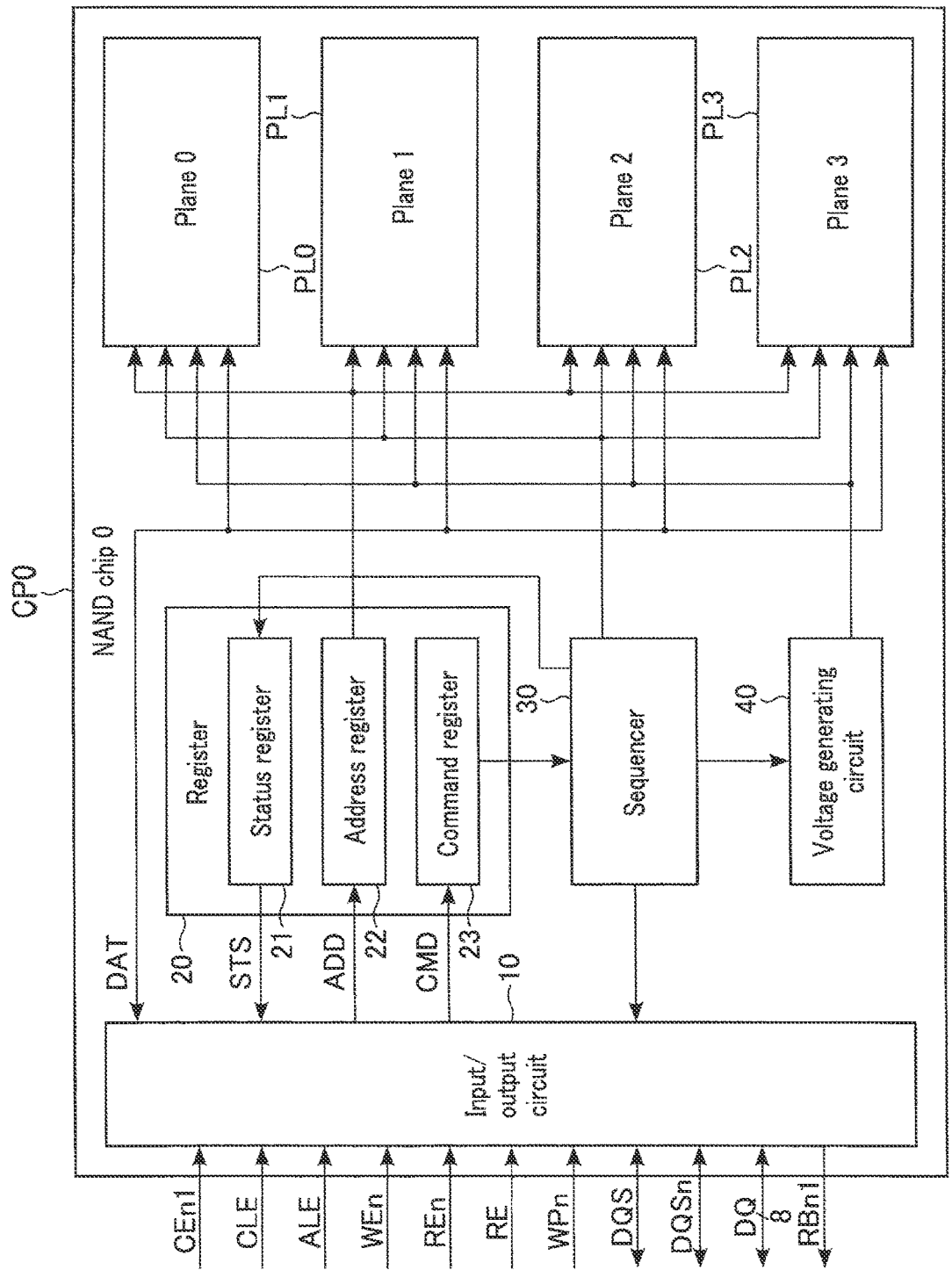
FIG. 3 is a block diagram of a NAND chip in the semiconductor memory device included in the memory system according to the first embodiment.

A configuration of the NAND chip 0 (CP0) will be described with reference to FIG. 3. FIG. 3 is a block diagram of the NAND chip 0 (CP0) inside the semiconductor memory device 200 included in the memory system 100 according to the present embodiment. In FIG. 3, some of the couplings between the blocks are indicated by arrows; however, the couplings between the blocks are not limited to those shown in FIG. 3. The NAND chip 0 (CP0) will be described below; however, the NAND chip 1 (CP1) has the same configuration.

The NAND chip 0 (CP0) includes an input/output circuit 10, a register 20, a sequencer 30, a voltage generating circuit 40, and planes 0 to 3 (PL0 to PL3).

The input/output circuit 10 receives the signals CEn1, CLE, ALE, WEn, REn, RE, and WPn from the memory controller 300. The input/output circuit 10 transmits and receives the signals DQS, DQSn, and DQ to and from the memory controller 300. The input/output circuit 10 transmits the signal RBn1 to the memory controller 300.

The register 20 includes a status register 21, an address register 22, and a command register 23. The status register 21 temporarily stores, for example, the status information STS in a data write operation, a data read operation, and a data erase operation. The address register 22 temporarily stores the address ADD received from the memory controller 300 via the input/output circuit 10. The address ADD includes a row address RA and a column address CA. The command register 23 temporarily stores the command CMD received from the memory controller 300 via the input/output circuit 10.

The sequencer 30 controls the operation of the entire NAND chip 0 (CP0). The sequencer 30 receives the command CMD from the command register 23. The sequencer 30 executes the write operation, the read operation, the erase operation, etc., by controlling the input/output circuit 10, the status register 21, the voltage generating circuit 40, and the planes 0 to 3 (PL0 to PL3) based on the received command CMD.

The voltage generating circuit 40 receives a power supply voltage from an outside of the NAND chip 0 (CP0) and generates various voltages from the power supply voltage under control of the sequencer 30. The voltage generating circuit 40 applies the generated voltages to the planes 0 to 3 (PL0 to PL3).

Each of the planes 0 to 3 (PL0 to PL3) is independently controlled by the sequencer 30. Each of the planes 0 to 3 (PL0 to PL3) is a unit for writing data to a memory cell transistor described later and reading data from the memory cell transistor described later. When writing data, each of the planes 0 to 3 (PL0 to PL3) receives the write data DAT from the memory controller 300 via the input/output circuit 10. When reading data, each of the planes 0 to 3 (PL0 to PL3) transmits the read data DAT to the memory controller 300 via the input/output circuit 10.

Figure 4:
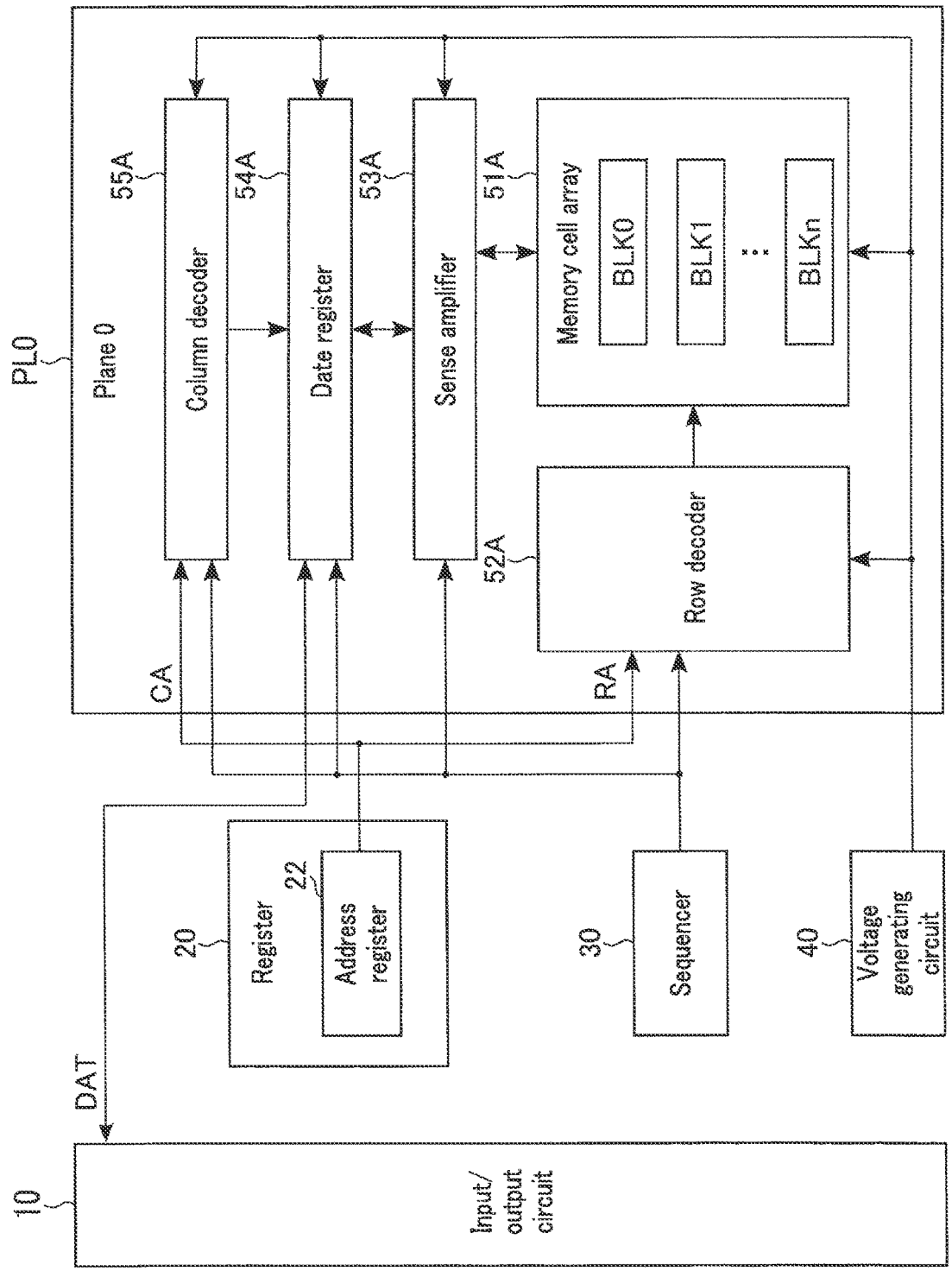
FIG. 4 is a block diagram showing a configuration of the NAND chip included in the memory system according to the first embodiment, focusing on a plane.

A configuration of the plane 0 (PL0) will be described with reference to FIG. 4. FIG. 4 is a block diagram showing a configuration of the NAND chip 0 (CP0) included in the memory system 100 according to the present embodiment, focusing on the plane 0 (PL0). The plane 0 (PL0) will be described below; however, the plane 1 (PL1), the plane 2 (PL2), and the plane 3 (PL3) have the same configuration. In FIG. 4, the status register 21, the command register 23, and the planes 1 to 3 (PL1 to PL3) are omitted.

The plane 0 (PL0) includes a memory cell array 51A, a row decoder 52A, a sense amplifier 53A, a data register 54A, and a column decoder 55A.

The memory cell array 51A has a plurality of blocks BLK (BLK0 to BLKn where n is a natural number equal to or greater than 1) each including nonvolatile memory cell transistors associated with rows and columns. The number of blocks BLK in the memory cell array 51A is freely selected. The memory cell array 51A will be described later in detail. A voltage is applied to the memory cell array 51A from the voltage generating circuit 40.

The row decoder 52A is controlled by the sequencer 30. The row decoder 52A receives the row address RA from the address register 22. The row decoder 52A decodes the received row address RA and based on a result of decoding, applies a voltage supplied from the voltage generating circuit 40 to a selected memory cell transistor.

The sense amplifier 53A is controlled by the sequencer 30. A voltage is applied to the sense amplifier 53A from the voltage generating circuit 40. When reading data, the sense amplifier 53A senses the data DAT read from the memory cell array 51A. The sense amplifier 53A transmits the read data DAT to the data register 54A. When writing data, the sense amplifier 53A transmits the write data DAT to the memory cell array 51A.

The data register 54A is controlled by the sequencer 30. A voltage is applied to the data register 54A from the voltage generating circuit 40. The data register 54A includes a plurality of non-illustrated latch circuits. The latch circuit stores the write data and the read data DAT. For example, when writing data, the data register 54A temporarily stores the write data DAT received from the input/output circuit 10 and transmits it to the sense amplifier 53A. Furthermore, when reading data, the data register 54A temporarily stores the read data DAT received from the sense amplifier 53A and transmits it to the input/output circuit 10.

The column decoder 55A is controlled by the sequencer 30. A voltage is applied to the column decoder 55A from the voltage generating circuit 40. The column decoder 55A receives the column address CA from the address register 22. For example, at the time of the write operation, the read operation, and the erase operation, the column decoder 55A decodes the column address CA and selects the latch circuit inside the data register 54A in accordance with a result of decoding.

1.1.4 Circuit Configuration of Memory Cell Array 51A

Figure 5:
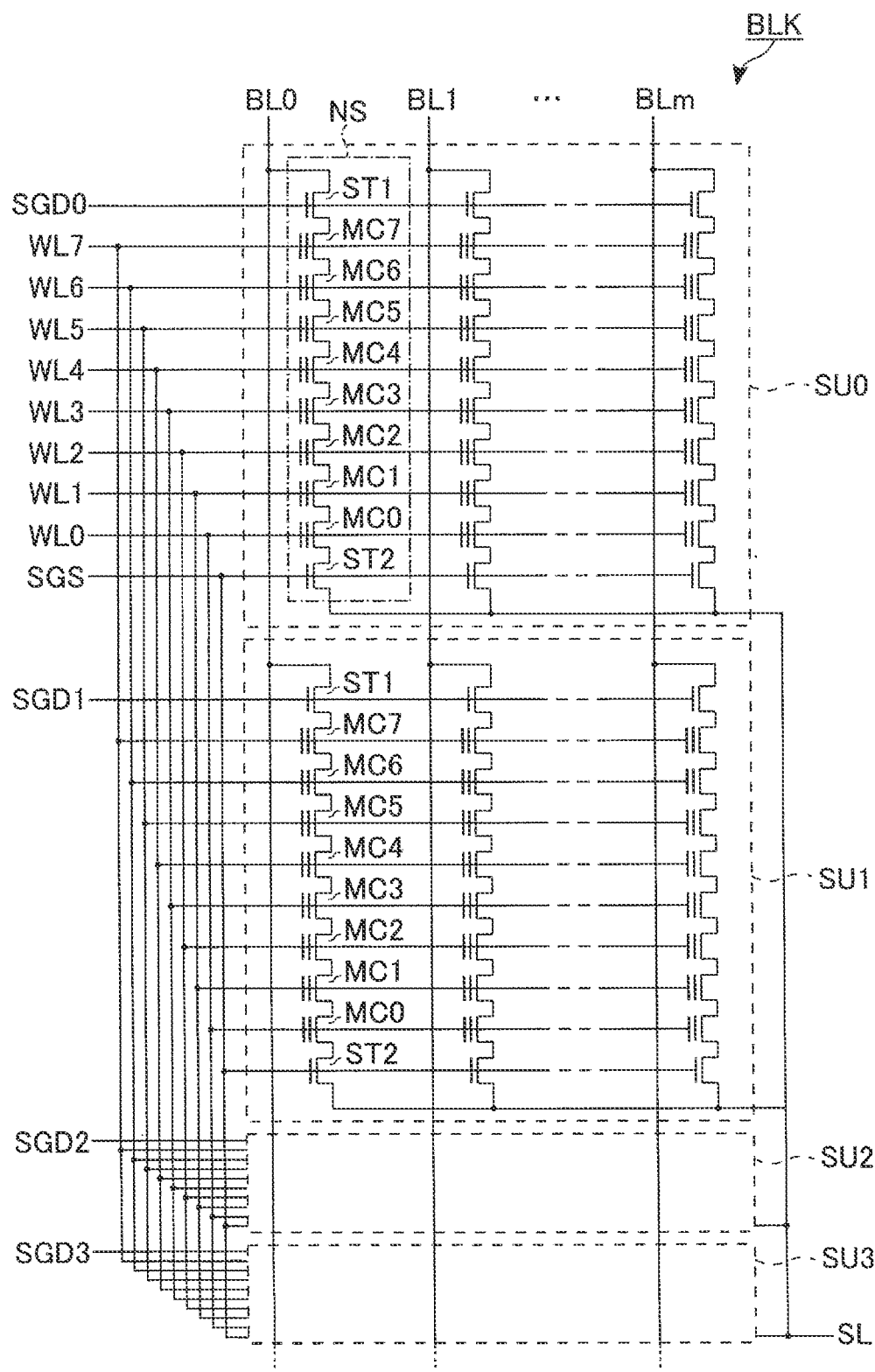
FIG. 5 is a circuit diagram of a memory cell array in the plane included in the memory system according to the first embodiment.

A circuit configuration of the memory cell array 51A will be described with reference to FIG. 5. FIG. 5 is a circuit diagram of the memory cell array 51A inside the plane 0 (PL0) included in the memory system 100 according to the present embodiment.

FIG. 5 shows, as an exemplary circuit configuration of the memory cell array 51A, one of the blocks BLK extracted from the plurality of blocks BLK included in the memory cell array 51A. All the other blocks BLK have the configuration shown in FIG. 5.

Each of the blocks BLK includes, for example, four string units SU0 to SU3. The number of string units SU in each block BLK is freely selected. Each of the string units SU includes a plurality of NAND strings NS. The plurality of NAND strings NS are respectively associated with bit lines BL0 to BLm (m is a natural number equal to or greater than 1). Each of the NAND strings NS includes, for example, memory cell transistors MC0 to MC7 and select transistors ST1 and ST2. Each memory cell transistor MC includes a control gate and a charge storage layer, and stores data in a nonvolatile manner. Each of the select transistors ST1 and ST2 is used to select a string unit SU in respective operations.

In each of the NAND strings NS, the memory cell transistors MC0 to MC7 are coupled in series. In the same block BLK, control gates of the memory cell transistors MC0 to MC7 are respectively coupled in common to word lines WL0 to WL7.

In each NAND string NS, a drain of a select transistor ST1 is coupled to an associated bit line BL, while a source of the select transistor ST1 is coupled to one end of the memory cell transistors MC0 to MC7 coupled in series. In the same block BLK, gates of the select transistors ST1 respectively included in the string units SU0 to SU3 are respectively coupled in common to select gate lines SGD0 to SGD3.

In each of the NAND strings NS, a drain of the select transistor ST2 is coupled to the other end of the memory cell transistors MC0 to MC7 coupled in series. In the same block BLK, sources of the select transistors ST2 are coupled to a source line SL, while gates of the select transistors ST2 are coupled in common to a select gate line SGS.

In the circuit configuration of the memory cell array 51A described in the above, a bit line BL is shared among corresponding NAND strings NS in each block BLK, for example. The source line SL is shared among, for example, the plurality of blocks BLK.

1.1.5 Configuration of Input/Output Circuit 10

Figure 6:
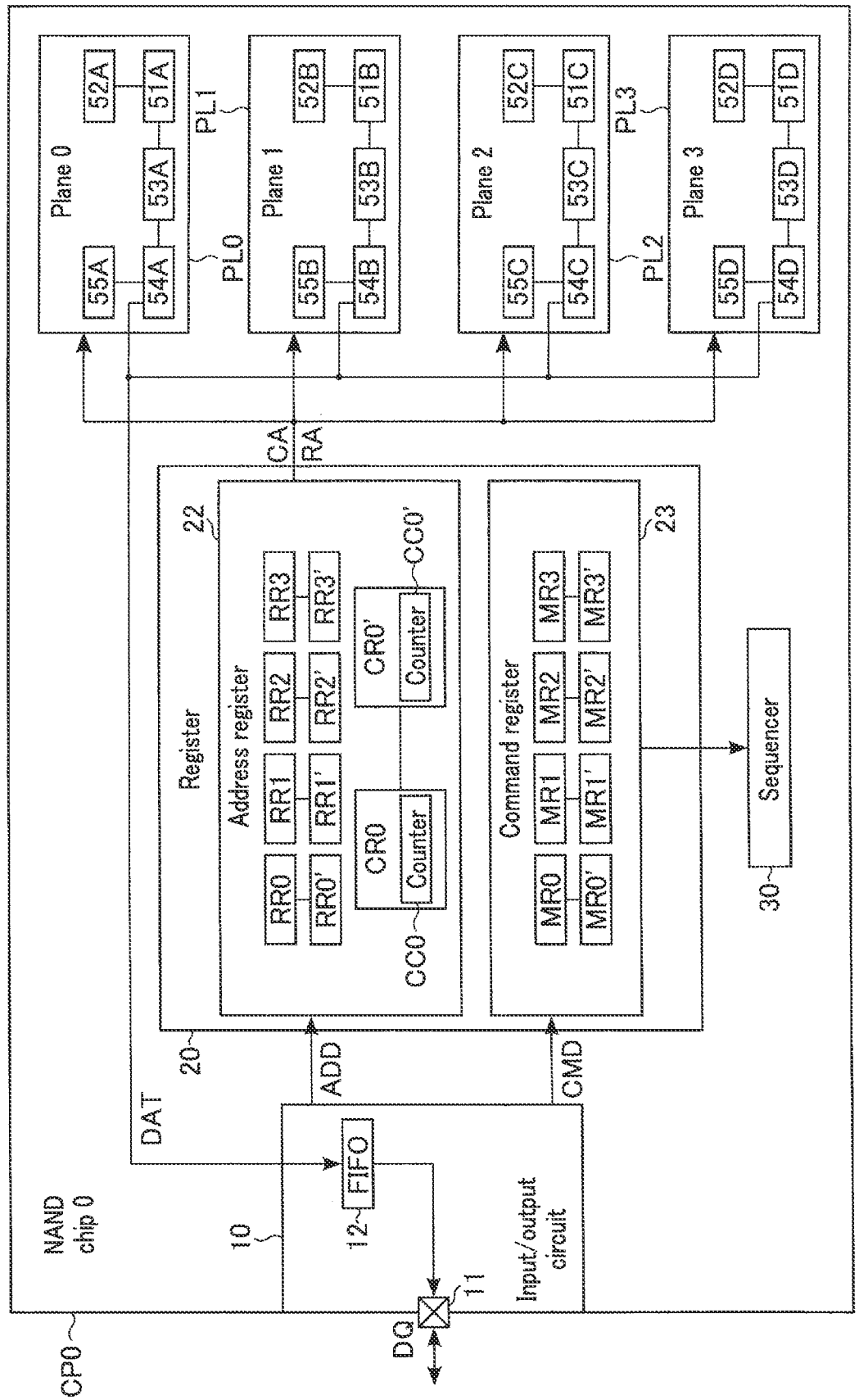
FIG. 6 is a block diagram showing a configuration of the NAND chip included in the memory system according to the first embodiment, focusing on an input/output circuit and a register.

A configuration of the input/output circuit 10 will be described with reference to FIG. 6. FIG. 6 is a block diagram showing a configuration of the NAND chip 0 (CP0) included in the memory system 100 according to the present embodiment, focusing on the input/output circuit 10 and the register 20. In FIG. 6, the status register 21 and the voltage generating circuit 40 are omitted.

As with the plane 0 (PL0), the plane 1 (PL1) includes a memory cell array 51B, a row decoder 52B, a sense amplifier 53B, a data register 54B, and a column decoder 55B. The plane 2 (PL2) includes a memory cell array 51C, a row decoder 52C, a sense amplifier 53C, a data register 54C, and a column decoder 55C. The plane 3 (PL3) includes a memory cell array 51D, a row decoder 52D, a sense amplifier 53D, a data register 54D, and a column decoder 55D. Hereinafter, the memory cell arrays 51A to 51D will be simply referred to as a memory cell array 51 in the case where they are not distinguished from each other, and the data registers 54A to 54D will be simply referred to as a data register 54 in the case where they are not distinguished from each other.

The input/output circuit 10 includes the DQ pad 11 and the FIFO circuit 12. The DQ pad 11 couples the input/output circuit 10 to the NAND bus. The DQ pad 11 is coupled to the data registers 54A to 54D via the FIFO circuit 12. The DQ pad 11 may be recognized as a single output terminal having a certain output impedance when viewed from an outside of the NAND chip 0 (CP0).

The FIFO circuit 12 fetches, based on a write clock Wclk described later, the data DAT read from the planes 0 to 3 (PL0 to PL3). The FIFO circuit 12 further transmits a signal stored therein to the DQ pad 11 based on a read clock Rclk described later. The FIFO circuit 12 will be described later in detail.

1.1.6 Configuration of Register 20

A configuration of the register 20 will be described with reference to FIG. 6.

The address register 22 includes a row address register 0 (RR0) to a row address register 3 (RR3), a row address register 0' (RR0') to a row address register 3' (RR3'), a column address register 0 (CR0), and a column address register 0' (CR0').

The row address register 0 (RR0) is coupled to the input/output circuit 10 and the plane 0 (PL0), and stores the row address RA of the plane 0 (PL0) received from the input/output circuit 10. The row address register 0 (RR0) transmits the row address RA to the row decoder 52A. The row address register 1 (RR1) is coupled to the input/output circuit 10 and the plane 1 (PL1), and stores the row address RA of the plane 1 (PL1) received from the input/output circuit 10. The row address register 1 (RR1) transmits the row address RA to the row decoder 52B. The row address register 2 (RR2) is coupled to the input/output circuit 10 and the plane 2 (PL2), and stores the row address RA of the plane 2 (PL2) received from the input/output circuit 10. The row address register 2 (RR2) transmits the row address RA to the row decoder 52C. The row address register 3 (RR3) is coupled to the input/output circuit 10 and the plane 3 (PL3), and stores the row address RA of the plane 3 (PL3) received from the input/output circuit 10. The row address register 3 (RR3) transmits the row address RA to the row decoder 52D.

The row address register 0' (RR0') is coupled to the row address register 0 (RR0) and the plane 0 (PL0), and stores the row address RA received (copied) from the row address register 0 (RR0). The row address register 0' (RR0') transmits the row address RA to the row decoder 52A. The row address register 1' (RR1') is coupled to the row address register 1 (RR1) and the plane 1 (PL1), and stores the row address RA received (copied) from the row address register 1 (RR1). The row address register 1' (RR1') transmits the row address RA to the row decoder 52B. The row address register 2' (RR2') is coupled to the row address register 2 (RR2) and the plane 2 (PL2), and stores the row address RA received (copied) from the row address register 2 (RR2). The row address register 2' (RR2') transmits the row address RA to the row decoder 52C. The row address register 3' (RR3') is coupled to the row address register 3 (RR3) and the plane 3 (PL3), and stores the row address RA received (copied) from the row address register 3 (RR3). The row address register 3' (RR3') transmits the row address RA to the row decoder 52D.

The column address register 0 (CR0) is coupled to the input/output circuit 10 and the planes 0 to 3 (PL0 to PL3), and stores the column address CA of the planes 0 to 3 (PL0 to PL3) received from the input/output circuit 10. The column address register 0' (CR0') is coupled to the column address register 0 (CR0) and the planes 0 to 3 (PL0 to PL3), and stores the column address CA received (copied) from the column address register 0 (CR0).

The column address register 0 (CR0) includes a column address counter circuit CC0, and the column address register 0' (CR0') includes a column address counter circuit CC0'. The column address counter circuits CC0 and CC0' increment the column address CA by one.

The column address register 0 (CR0) transmits the column addresses CA to the column decoders 55A to 55D. More specifically, the column address register 0 (CR0) transmits the first column address CA of a plane designated by the column address CA to the column decoders 55A to 55D. When the first column address CA is transmitted to the column decoders 55A to 55D, the column address counter circuit CC0 increments the column address CA by only one, and the column address register 0 (CR0) transmits a column address CA subsequent to the first column address CA to the column decoders 55A to 55D. When the last column address CA is transmitted to the column decoders 55A to 55D, transmission of the column addresses CA to the column decoders 55A to 55D is completed. As with the column address register 0 (CR0), the column address register 0' (CR0') transmits the column addresses CA to the column decoders 55A to 55D.

The command register 23 includes a command register 0 (MR0) to a command register 3 (MR3) and a command register 0' (MR0') to a command register 3' (MR3').

The command register 0 (MR0) is coupled to the input/output circuit 10 and the sequencer 30, and stores a command CMD relating to the plane 0 (PL0) received from the input/output circuit 10. The command register 0 (MR0) transmits the command CMD to the sequencer 30. The command register 1 (MR1) is coupled to the input/output circuit 10 and the sequencer 30, and stores the command CMD relating to the plane 1 (PL1) received from the input/output circuit 10. The command register 1 (MR1) transmits the command CMD to the sequencer 30. The command register 2 (MR2) is coupled to the input/output circuit 10 and the sequencer 30, and stores the command CMD relating to the plane 2 (PL2) received from the input/output circuit 10. The command register 2 (MR2) transmits the command CMD to the sequencer 30. The command register 3 (MR3) is coupled to the input/output circuit 10 and the sequencer 30, and stores the command CMD relating to the plane 3 (PL3) received from the input/output circuit 10. The command register 3 (MR3) transmits the command CMD to the sequencer 30.

The command register 0' (MR0') is coupled to the command register 0 (MR0) and the sequencer 30, and stores the command CMD received (copied) from the command register 0 (MR0). The command register 0' (MR0') transmits the command CMD to the sequencer 30. The command register 1' (MR1') is coupled to the command register 1 (MR1) and the sequencer 30, and stores the command CMD received (copied) from the command register 1 (MR1). The command register 1' (MR1') transmits the command CMD to the sequencer 30. The command register 2' (MR2') is coupled to the command register 2 (MR2) and the sequencer 30, and stores the command CMD received (copied) from the command register 2 (MR2). The command register 2' (MR2') transmits the command CMD to the sequencer 30. The command register 3' (MR3') is coupled to the command register 3 (MR3) and the sequencer 30, and store stores the command CMD received (copied) from the command register 3 (MR3). The command register 3' (MR3') transmits the command CMD to the sequencer 30.

1.1.7 Configuration of FIFO Circuit 12

A configuration of the FIFO circuit 12 will be described with reference to FIG. 7. FIG. 7 is a block diagram showing an example of the FIFO circuit 12 inside the input/output circuit 10 included in the memory system 100 according to the present embodiment.

The FIFO circuit 12 includes a multiplexer (hereinafter referred to as a "MUX") 60, flip flops (hereinafter referred to as a "FF") 61 to 63, a MUX 64, a write clock generating circuit 65, a write pointer generating circuit 66, a read clock generating circuit 67, and a read pointer generating circuit 68.

The MUX 60 selects one of the FFs 61 to 63 based on a write pointer Wptr received from the write pointer generating circuit 66. A signal received from the data register 54A is transmitted to the FF selected by the MUX 60. The write pointer Wptr will be described later in detail.

The FFs 61 to 63 respectively receive signals from the MUX 60. The FFs 61 to 63 fetch the signals received from the MUX 60 at a timing when the write clock Wclk rises from the "L" level to the "H" level, and store the fetched signals, respectively.

The MUX 64 selects one of the FFs 61 to 63 based on a read pointer Rptr received from the read pointer generating circuit 68. The read pointer Rptr will be described later in detail.

The write clock generating circuit 65 generates the write clock Wclk that determines a timing for fetching a signal to each of the FFs 61 to 63. The write clock generating circuit 65 transmits the generated write clock Wclk to the write pointer generating circuit 66.

The write pointer generating circuit 66 generates the write pointer Wptr that determines which one of the FFs 61 to 63 fetches a signal received from the data register 54A. The write pointer Wptr is incremented at a timing when the write clock Wclk rises from the "L" level to the "H" level and accordingly, the write pointer Wptr is generated.

The read clock generating circuit 67 generates the read clock Rclk that determines a timing for switching the coupling between one of the FFs 61 to 63 and the MUX 64. The read clock generating circuit 67 transmits the generated read clock Rclk to the read pointer generating circuit 68.

The read pointer generating circuit 68 generates the read pointer Rptr that determines from which one of the FFs 61 to 63 a signal received is to be output. The read pointer Rptr is incremented at a timing when the read clock Rclk rises from the "L" level to the "H" level and accordingly, the read pointer Rptr is generated.

The FFs 61 to 63 may be provided in a multistage manner between the MUX 60 and the MUX 64.

1.2 Operation

An operation of the memory system 100 according to the present embodiment will be described with reference to FIG. 8 to FIG. 17. FIG. 8 to FIG. 17 are each a diagram showing an example of a command sequence in the read operation of the memory system 100 according to the present embodiment. The following will describe an exemplary case in which the signals CEn1 and CEn2 are the same signal (CEn1=CEn2=CEn), and data is repeatedly read from the plane 0 in the chip 0, the plane 0 in the chip 1, the plane 1 in the chip 0, the plane 1 in the chip 1, the plane 2 in the chip 0, the plane 2 in the chip 1, the plane 3 in the chip 0, and the plane 3 in the chip 1 in this order.

FIG. 8 to FIG. 17 each also show a cache busy signal CB of each of the planes in the chips 0 (CP0) and 1 (CP1). Through this description, the "cache busy signal CB" means a signal indicative of whether a target plane is in a busy state or in a ready state. The signal CB is provided for each plane, and is set to the "L" level when a corresponding plane is, for example, in the busy state. In the case where the signal CB is in the busy state, the signal CB indicates a state in which access to the data register 54 (data DAT) of a corresponding plane is not possible. In the case where the signal CB is in the ready state, the signal CB indicates a state in which access to the data register 54 (data DAT) of a corresponding plane is possible. The signal CB is stored in the status register 21. The memory controller 300 confirms a state of the signal CB of each plane by reading the status information STS from the status register 21. Hereinafter, the signals CB of the planes 0 to 3 (PL0 to PL3) in the chip 0 (CP0) will be respectively referred to as a signal CB00, a signal CB01, a signal CB02, and a signal CB03, and the signals CB of the planes 0 to 3 (PL0 to PL3) in the chip 1 (CP1) will be respectively referred to as a signal CB10, a signal CB11, a signal CB12, and a signal CB13. The signal RB corresponds to a result of an AND operation that the sequencer 30 performs on the signal CB of each plane inside a corresponding chip. For example, in the chip 0 (CP0), the signal RB is at the "L" level in the case where the signal CB of any one of the planes 0 to 3 (PL0 to PL3) is at the "L" level, and the signal RB is at the "H" level in the case where the signals CB of all the planes 0 to 3 (PL0 to PL3) are at the "H" level. In this manner, the signal RB indicates whether or not all the planes are in the ready state in each chip.

The read operation in the present embodiment corresponds to a single plane read. Throughout this description, "single plane read" means an operation in which the data DAT is independently read from each of the planes.

Figure 8:
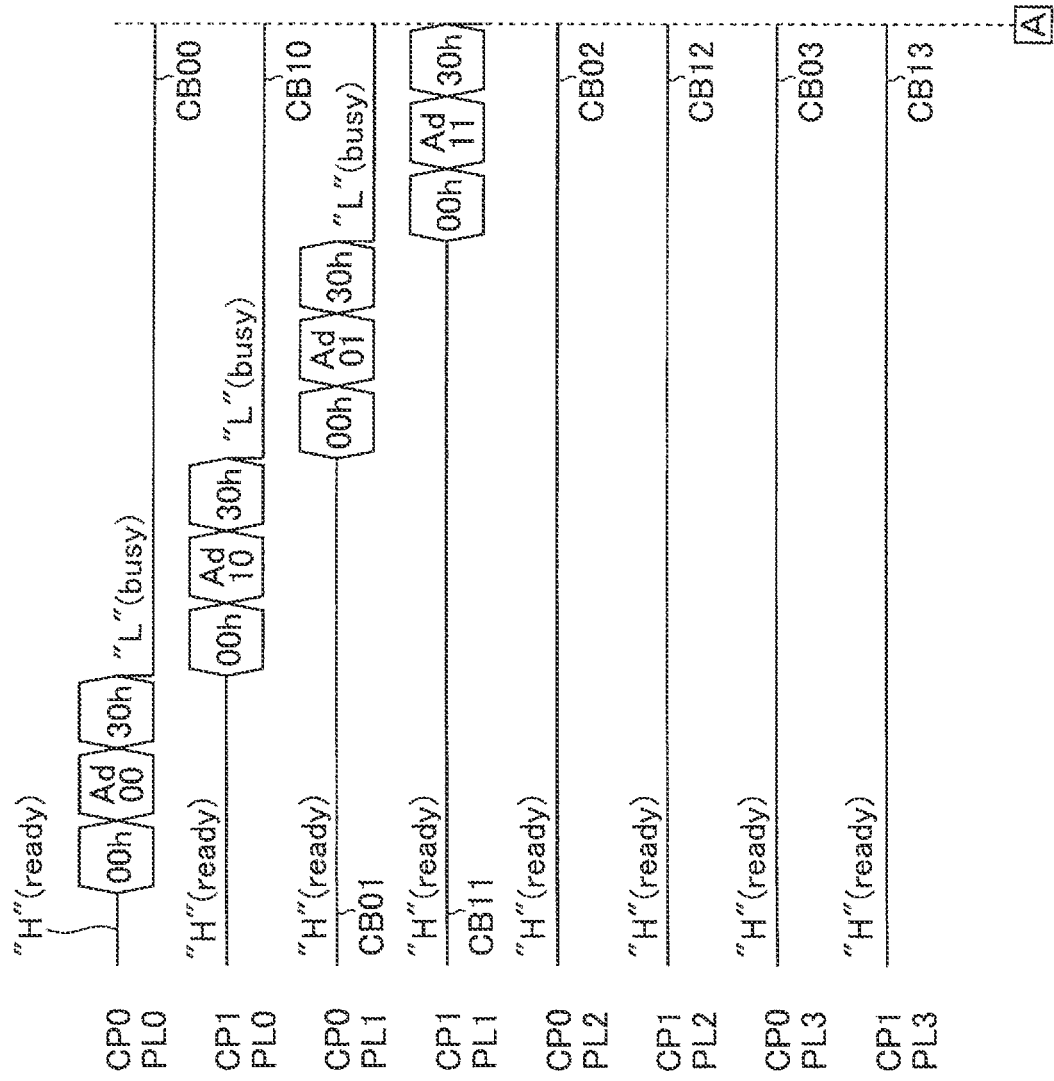
FIG. 8 is a diagram showing an example of a command sequence in a read operation of the memory system according to the first embodiment.

First, as shown in FIG. 8 and FIG. 9, the memory controller 300 executes a normal read on the plane 0 (PL0) in the chip 0 (CP0). Throughout this description, "normal read" means, in the target plane, a read operation in which a subsequent command with respect to a target plane is not accepted until the read data DAT is stored in the data register 54 from the memory cell array 51 (until the signal CB is brought into the ready state).

More specifically, after setting the signal CEn to the "L" level, the memory controller 300 issues a command <00h>, an address <Ad00>, and a command <30h> in order to execute the normal read on the plane 0 (PL0) in the chip 0 (CP0). The command "00h" is a command for ordering a read. The address "Ad00" designates an address of the plane 0 in the chip 0. The command "30h" is a command for causing the normal read in the single plane read to execute.

In the chip 0 (CP0), the input/output circuit 10 receives the command <00h>, the address <Ad00>, and the command <30h> each issued by the memory controller 300. The input/output circuit 10 transmits the received command <00h> to the command register 0 (MR0) in the chip 0 (CP0) based on the address <Ad00>. The input/output circuit 10 transmits the row address RA of the received address <Ad00> to the row address register 0 (RR0) in the chip 0 (CP0), and transmits the column address CA of the received address <Ad00> to the column address register 0 (CR0) in the chip 0 (CP0). The input/output circuit 10 transmits the received command <30h> to the command register 0 (MR0) in the chip 0 (CP0) based on the address <Ad00>.

When the row address RA of the address <Ad00> is stored in the row address register 0 (RR0), the row address register 0 (RR0) transmits the row address RA to the row decoder 52A.

Upon receipt of the command <30h> from the command register 0 (MR0), the sequencer 30 in the chip 0 (CP0) initiates the normal read on the plane 0 (PL0). The sequencer 30 sets the signal CB00 to the busy state. The signal CB00 is stored in the status register 21. Upon completion of the normal read on the plane 0 (PL0) in the chip 0 (CP0), the sequencer 30 sets the signal CB00 to the ready state. This enables the plane 0 (PL0) in the chip 0 (CP0) to accept a subsequent command.

Next, the memory controller 300 executes the normal read on the plane 0 (PL0) in the chip 1 (CP1).

More specifically, after issuance of the command <00h>, the address <Ad00>, and the command <30h>, the memory controller 300 issues the command <00h>, an address <Ad10>, and the command <30h> in order to execute the normal read on the plane 0 (PL0) in the chip 1 (CP1). The address "Ad10" designates an address of the plane 0 in the chip 1.

In the chip 1 (CP1), the input/output circuit 10 receives the command <00h>, the address <Ad10>, and the command <30h> each issued by the memory controller 300. Thereafter, the normal read on the plane 0 (PL0) in the chip 1 (CP1) is initiated as with the normal read on the plane 0 (PL0) in the chip 0 (CP0) described above. The sequencer 30 in the chip 1 (CP1) sets the signal CB10 to the busy state. The signal CB10 is stored in the status register 21. Upon completion of the normal read on the plane 0 (PL0) in the chip 1 (CP1), the sequencer 30 sets the signal CB10 to the ready state. This enables the plane 0 (PL0) in the chip 1 (CP1) to accept a subsequent command.

Next, the memory controller 300 executes the normal read on the plane 1 (PL1) in the chip 0 (CP0).

More specifically, after issuance of the command <00h>, the address <Ad10>, and the command <30h>, the memory controller 300 issues the command <00h>, an address <Ad01>, and the command <30h> in order to execute the normal read on the plane 1 (PL1) in the chip 0 (CP0). The address "Ad01" designates an address of the plane 1 in the chip 0.

In the chip 0 (CP0), the input/output circuit 10 receives the command <00h>, the address <Ad01>, and the command <30h> each issued by the memory controller 300. The input/output circuit 10 transmits the received command <00h> to the command register 1 (MR1) in the chip 0 (CP0) based on the address <Ad01>. The input/output circuit 10 transmits the row address RA of the received address <Ad01> to the row address register 1 (RR1) in the chip 0 (CP0), and transmits the column address CA of the received address <Ad01> to the column address register 0 (CR0) in the chip 0 (CP0). The input/output circuit 10 transmits the received command <30h> to the command register 1 (MR1) in the chip 0 (CP0) based on the address <Ad01>.

When the row address RA of the address <Ad01> is stored in the row address register 1 (RR1), the row address register 1 (RR1) transmits the row address RA to the row decoder 52B.

Upon receipt of the command <30h> from the command register 1 (MRR1), the sequencer 30 in the chip 0 (CP0) initiates the normal read on the plane 1 (PL1). The sequencer 30 sets the signal CB01 to the busy state. The signal CB01 is stored in the status register 21. Upon completion of the normal read on the plane 1 (PL1) in the chip 0 (CP0), the sequencer 30 sets the signal CB01 to the ready state. This enables the plane 1 (PL1) in the chip 0 (CP0) to accept a subsequent command.

Next, the memory controller 300 executes the normal read on the plane 1 (PL1) in the chip 1 (CP1).

More specifically, after issuance of the command <00h>, the address <Ad01>, and the command <30h>, the memory controller 300 issues the command <00h>, an address <Ad11>, and the command <30h> in order to execute the normal read on the plane 1 (PL1) in the chip 1 (CP1). The address "Ad11" designates an address of the plane 1 in the chip 1.

In the chip 1 (CP1), the input/output circuit 10 receives the command <00h>, the address <Ad11>, and the command <30h> each issued by the memory controller 300. Thereafter, the normal read on the plane 1 (PL1) in the chip 1 (CP1) is initiated as with the normal read on the plane 1 (PL1) in the chip 0 (CP0) described above. The sequencer 30 in the chip 1 (CP1) sets the signal CB11 to the busy state. The signal CB11 is stored in the status register 21. Upon completion of the normal read on the plane 1 (PL1) in the chip 1 (CP1), the sequencer 30 sets the signal CB11 to the ready state. This enables the plane 1 (PL1) in the chip 1 (CP1) to accept a subsequent command.

Next, the memory controller 300 executes the normal read on the plane 2 (PL2) in the chip 0 (CP0).

More specifically, after issuance of the command <00h>, the address <Ad11>, and the command <30h>, the memory controller 300 issues the command <00h>, an address <Ad02>, and the command <30h> in order to execute the normal read on the plane 2 (PL2) in the chip 0 (CP0). The address "Ad02" designates an address of the plane 2 in the chip 0.

In the chip 0 (CP0), the input/output circuit 10 receives the command <00h>, the address <Ad02>, and the command <30h> each issued by the memory controller 300. The input/output circuit 10 transmits the received command <00h> to the command register 2 (MR2) in the chip 0 (CP0) based on the address <Ad02>. The input/output circuit 10 transmits the row address RA of the received address <Ad02> to the row address register 2 (RR2) in the chip 0 (CP0), and transmits the column address CA of the received address <Ad02> to the column address register 0 (CR0) in the chip 0 (CP0). The input/output circuit 10 transmits the received command <30h> to the command register 2 (MR2) in the chip 0 (CP0) based on the address <Ad02>.

When the row address RA of the address <Ad02> is stored in the row address register 2 (RR2), the row address register 2 (RR2) transmits the row address RA to the row decoder 52C.

Upon receipt of the command <30h> from the command register 2 (MR2), the sequencer 30 in the chip 0 (CP0) initiates the normal read on the plane 2 (PL2). The sequencer 30 sets the signal CB02 to the busy state. The signal CB02 is stored in the status register 21. Upon completion of the normal read on the plane 2 (PL2) in the chip 0 (CP0), the sequencer 30 sets the signal CB02 to the ready state. This enables the plane 2 (PL2) in the chip 0 (CP0) to accept a subsequent command.

Next, the memory controller 300 executes the normal read on the plane 2 (PL2) in the chip 1 (CP1).

More specifically, after issuance of the command <00h>, the address <Ad02>, and the command <30h>, the memory controller 300 issues the command <00h>, an address <Ad12>, and the command <30h> in order to execute the normal read on the plane 2 (PL2) in the chip 1 (CP1). The address "Ad12" designates an address of the plane 2 in the chip 1.

In the chip 1 (CP1), the input/output circuit 10 receives the command <00h>, the address <Ad12>, and the command <30h> each issued by the memory controller 300. Thereafter, the normal read on the plane 2 (PL2) in the chip 1 (CP1) is initiated as with the normal read on the plane 2 (PL2) in the chip 0 (CP0) described above. The sequencer 30 in the chip 1 (CP1) sets the signal CB12 to the busy state. The signal CB12 is stored in the status register 21. Upon completion of the normal read on the plane 2 (PL2) in the chip 1 (CP1), the sequencer 30 sets the signal CB12 to the ready state. This enables the plane 2 (PL2) in the chip 1 (CP1) to accept a subsequent command.

Next, the memory controller 300 executes the normal read on the plane 3 (PL3) in the chip 0 (CP0).

More specifically, after issuance of the command <00h>, the address <Ad12>, and the command <30h>, the memory controller 300 issues the command <00h>, an address <Ad03>, and the command <30h> in order to execute the normal read on the plane 3 (PL3) in the chip 0 (CP0). The address "Ad03" designates an address of the plane 3 in the chip 0.

In the chip 0 (CP0), the input/output circuit 10 receives the command <00h>, the address <Ad03>, and the command <30h> each issued by the memory controller 300. The input/output circuit 10 transmits the received command <00h> to the command register 3 (MR3) in the chip 0 (CP0) based on the address <Ad03>. The input/output circuit 10 transmits the row address RA of the received address <Ad03> to the row address register 3 (RR3) in the chip 0 (CP0), and transmits the column address CA of the received address <Ad03> to the column address register 0 (CR0) in the chip 0 (CP0). The input/output circuit 10 transmits the received command <30h> to the command register 3 (MR3) in the chip 0 (CP0) based on the address <Ad03>.

When the row address RA of the address <Ad03> is stored in the row address register 3 (RR3), the row address register 3 (RR3) transmits the row address RA to the row decoder 52D.

Upon receipt of the command <30h> from the command register 3 (MR3), the sequencer 30 in the chip 0 (CP0) initiates the normal read on the plane 3 (PL3). The sequencer 30 sets the signal CB03 to the busy state. The signal CB03 is stored in the status register 21. Upon completion of the normal read on the plane 3 (PL3) in the chip 0 (CP0), the sequencer 30 sets the signal CB03 to the ready state. This enables the plane 3 (PL3) in the chip 0 (CP0) to accept a subsequent command.

Next, the memory controller 300 executes the normal read on the plane 3 (PL3) in the chip 1 (CP1).

More specifically, after issuance of the command <00h>, the address <Ad03>, and the command <30h>, the memory controller 300 issues the command <00h>, an address <Ad13>, and the command <30h> in order to execute the normal read on the plane 3 (PL3) in the chip 1 (CP1). The address "Ad13" designates an address of the plane 3 in the chip 1.

In the chip 1 (CP1), the input/output circuit 10 receives the command <00h>, the address <Ad13>, and the command <30h> each issued by the memory controller 300. Thereafter, the normal read on the plane 3 (PL3) in the chip 1 (CP1) is initiated as with the normal read on the plane 3 (PL3) in the chip 0 (CP0) described above. The sequencer 30 in the chip 1 (CP1) sets the signal CB13 to the busy state. The signal CB13 is stored in the status register 21. Upon completion of the normal read on the plane 3 (PL3) in the chip 1 (CP1), the sequencer 30 sets the signal CB13 to the ready state. This enables the plane 3 (PL3) in the chip 1 (CP1) to accept a subsequent command.

Next, as shown in FIG. 10, the memory controller 300 executes a status read on the plane 0 (PL0) in the chip 0 (CP0).

More specifically, after issuance of the command <00h>, the address <Ad13>, and the command <30h>, the memory controller 300 issues a command <78h> and the address <Ad00> in order to execute the status read on the plane 0 (PL0) in the chip 0 (CP0). The command "78h" is a command for reading the status information STS from the status register 21.

The sequencer 30 in the chip 0 (CP0) transmits the status information STS on the signal CB00 corresponding to the address <Ad00> to the memory controller 300.

Next, upon receipt of the signal CB00 indicative of the ready state from the status register 21, the memory controller 300 executes a cache read on the plane 0 (PL0) in the chip 0 (CP0). Throughout this description, "cache read" means a read operation in which a subsequent command with respect to a target plane is accepted even in the case where storing of the read data DAT from the memory cell array 51 to the data register 54 has not been completed in the target plane (even in the case where the signal CB is in the busy state).

More specifically, the memory controller 300 issues the command <00h>, the address <Ad00>, and a command <31h> in order to execute the cache read on the plane 0 (PL0) in the chip 0 (CP0). The command "31h" is a command for causing the cache read in the single plane read to execute.

In the chip 0 (CP0), the input/output circuit 10 receives the command <00h>, the address <Ad00>, and the command <31h> each issued by the memory controller 300. Thereafter, the cache read on the plane 0 (PL0) in the chip 0 (CP0) is initiated as with the normal read on the plane 0

(PL0) in the chip 0 (CP0) described above. The sequencer 30 in the chip 0 (CP0) sets the signal CB00 to the busy state. Upon completion of a cache transfer on the plane 0 (PL0) in the chip 0 (CP0) (a transfer of the read data DAT from the memory cell array 51 currently executing the cache read to the corresponding data register 54), the sequencer 30 sets the signal CB00 to the ready state. However, in the case where a command for instructing execution of a prefetch to be described later has been accepted, the sequencer 30 sets the signal CB00 to the ready state after the execution of the prefetch subsequent to the cache transfer.

Next, the memory controller 300 reserves the prefetch of read data in the normal read executed on the plane 0 (PL0) in the chip 0 (CP0). Throughout this description, "prefetch" means an operation in which the data DAT read from the memory cell array 51 to the data register 54 is fetched from the data register 54 to the FIFO circuit 12. Furthermore, "reserving a prefetch" means preparing for execution of the prefetch and then entering a standby state for the execution of the prefetch.

More specifically, during a period in which the command <00h>, the address <Ad00>, and the command <31h> are issued and the cache read is executed (that is, a period in which the signal CB00 is in the busy state), the memory controller 300 issues a command <05h>, the address <Ad00>, and a command <E0h> in order to reserve the prefetch on the plane 0 (PL0) in the chip 0 (CP0). The command "05h" is a command for ordering the prefetch. The command "E0h" is a command for instructing execution of the prefetch.

In the chip 0 (CP0), the input/output circuit 10 receives the command <05h>, the address <Ad00>, and the command <E0h> each issued by the memory controller 300. The input/output circuit 10 transmits the received command <05h> to the command register 0 (MR0) in the chip 0 (CP0) based on the address <Ad00> and also copies the command <05h> to the command register 0' (MR0') in the chip 0 (CP0). The input/output circuit 10 transmits the row address RA of the received address <Ad00> to the row address register 0 (RR0) in the chip 0 (CP0) and also copies the row address RA of the address <Ad00> to the row address register 0' (RR0') in the chip 0 (CP0). The input/output circuit 10 transmits the column address CA of the received address <Ad00> to the column address register 0 (CR0) in the chip 0 (CP0) and also copies the column address CA of the address <Ad00> to the column address register 0' (CR0') in the chip 0 (CP0). The input/output circuit 10 transmits the received command <E0h> to the command register 0 (MR0) in the chip 0 (CP0) based on the address <Ad00>, and also copies the command <E0h> to the command register 0' (MR0') in the chip 0 (CP0).

When the row address RA of the address <Ad00> is copied to the row address register 0' (RR0'), the row address register 0' (RR0') transmits the row address RA to the row decoder 52A.

Upon receipt of the command <E0h> from the command register 0' (MR0'), the sequencer 30 in the chip 0 (CP0) reserves the prefetch on the plane 0 (PL0). The sequencer 30 then initiates the prefetch. Upon receipt of the command <E0h> with the signal CB00 being in the busy state, the sequencer 30 executes the prefetch on the plane 0 (PL0) in the chip 0 (CP0) during a period in which the signal CB00 is in the busy state. More specifically, upon receipt of the command <E0h> with the signal CB00 being in the busy state, the sequencer 30 in the chip 0 (CP0) executes the prefetch subsequently to the cache transfer, and sets the signal CB00 to the ready state after execution of the prefetch.

Upon initiation of the prefetch, the sequencer 30 in the chip 0 (CP0) resets a counter value CNT of the column address counter circuit CC0' to 0. The column address register 0' (CR0') transmits the first to last column addresses CA to the column decoders 55A to 55D. Based on a result of decoding the column address CA of the address <Ad00>, the column decoder 55A selects a corresponding latch circuit in the data register 54A. Data in the latch circuit selected in sequence is transmitted to the FIFO circuit 12.

Next, as shown in FIG. 10, the memory controller 300 executes the status read on the plane 0 (PL0) in the chip 1 (CP1).

More specifically, after issuance of the command <05h>, the address <Ad00>, and the command <E0h>, the memory controller 300 issues the command <78h> and the address <Ad10> in order to execute the status read on the plane 0 (PL0) in the chip 1 (CP1).

The sequencer 30 in the chip 1 (CP1) transmits the status information STS on the signal CB10 corresponding to the address <Ad10> to the memory controller 300.

Next, upon receipt of the signal CB10 indicative of the ready state from the status register 21, the memory controller 300 executes the cache read on the plane 0 (PL0) in the chip 1 (CP1).

More specifically, the memory controller 300 issues the command <00h>, the address <Ad10>, and the command <31h> in order to execute the cache read on the plane 0 (PL0) in the chip 1 (CP1).

In the chip 1 (CP1), the input/output circuit 10 receives the command <00h>, the address <Ad10>, and the command <31h> each issued by the memory controller 300. Thereafter, the cache read on the plane 0 (PL0) in the chip 1 (CP1) is initiated as with the cache read on the plane 0 (PL0) in the chip 0 (CP0) described above. The sequencer 30 in the chip 1 (CP1) sets the signal CB10 to the busy state. Upon completion of the cache transfer on the plane 0 (PL0) in the chip 1 (CP1), the sequencer 30 sets the signal CB10 to the ready state. However, in the case where a command for instructing execution of the prefetch has been accepted, the sequencer 30 sets the signal CB10 to the ready state after the execution of the prefetch subsequent to the cache transfer.

Next, the memory controller 300 reserves the prefetch of read data in the normal read executed on the plane 0 (PL0) in the chip 1 (CP1).

More specifically, during a period in which the command <00h>, the address <Ad10>, and the command <31h> are issued and the cache read is executed (that is, a period in which the signal CB10 is in the busy state), the memory controller 300 issues the command <05h>, the address <Ad10>, and the command <E0h> in order to reserve the prefetch on the plane 0 (PL0) in the chip 1 (CP1).

In the chip 1 (CP1), the input/output circuit 10 receives the command <05h>, the address <Ad10>, and the command <E0h> each issued by the memory controller 300. Thereafter, the prefetch on the plane 0 (PL0) in the chip 1 (CP1) is reserved and initiated as with the reservation and execution of the prefetch on the plane 0 (PL0) in the chip 0 (CP0). Upon receipt of the command <E0h> with the signal CB10 being in the busy state, the sequencer 30 in the chip 1 (CP1) executes the prefetch on the plane 0 (PL0) in the chip 1 (CP1) during a period in which the signal CB10 is in the busy state. More specifically, upon receipt of the command <E0h> with the signal CB10 being in the busy state, the sequencer 30 in the chip 1 (CP1) executes the prefetch subsequently to the cache transfer, and sets the signal CB10 to the ready state after execution of the prefetch.

Next, as shown in FIG. 10, the memory controller 300 executes the status read on the plane 1 (PL1) in the chip 0 (CP0).

More specifically, after issuance of the command <05h>, the address <Ad10>, and the command <E0h>, the memory controller 300 issues the command <78h> and the address <Ad01> in order to execute the status read on the plane 1 (PL1) in the chip 0 (CP0).

The sequencer 30 in the chip 0 (CP0) transmits the status information STS on the signal CB01 corresponding to the address <Ad01> to the memory controller 300.

Next, upon receipt of the signal CB01 indicative of the ready state from the status register 21, the memory controller 300 executes the cache read on the plane 1 (PL1) in the chip 0 (CP0).

More specifically, the memory controller 300 issues the command <00h>, the address <Ad01>, and the command <31h> in order to execute the cache read on the plane 1 (PL1) in the chip 0 (CP0).

In the chip 0 (CP0), the input/output circuit 10 receives the command <00h>, the address <Ad01>, and the command <31h> each issued by the memory controller 300. Thereafter, the cache read on the plane 1 (PL1) in the chip 0 (CP0) is initiated as with the normal read on the plane 1 (PL1) in the chip 0 (CP0) described above. The sequencer 30 in the chip 0 (CP0) sets the signal CB01 to the busy state. Upon completion of the cache transfer on the plane 1 (PL1) in the chip 0 (CP0), the sequencer 30 sets the signal CB01 to the ready state.

Figure 11:
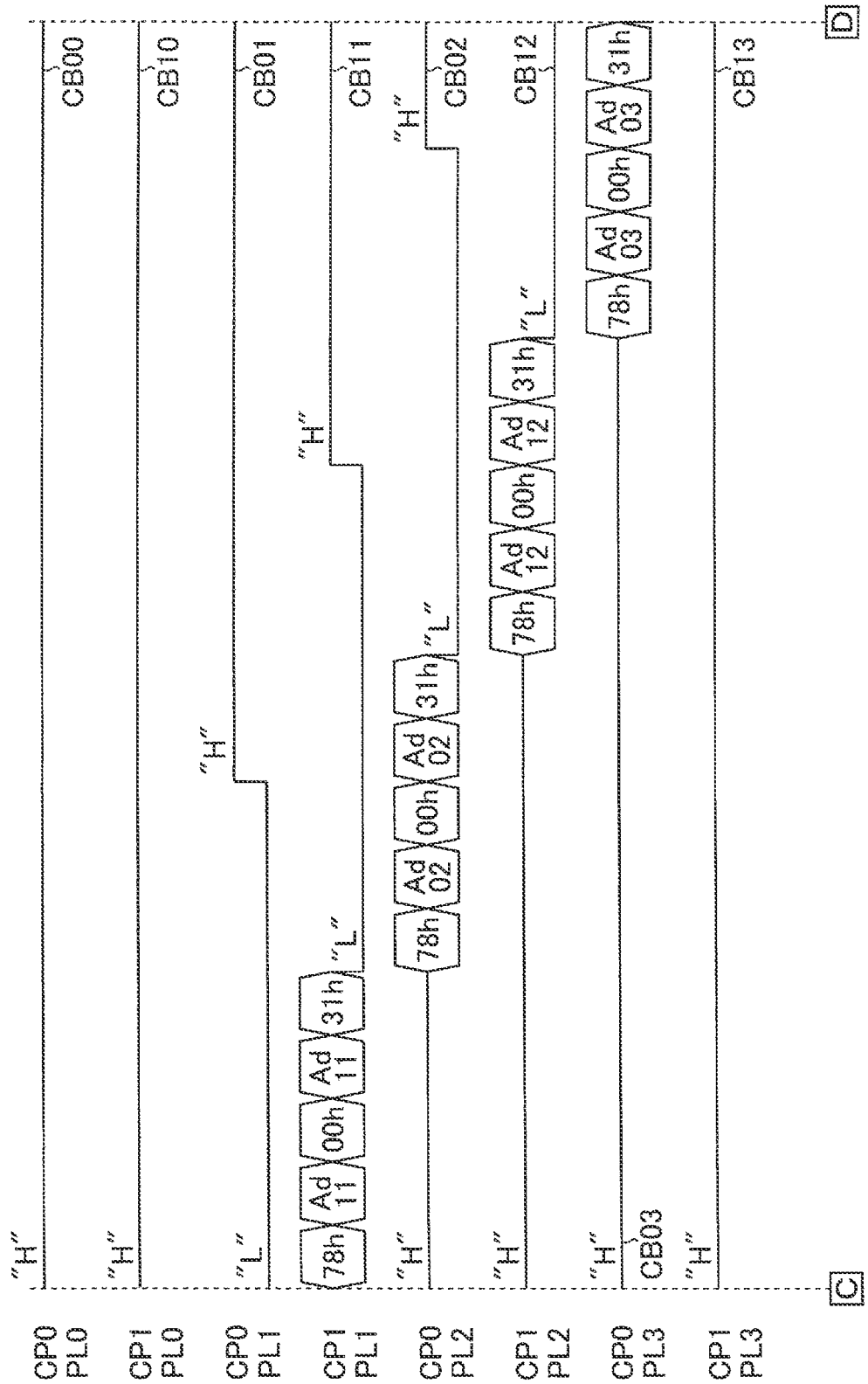
FIG. 11 is a diagram showing an example of the command sequence in the read operation of the memory system according to the first embodiment.

Next, as shown in FIG. 11, the memory controller 300 executes the status read on the plane 1 (PL1) in the chip 1 (CP1).

More specifically, after issuance of the command <00h>, the address <Ad01>, and the command <31h>, the memory controller 300 issues the command <78h> and the address <Ad11> in order to execute the status read on the plane 1 (PL1) in the chip 1 (CP1).

The sequencer 30 in the chip 1 (CP1) transmits the status information STS on the signal CB11 corresponding to the address <Ad11> to the memory controller 300.

Next, upon receipt of the signal CB11 indicative of the ready state from the status register 21, the memory controller 300 executes the cache read on the plane 1 (PL1) in the chip 1 (CP1).

More specifically, the memory controller 300 issues the command <00h>, the address <Ad11>, and the command <31h> in order to execute the cache read on the plane 1 (PL1) in the chip 1 (CP1).

In the chip 1 (CP1), the input/output circuit 10 receives the command <00h>, the address <Ad11>, and the command <31h> each issued by the memory controller 300. Thereafter, the cache read on the plane 1 (PL1) in the chip 1 (CP1) is initiated as with the cache read on the plane 1 (PL1) in the chip 0 (CP0) described above. The sequencer 30 in the chip 1 (CP1) sets the signal CB11 to the busy state. Upon completion of the cache transfer of the plane 1 (PL1) in the chip 1 (CP1), the sequencer 30 sets the signal CB11 to the ready state.

Next, as shown in FIG. 11, the memory controller 300 executes the status read on the plane 2 (PL2) in the chip 0 (CP0).

More specifically, after issuance of the command <00h>, the address <Ad11>, and the command <31h>, the memory controller 300 issues the command <78h> and the address <Ad02> in order to execute the status read on the plane 2 (PL2) in the chip 0 (CP0).

The sequencer 30 in the chip 0 (CP0) transmits the status information STS on the signal CB02 corresponding to the address <Ad02> to the memory controller 300.

Next, upon receipt of the signal CB02 indicative of the ready state from the status register 21, the memory controller 300 executes the cache read on the plane 2 (PL2) in the chip 0 (CP0).

More specifically, the memory controller 300 issues the command <00h>, the address <Ad02>, and the command <31h> in order to execute the cache read on the plane 2 (PL2) in the chip 0 (CP0).

In the chip 0 (CP0), the input/output circuit 10 receives the command <00h>, the address <Ad02>, and the command <31h> each issued by the memory controller 300. Thereafter, the cache read on the plane 2 (PL2) in the chip 0 (CP0) is initiated as with the normal read on the plane 2 (PL2) in the chip 0 (CP0) described above. The sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

Next, as shown in FIG. 11, the memory controller 300 executes the status read on the plane 2 (PL2) in the chip 1 (CP1).

More specifically, after issuance of the command <00h>, the address <Ad02>, and the command <31h>, the memory controller 300 issues the command <78h> and the address <Ad12> in order to execute the status read on the plane 2 (PL2) in the chip 1 (CP1).

The sequencer 30 in the chip 1 (CP1) transmits the status information STS on the signal CB12 corresponding to the address <Ad12> to the memory controller 300.

Next, upon receipt of the signal CB12 indicative of the ready state from the status register 21, the memory controller 300 executes the cache read on the plane 2 (PL2) in the chip 1 (CP1).

More specifically, the memory controller 300 issues the command <00h>, the address <Ad12>, and the command <31h> in order to execute the cache read on the plane 2 (PL2) in the chip 1 (CP1).

In the chip 1 (CP1), the input/output circuit 10 receives the command <00h>, the address <Ad12>, and the command <31h> each issued by the memory controller 300. Thereafter, the cache read on the plane 2 (PL2) in the chip 1 (CP1) is initiated as with the cache read on the plane 2 (PL2) in the chip 0 (CP0) described above. The sequencer 30 in the chip 1 (CP1) sets the signal CB12 to the busy state. Upon completion of the cache transfer on the plane 2 (PL2) in the chip 1 (CP1), the sequencer 30 sets the signal CB12 to the ready state.

Next, as shown in FIG. 11, the memory controller 300 executes the status read on the plane 3 (PL3) in the chip 0 (CP0).

More specifically, after issuance of the command <00h>, the address <Ad12>, and the command <31h>, the memory controller 300 issues the command <78h> and the address <Ad03> in order to execute the status read on the plane 3 (PL3) in the chip 0 (CP0).

The sequencer 30 in the chip 0 (CP0) transmits the status information STS on the signal CB03 corresponding to the address <Ad03> to the memory controller 300.

Next, upon receipt of the signal CB03 indicative of the ready state from the status register 21, the memory controller 300 executes the cache read on the plane 3 (PL3) in the chip 0 (CP0).

More specifically, the memory controller 300 issues the command <00h>, the address <Ad03>, and the command <31h> in order to execute the cache read on the plane 3 (PL3) in the chip 0 (CP0).

In the chip 0 (CP0), the input/output circuit 10 receives the command <00h>, the address <Ad03>, and the command <31h> each issued by the memory controller 300. Thereafter, the cache read on the plane 3 (PL3) in the chip 0 (CP0) is initiated as with the normal read on the plane 3 (PL3) in the chip 0 (CP0) described above. The sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Figure 12:
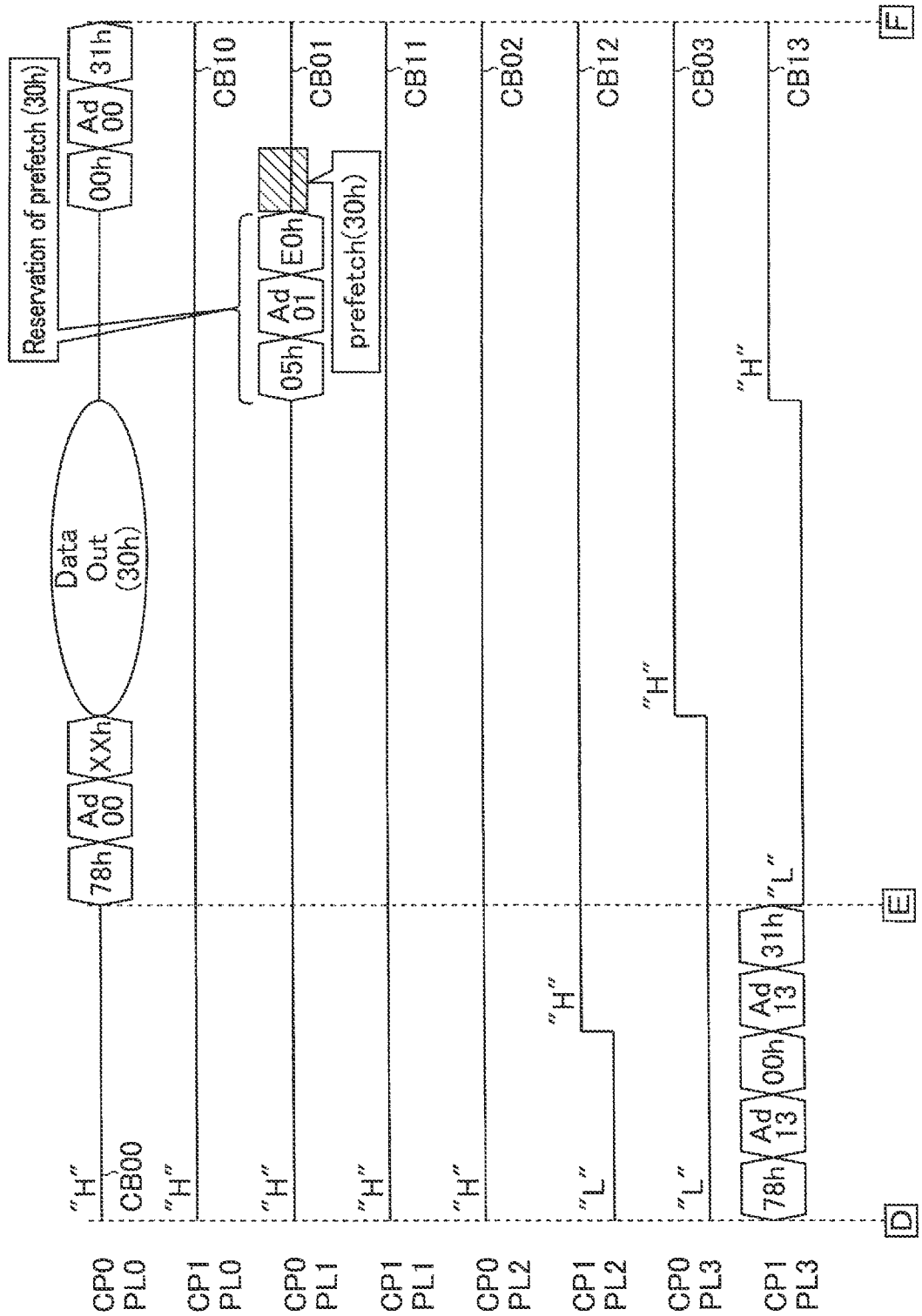
FIG. 12 is a diagram showing an example of the command sequence in the read operation of the memory system according to the first embodiment.

Next, as shown in FIG. 12, the memory controller 300 executes the status read on the plane 3 (PL3) in the chip 1 (CP1).

More specifically, after issuance of the command <00h>, the address <Ad03>, and the command <31h>, the memory controller 300 issues the command <78h> and the address <Ad13> in order to execute the status read on the plane 3 (PL3) in the chip 1 (CP1).

The sequencer 30 in the chip 1 (CP1) transmits the status information STS on the signal CB13 corresponding to the address <Ad13> to the memory controller 300.

Next, upon receipt of the signal CB13 indicative of the ready state from the status register 21, the memory controller 300 executes the cache read on the plane 3 (PL3) in the chip 1 (CP1).

More specifically, the memory controller 300 issues the command <00h>, the address <Ad13>, and the command <31h> in order to execute the cache read on the plane 3 (PL3) in the chip 1 (CP1).

In the chip 1 (CP1), the input/output circuit 10 receives the command <00h>, the address <Ad13>, and the command <31h> each issued by the memory controller 300. Thereafter, the cache read on the plane 3 (PL3) in the chip 1 (CP1) is initiated as with the cache read on the plane 3 (PL3) in the chip 0 (CP0) described above. The sequencer 30 in the chip 1 (CP1) sets the signal CB13 to the busy state. Upon completion of the cache transfer on the plane 3 (PL3) in the chip 1 (CP1), the sequencer 30 sets the signal CB13 to the ready state.

Next, as shown in FIG. 12, the memory controller 300 executes the status read on the plane 0 (PL0) in the chip 0 (CP0). The particulars of the aforementioned status read executed in response to the command <78h> and the address <Ad00> being issued after issuance of the command <00h>, the address <Ad13>, and the command <31h> are the same as those of the status read on the plane 0 (PL0) in the chip 0 (CP0) described above.

Next, upon receipt of the signal CB00 indicative of the ready state from the status register 21, the memory controller 300 executes a data-out on the plane 0 (PL0) in the chip 0 (CP0). Throughout this description, "data-out" means an operation in which the data DAT fetched from the data register 54 to the FIFO circuit 12 is output from the FIFO circuit 12 to the memory controller 300 via the DQ pad 11.

More specifically, the memory controller 300 issues a command <XXh> in order to execute the data-out on the plane 0 (PL0) in the chip 0 (CP0). The command "XXh" is a command for selecting a chip and a plane and causing the data-out to execute.

In the chip 0 (CP0), the input/output circuit 10 receives the command <XXh> issued by the memory controller 300. The input/output circuit 10 transmits the received command <XXh> to the command register 0 (MR0) in the chip 0 (CP0).

Upon receipt of the command <XXh> from the command register 0 (MR0), the sequencer 30 in the chip 0 (CP0) initiates the data-out on the plane 0 (PL0) on which the prefetch has been executed.

Next, as shown in FIG. 12, the memory controller 300 reserves the prefetch of read data in the normal read executed on the plane 1 (PL1) in the chip 0 (CP0).

More specifically, upon completion of the data-out on the plane 0 (PL0) in the chip 0 (CP0), the memory controller 300 issues the command <05h>, the address <Ad01>, and the command <E0h>, in order to reserve the prefetch on the plane 1 (PL1) in the chip 0 (CP0).

In the chip 0 (CP0), the input/output circuit 10 receives the command <05h>, the address <Ad01>, and the command <E0h> each issued by the memory controller 300. The input/output circuit 10 transmits the received command <05h> to the command register 1 (MR1) in the chip 0 (CP0) based on the address <Ad01> and also copies the command <05h> to the command register 1' (MR1') in the chip 0 (CP0). The input/output circuit 10 transmits the row address RA of the received address <Ad01> to the row address register 1 (RR1) in the chip 0 (CP0) and also copies the row address RA of the address <Ad01> to the row address register 1' (RR1') in the chip 0 (CP0). The input/output circuit 10 transmits the column address CA of the received address <Ad01> to the column address register 0 (CR0) in the chip 0 (CP0) and also copies the column address CA of the address <Ad01> to the column address register 0' (CR0') in the chip 0 (CP0). The input/output circuit 10 transmits the received command <E0h> to the command register 1 (MR1) in the chip 0 (CP0) based on the address <Ad01> and also copies the command <E0h> to the command register 1' (MR1') in the chip 0 (CP0).

When the row address RA of the address <Ad01> is copied to the row address register 1' (RR1'), the row address register 1' (RR1') transmits the row address RA to the row decoder 52B.

Upon receipt of the command <E0h> from the command register 1' (MR11'), the sequencer 30 in the chip 0 (CP0) reserves the prefetch on the plane 1 (PL1). The sequencer 30 then initiates the prefetch. Upon receipt of the command <E0h> with the signal CB01 being in the ready state, the sequencer 30 immediately executes the prefetch on the plane 1 (PL1) in the chip 0 (CP0).

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A to 55D. Based on a result of decoding the column address CA of the address <Ad01>, the column decoder 55B selects a corresponding latch circuit in the data register 54B. Data in the latch circuit selected in sequence is transmitted to the FIFO circuit 12.

Next, as shown in FIG. 12, the memory controller 300 executes the cache read on the plane 0 (PL0) in the chip 0 (CP0). The particulars of the aforementioned cache read executed in response to the command <00h>, the address <Ad00>, and the command <31h> being issued after issuance of the command <05h>, the address <Ad01>, and the command <E0h> are the same as those of the cache read on the plane 0 (PL0) in the chip 0 (CP0) described above. Upon initiation of the cache read, the sequencer 30 in the chip 0

(CP0) sets the signal CB00 to the busy state. Upon completion of the cache transfer on the plane 0 (PL0) in the chip 0 (CP0), the sequencer 30 sets the signal CB00 to the ready state.

Figure 13:
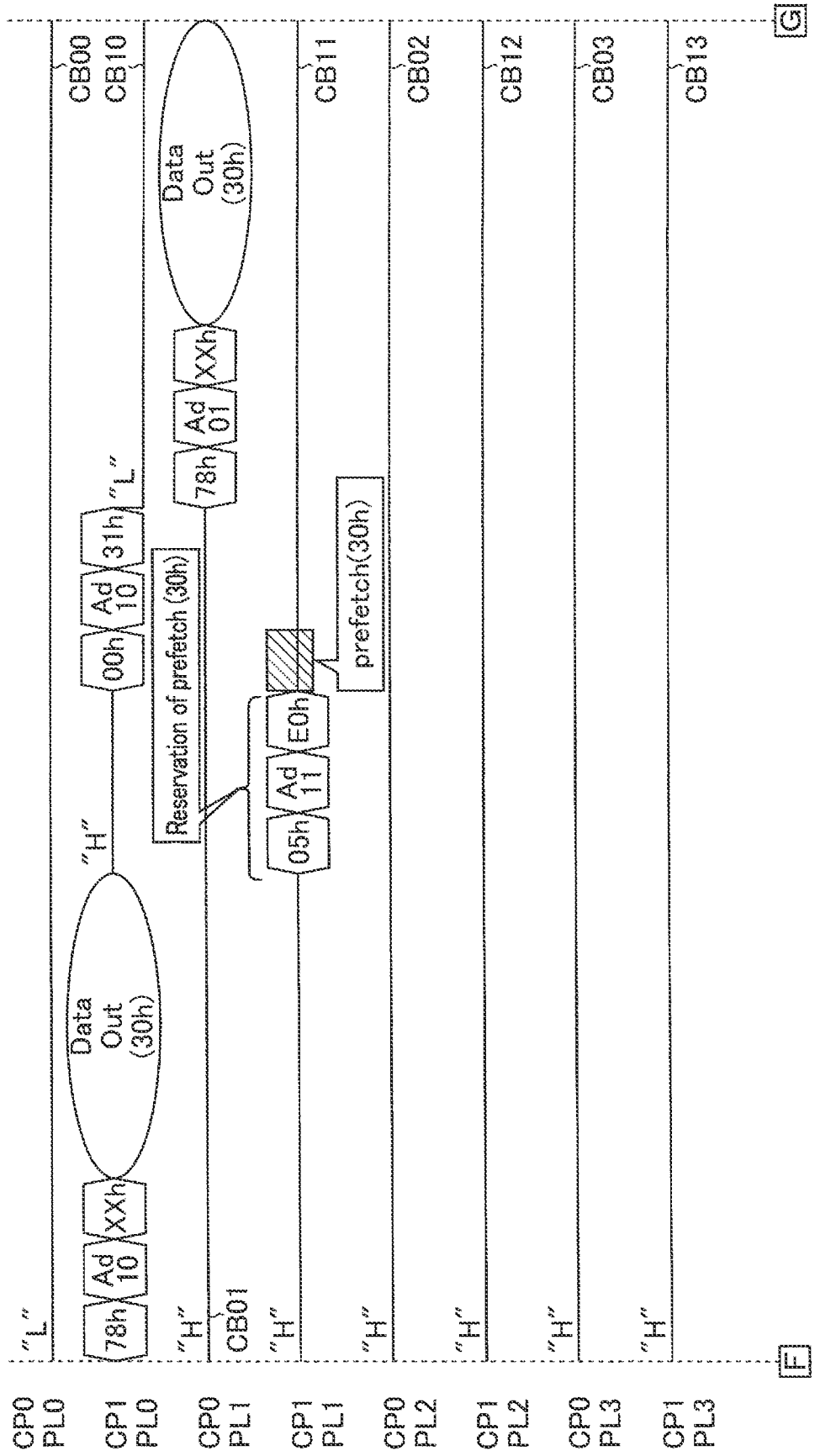
FIG. 13 is a diagram showing an example of the command sequence in the read operation of the memory system according to the first embodiment.

Next, as shown in FIG. 13, the memory controller 300 executes the status read on the plane 0 (PL0) in the chip 1 (CP1). The particulars of the aforementioned status read executed in response to the command <78h> and the address <Ad10> being issued after issuance of the command <00h>, the address <Ad00>, and the command <31h> are the same as those of the status read on the plane 0 (PL0) in the chip 1 (CP1) described above.

Next, upon receipt of the signal CB10 indicative of the ready state from the status register 21, the memory controller 300 executes the data-out on the plane 0 (PL0) in the chip 1 (CP1).

More specifically, the memory controller 300 issues the command <XXh> in order to execute the data-out on the plane 0 (PL0) in the chip 1 (CP1).

In the chip 1 (CP1), the input/output circuit 10 receives the command <XXh> issued by the memory controller 300. Thereafter, the data-out on the plane 0 (PL0) on which the prefetch has been executed is initiated as with the data-out on the plane 0 (PL0) in the chip 0 (CP0).

Next, as shown in FIG. 13, the memory controller 300 reserves the prefetch of read data in the normal read executed on the plane 1 (PL1) in the chip 1 (CP1).

More specifically, upon completion of the data-out on the plane 0 (PL0) in the chip 1 (CP1), the memory controller 300 issues the command <05h>, the address <Ad11>, and the command <E0h> in order to reserve the prefetch on the plane 1 (PL1) in the chip 1 (CP1).

In the chip 1 (CP1), the input/output circuit 10 receives the command <05h>, the address <Ad11>, and the command <E0h> each issued by the memory controller 300. Thereafter, the prefetch on the plane 1 (PL1) in the chip 1 (CP1) is reserved and initiated as with the reservation and execution of the prefetch on the plane 1 (PL1) in the chip 0 (CP0). Upon receipt of the command <E0h> with the signal CB11 being in the ready state, the sequencer 30 in the chip 1 (CP1) immediately executes the prefetch on the plane 1 (PL1) in the chip 1 (CP1).

Next, the memory controller 300 executes the cache read on the plane 0 (PL0) in the chip 1 (CP1). The particulars of the aforementioned cache read executed in response to the command <00h>, the address <Ad10>, and the command <31h> being issued after issuance of the command <05h>, the address <Ad11>, and the command <E0h> are the same as those of the cache read on the plane 0 (PL0) in the chip 1 (CP1) described above. Upon initiation of the cache read, the sequencer 30 in the chip 1 (CP1) sets the signal CB10 to the busy state. Upon completion of the cache transfer on the plane 0 (PL0) in the chip 1 (CP1), the sequencer 30 sets the signal CB10 to the ready state.

Next, as shown in FIG. 13, the memory controller 300 executes the status read on the plane 1 (PL1) in the chip 0 (CP0). The particulars of the aforementioned status read executed in response to the command <78h> and the address <Ad01> being issued after issuance of the command <00h>, the address <Ad10>, and the command <31h> are the same as those of the status read on the plane 1 (PL1) in the chip 0 (CP0) described above.

Next, upon receipt of the signal CB01 indicative of the ready state from the status register 21, the memory controller 300 executes the data-out on the plane 1 (PL1) in the chip 0 (CP0).

More specifically, the memory controller 300 issues a command <XXh> in order to execute the data-out on the plane 1 (PL1) in the chip 0 (CP0).

In the chip 0 (CP0), the input/output circuit 10 receives the command <XXh> issued by the memory controller 300. The input/output circuit 10 transmits the received command <XXh> to the command register 1 (MR1) in the chip 0 (CP0).

Upon receipt of the command <XXh> from the command register 1 (MR1), the sequencer 30 in the chip 0 (CP0) initiates the data-out on the plane 1 (PL1) on which the prefetch has been executed.

Figure 14:
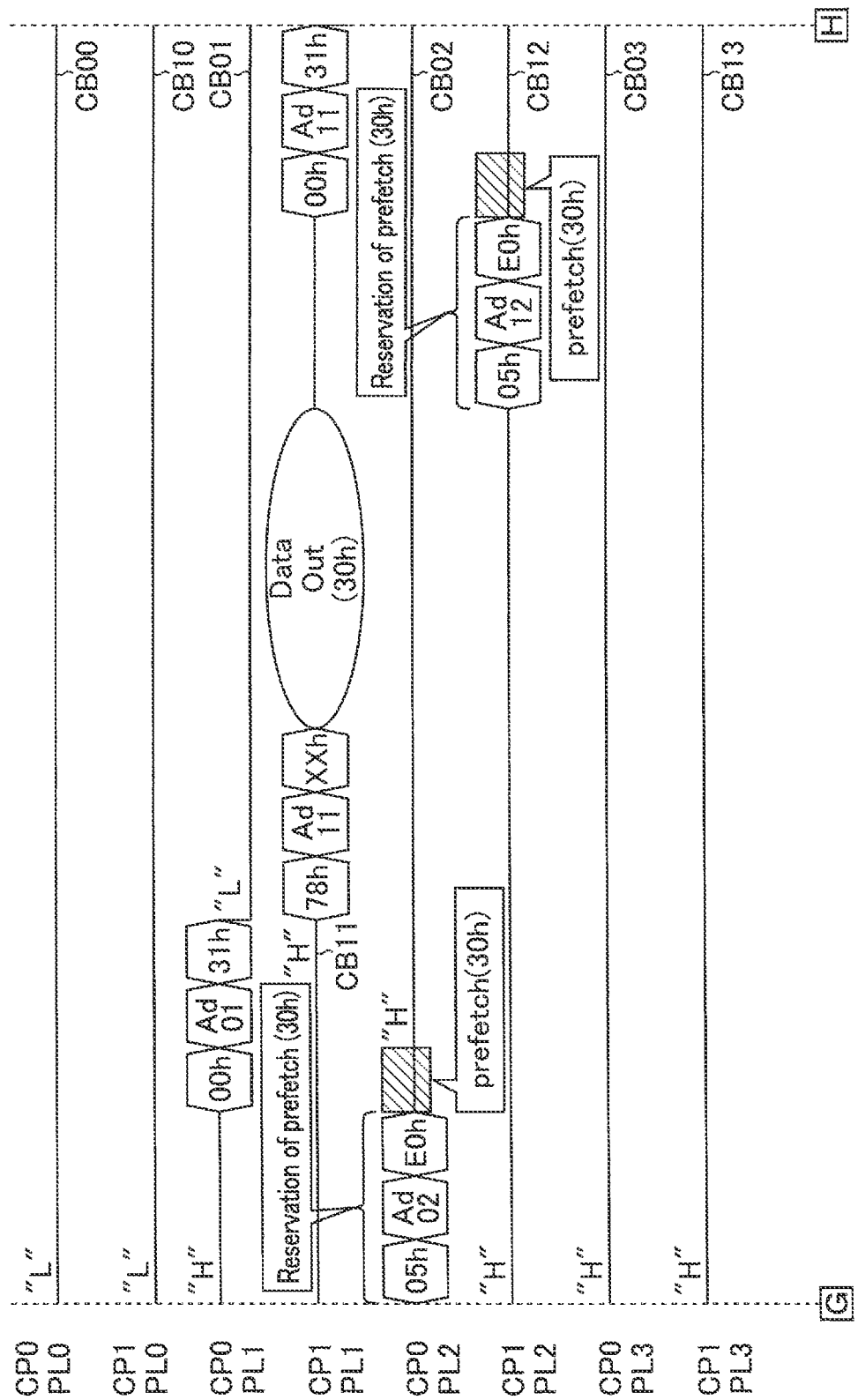
FIG. 14 is a diagram showing an example of the command sequence in the read operation of the memory system according to the first embodiment.

Next, as shown in FIG. 14, the memory controller 300 reserves the prefetch of read data in the normal read executed on the plane 2 (PL2) in the chip 0 (CP0).

More specifically, upon completion of the data-out on the plane 1 (PL1) in the chip 0 (CP0), the memory controller 300 issues the command <05h>, the address <Ad02>, and the command <E0h> in order to reserve the prefetch on the plane 2 (PL2) in the chip 0 (CP0).

In the chip 0 (CP0), the input/output circuit 10 receives the command <05h>, the address <Ad02>, and the command <E0h> each issued by the memory controller 300. The input/output circuit 10 transmits the received command <05h> to the command register 2 (MR2) in the chip 0 (CP0) based on the address <Ad02> and also copies the command <05h> to the command register 2' (MR2') in the chip 0 (CP0). The input/output circuit 10 transmits the row address RA of the received address <Ad02> to the row address register 2 (RR2) in the chip 0 (CP0) and also copies the row address RA of the address <Ad02> to the row address register 2' (RR2') in the chip 0 (CP0). The input/output circuit 10 transmits the column address CA of the received address <Ad02> to the column address register 0 (CR0) in the chip 0 (CP0) and also copies the column address CA of the address <Ad02> to the column address register 0' (CR0') in the chip 0 (CP0). The input/output circuit 10 transmits the received command <E0h> to the command register 2 (MR2) in the chip 0 (CP0) based on the address <Ad02> and also copies the command <E0h> to the command register 2' (MR2') in the chip 0 (CP0).

When the row address RA of the address <Ad02> is copied to the row address register 2' (RR2'), the row address register 2' (RR2') transmits the row address RA to the row decoder 52C.

Upon receipt of the command <E0h> from the command register 2' (MR2'), the sequencer 30 in the chip 0 (CP0) reserves the prefetch on the plane 2 (PL2). The sequencer 30 then initiates the prefetch. Upon receipt of the command <E0h> with the signal CB02 being in the ready state, the sequencer 30 immediately executes the prefetch on the plane 2 (PL2) in the chip 0 (CP0).

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A to 55D. Based on a result of decoding the column address CA of the address <Ad02>, the column decoder 55C selects a corresponding latch circuit in the data register 54C. Data in the latch circuit selected in sequence is transmitted to the FIFO circuit 12.

Next, the memory controller 300 executes the cache read on the plane 1 (PL1) in the chip 0 (CP0). The particulars of the aforementioned cache read executed in response to the command <00h>, the address <Ad01>, and the command <31h> being issued after issuance of the command <05h>, the address <Ad02>, and the command <E0h> are the same as those of the cache read on the plane 1 (PL1) in the chip 0 (CP0) described above. Upon initiation of the cache read, the sequencer 30 in the chip 0 (CP0) sets the signal CB01 to the busy state. Upon completion of the cache transfer on the plane 1 (PL1) in the chip 0 (CP0), the sequencer 30 sets the signal CB01 to the ready state.

Next, as shown in FIG. 14, the memory controller 300 executes the status read on the plane 1 (PL1) in the chip 1 (CP1). The particulars of the aforementioned status read executed in response to the command <78h> and the address <Ad11> being issued after issuance of the command <00h>, the address <Ad01>, and the command <31h> are the same as those of the status read on the plane 1 (PL1) in the chip 1 (CP1) described above.

Next, upon receipt of the signal CB11 indicative of the ready state from the status register 21, the memory controller 300 executes the data-out on the plane 1 (PL1) in the chip 1 (CP1).

More specifically, the memory controller 300 issues the command <XXh> in order to execute the data-out on the plane 1 (PL1) in the chip 1 (CP1).

In the chip 1 (CP1), the input/output circuit 10 receives the command <XXh> issued by the memory controller 300. Thereafter, the data-out on the plane 1 (PL1) on which the prefetch has been executed is initiated as with the data-out on the plane 1 (PL1) in the chip 0 (CP0).

Next, as shown in FIG. 14, the memory controller 300 reserves the prefetch of read data in the normal read executed on the plane 2 (PL2) in the chip 1 (CP1).

More specifically, upon completion of the data-out on the plane 1 (PL1) in the chip 1 (CP1), the memory controller 300 issues the command <05h>, the address <Ad12>, and the command <E0h> in order to reserve the prefetch on the plane 2 (PL2) in the chip 1 (CP1).

In the chip 1 (CP1), the input/output circuit 10 receives the command <05h>, the address <Ad12>, and the command <E0h> each issued by the memory controller 300. Thereafter, the prefetch on the plane 2 (PL2) in the chip 1 (CP1) is reserved and initiated as with the reservation and execution of the prefetch on the plane 2 (PL2) in the chip 0 (CP0). Upon receipt of the command <E0h> with the signal CB12 being in the ready state, the sequencer 30 in the chip 1 (CP1) immediately executes the prefetch on the plane 2 (PL2) in the chip 1 (CP1).

Next, the memory controller 300 executes the cache read on the plane 1 (PL1) in the chip 1 (CP1). The particulars of the aforementioned cache read executed in response to the command <00h>, the address <Ad11>, and the command <31h> being issued after issuance of the command <05h>, the address <Ad12>, and the command <E0h> are the same as those of the cache read on the plane 1 (PL1) in the chip 1 (CP1) described above. Upon initiation of the cache read, the sequencer 30 in the chip 1 (CP1) sets the signal CB11 to the busy state. Upon completion of the cache transfer on the plane 1 (PL1) in the chip 1 (CP1), the sequencer 30 sets the signal CB11 to the ready state.

Figure 15:
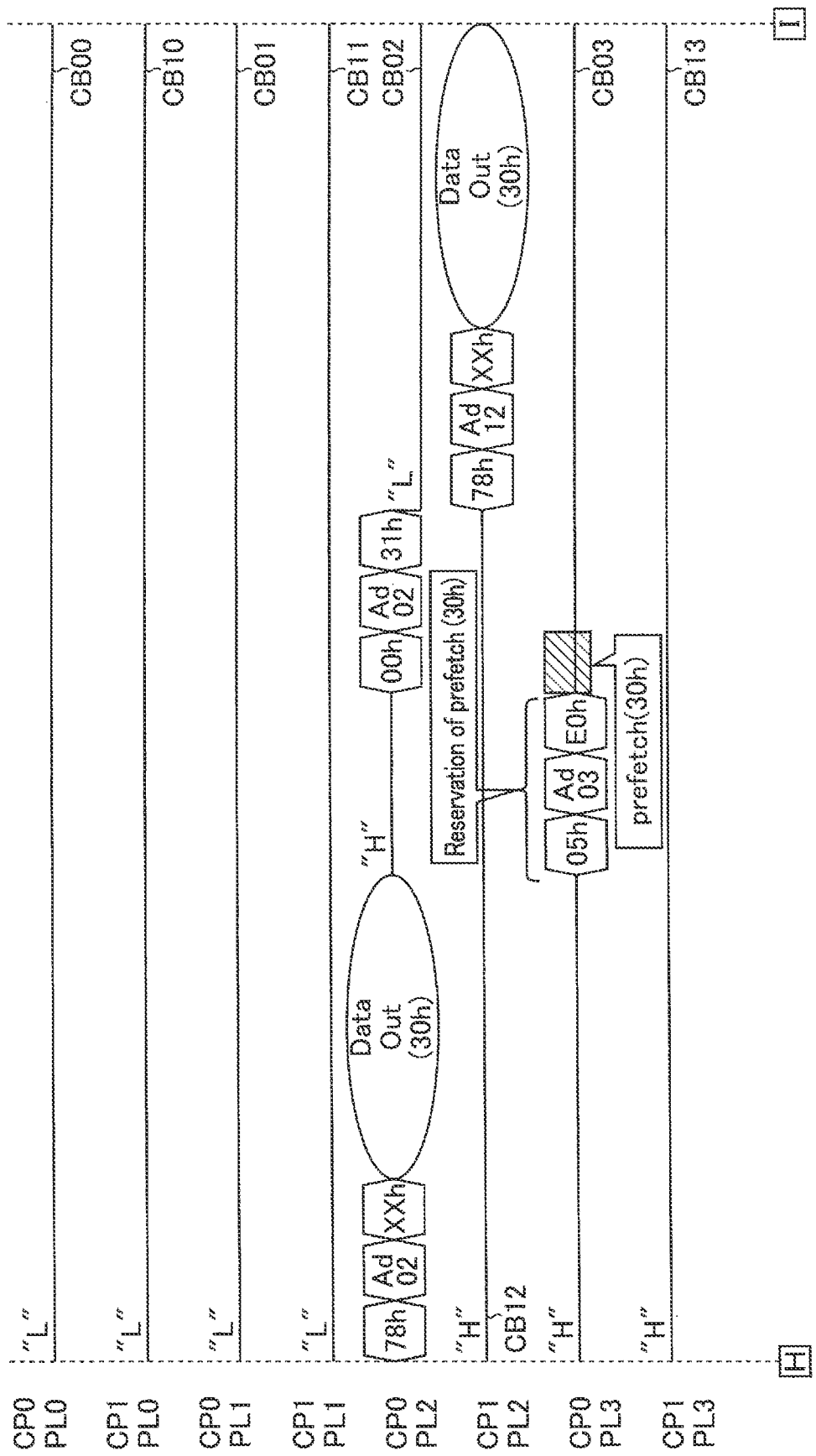
FIG. 15 is a diagram showing an example of the command sequence in the read operation of the memory system according to the first embodiment.

Next, as shown in FIG. 15, the memory controller 300 executes the status read on the plane 2 (PL2) in the chip 0 (CP0). The particulars of the aforementioned status read executed in response to the command <78h> and the address <Ad02> being issued after issuance of the command <00h>, the address <Ad11>, and the command <31h> are the same as those of the status read on the plane 2 (PL2) in the chip 0 (CP0) described above.

Next, upon receipt of the signal CB02 indicative of the ready state from the status register 21, the memory controller 300 executes the data-out on the plane 2 (PL2) in the chip 0 (CP0).

More specifically, the memory controller 300 issues the command <XXh> in order to execute the data-out on the plane 2 (PL2) in the chip 0 (CP0).

In the chip 0 (CP0), the input/output circuit 10 receives the command <XXh> issued by the memory controller 300. The input/output circuit 10 transmits the received command <XXh> to the command register 2 (MR2) in the chip 0 (CP0).

Upon receipt of the command <XXh> from the command register 2 (MR2), the sequencer 30 in the chip 0 (CP0) initiates the data-out on the plane 2 (PL2) on which the prefetch has been executed.

Next, as shown in FIG. 15, the memory controller 300 reserves the prefetch of read data in the normal read executed on the plane 3 (PL3) in the chip 0 (CP0).

More specifically, upon completion of the data-out on the plane 2 (PL2) in the chip 0 (CP0), the memory controller 300 issues the command <05h>, the address <Ad03>, and the command <E0h> in order to reserve the prefetch on the plane 3 (PL3) in the chip 0 (CP0).

In the chip 0 (CP0), the input/output circuit 10 receives the command <05h>, the address <Ad03>, and the command <E0h> each issued by the memory controller 300. The input/output circuit 10 transmits the received command <05h> to the command register 3 (MR3) in the chip 0 (CP0) based on the address <Ad03> and also copies the command <05h> to the command register 3' (MR3') in the chip 0 (CP0). The input/output circuit 10 transmits the row address RA of the received address <Ad03> to the row address register 3 (RR3) in the chip 0 (CP0) and also copies the row address RA of the address <Ad03> to the row address register 3' (RR3') in the chip 0 (CP0). The input/output circuit 10 transmits the column address CA of the received address <Ad03> to the column address register 0 (CR0) in the chip 0 (CP0) and also copies the column address CA of the address <Ad03> to the column address register 0' (CR0') in the chip 0 (CP0). The input/output circuit 10 transmits the received command <E0h> to the command register 3 (MR3) in the chip 0 (CP0) based on the address <Ad03> and also copies the command <E0h> to the command register 3' (MR3') in the chip 0 (CP0).

When the row address RA of the address <Ad03> is copied to the row address register 3' (RR3'), the row address register 3' (RR3') transmits the row address RA to the row decoder 52D.

Upon receipt of the command <E0h> from the command register 3' (MR3'), the sequencer 30 in the chip 0 (CP0) reserves the prefetch on the plane 3 (PL3). The sequencer 30 then initiates the prefetch. Upon receipt of the command <E0h> with the signal CB03 being in the ready state, the sequencer 30 immediately executes the prefetch on the plane 3 (PL3) in the chip 0 (CP0).

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A to 55D. Based on a result of decoding the column address CA of the address <Ad03>, the column decoder 55D selects a corresponding latch circuit in the data register 54D. Data in the latch circuit selected in sequence is transmitted to the FIFO circuit 12.

Next, the memory controller 300 executes the cache read on the plane 2 (PL2) in the chip 0 (CP0). The particulars of the aforementioned cache read executed in response to the command <00h>, the address <Ad02>, and the command <31h> being issued after issuance of the command <05h>, the address <Ad03>, and the command <E0h> are the same as those of the cache read on the plane 2 (PL2) in the chip 0 (CP0) described above. Upon initiation of the cache read, the sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

Next, as shown in FIG. 15, the memory controller 300 executes the status read on the plane 2 (PL2) in the chip 1 (CP1). The particulars of the aforementioned status read executed in response to the command <78h> and the address <Ad12> being issued after issuance of the command <00h>, the address <Ad02>, and the command <31h> are the same as those of the status read on the plane 2 (PL2) in the chip 1 (CP1) described above.

Next, upon receipt of the signal CB12 indicative of the ready state from the status register 21, the memory controller 300 executes the data-out on the plane 2 (PL2) in the chip 1 (CP1).

More specifically, the memory controller 300 issues the command <XXh> in order to execute the data-out on the plane 2 (PL2) in the chip 1 (CP1).

In the chip 1 (CP1), the input/output circuit 10 receives the command <XXh> issued by the memory controller 300. Thereafter, the data-out on the plane 2 (PL2) on which the prefetch has been executed is initiated as with the data-out on the plane 2 (PL2) in the chip 0 (CP0).

Figure 16:
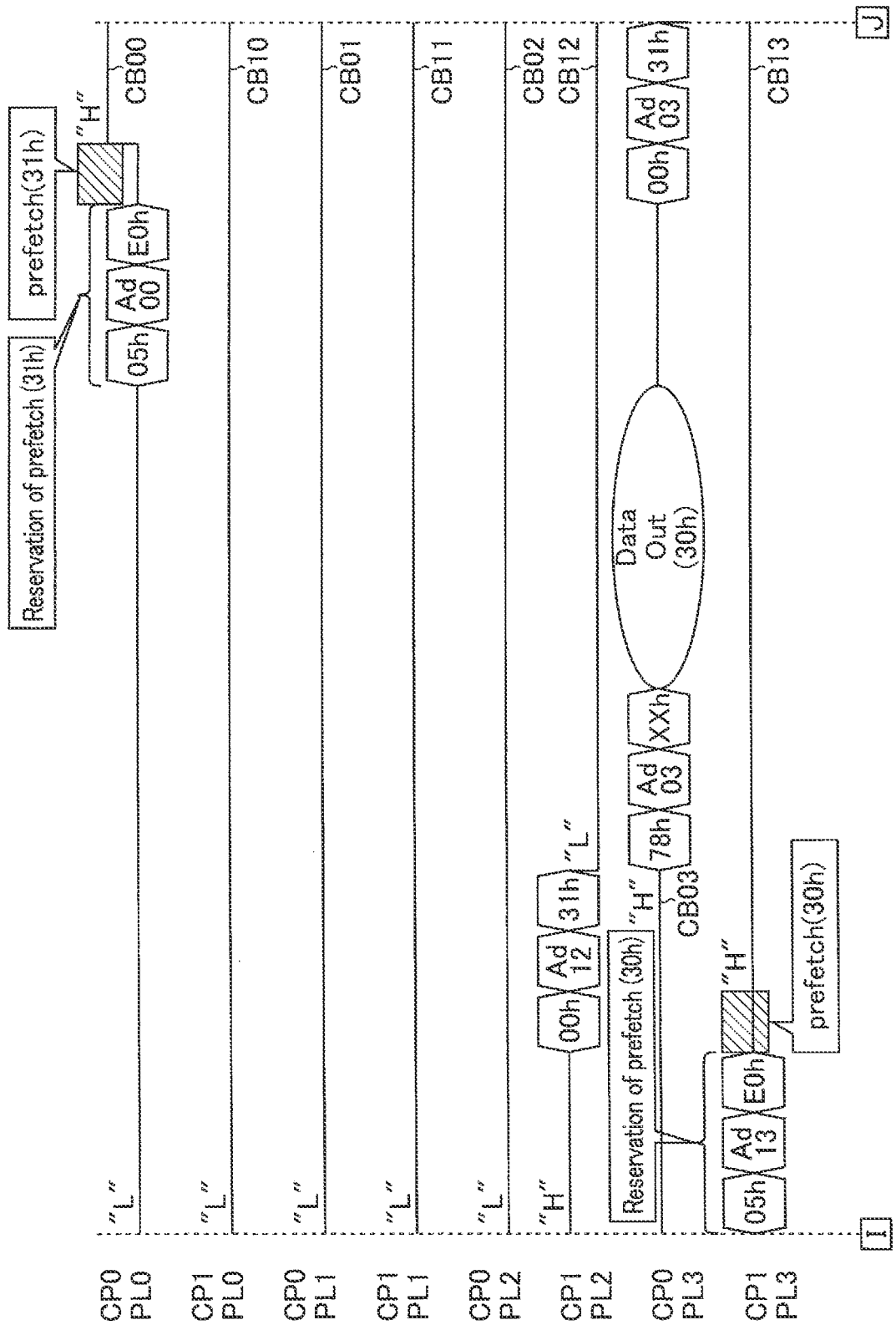
FIG. 16 is a diagram showing an example of the command sequence in the read operation of the memory system according to the first embodiment.

Next, as shown in FIG. 16, the memory controller 300 reserves the prefetch of read data in the normal read executed on the plane 3 (PL3) in the chip 1 (CP1).

More specifically, upon completion of the data-out on the plane 2 (PL2) in the chip 1 (CP1), the memory controller 300 issues the command <05h>, the address <Ad13>, and the command <E0h> in order to reserve the prefetch on the plane 3 (PL3) in the chip 1 (CP1).

In the chip 1 (CP1), the input/output circuit 10 receives the command <05h>, the address <Ad13>, and the command <E0h> each issued by the memory controller 300. Thereafter, the prefetch on the plane 3 (PL3) in the chip 1 (CP1) is reserved and initiated as with the reservation and execution of the prefetch on the plane 3 (PL3) in the chip 0 (CP0). Upon receipt of the command <E0h> with the signal CB13 being in the ready state, the sequencer 30 immediately executes the prefetch on the plane 3 (PL3) in the chip 1 (CP1).

Next, the memory controller 300 executes the cache read on the plane 2 (PL2) in the chip 1 (CP1). The particulars of the aforementioned cache read executed in response to the command <00h>, the address <Ad12>, and the command <31h> being issued after issuance of the command <05h>, the address <Ad13>, and the command <E0h> are the same as those of the cache read on the plane 2 (PL2) in the chip 1 (CP1) described above. Upon initiation of the cache read, the sequencer 30 in the chip 1 (CP1) sets the signal CB12 to the busy state. Upon completion of the cache transfer on the plane 2 (PL2) in the chip 1 (CP1), the sequencer 30 sets the signal CB12 to the ready state.

Next, as shown in FIG. 16, the memory controller 300 executes the status read on the plane 3 (PL3) in the chip 0 (CP0). The particulars of the aforementioned status read executed in response to the command <78h> and the address <Ad03> being issued after issuance of the command <00h>, the address <Ad12>, and the command <31h> are the same as those of the status read on the plane 3 (PL3) in the chip 0 (CP0) described above.

Upon receipt of the signal CB03 indicative of the ready state from the status register 21, the memory controller 300 executes the data-out on the plane 3 (PL3) in the chip 0 (CP0).

More specifically, the memory controller 300 issues the command <XXh> in order to execute the data-out on the plane 3 (PL3) in the chip 0 (CP0).

In the chip 0 (CP0), the input/output circuit 10 receives the command <XXh> issued by the memory controller 300. The input/output circuit 10 transmits the received command <XXh> to the command register 3 (MR3) in the chip 0 (CP0).

Upon receipt of the command <XXh> from the command register 3 (MR3), the sequencer 30 in the chip 0 (CP0) initiates the data-out on the plane 3 (PL3) on which the prefetch has been executed.

Next, as shown in FIG. 16, the memory controller 300 reserves the prefetch of read data in the cache read executed on the plane 0 (PL0) in the chip 0 (CP0).

More specifically, upon completion of the data-out on the plane 3 (PL3) in the chip 0 (CP0), the memory controller 300 issues the command <05h>, the address <Ad00>, and the command <E0h> in order to reserve the prefetch on the plane 0 (PL0) in the chip 0 (CP0).

In the chip 0 (CP0), the input/output circuit 10 receives the command <05h>, the address <Ad00>, and the command <E0h> each issued by the memory controller 300. Thereafter, the prefetch on the plane 0 (PL0) in the chip 0 (CP0) is reserved and initiated as with the reservation and execution of the prefetch on the plane 0 (PL0) in the chip 0 (CP0) described above. Upon receipt of the command <E0h> with the signal CB00 being in the busy state, the sequencer 30 in the chip 0 (CP0) executes the prefetch on the plane 0 (PL0) in the chip 0 (CP0) during a period in which the signal CB00 is in the busy state.

Next, the memory controller 300 executes the cache read on the plane 3 (PL3) in the chip 0 (CP0). The particulars of the aforementioned cache read executed in response to the command <00h>, the address <Ad03>, and the command <31h> being issued after issuance of the command <05h>, the address <Ad00>, and the command <E0h> are the same as those of the cache read on the plane 3 (PL3) in the chip 0 (CP0) described above. Upon initiation of the cache read, the sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Figure 17:
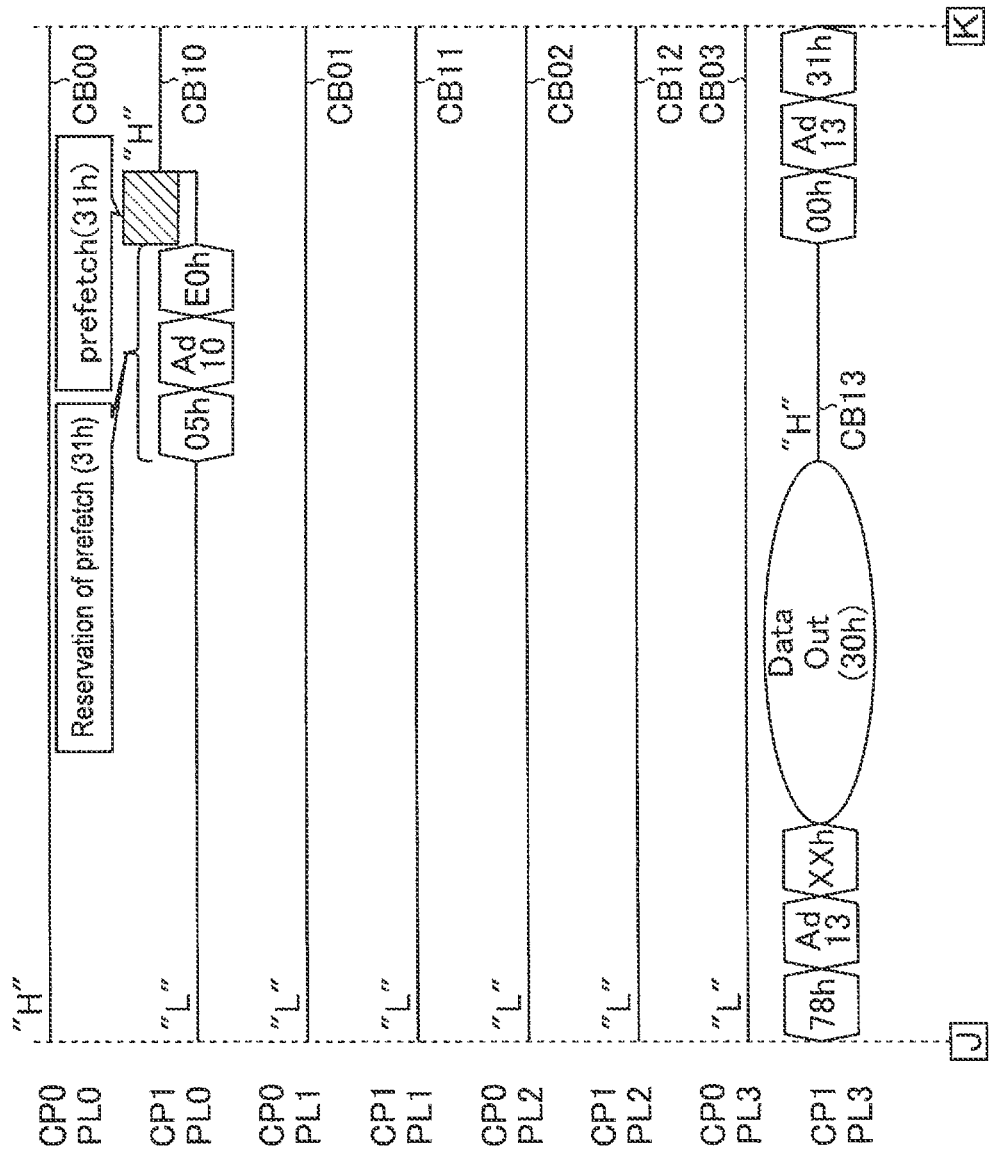
FIG. 17 is a diagram showing an example of the command sequence in the read operation of the memory system according to the first embodiment.

Next, as shown in FIG. 17, the memory controller 300 executes the status read on the plane 3 (PL3) in the chip 1 (CP1). The particulars of the aforementioned status read executed in response to the command <78h> and the address <Ad13> being issued after issuance of the command <00h>, the address <Ad03>, and the command <31h> are the same as those of the status read on the plane 3 (PL3) in the chip 1 (CP1) described above.

Next, upon receipt of the signal CB13 indicative of the ready state from the status register 21, the memory controller 300 executes the data-out on the plane 3 (PL3) in the chip 1 (CP1).

More specifically, the memory controller 300 issues the command <XXh> in order to execute the data-out on the plane 3 (PL3) in the chip 1 (CP1).

In the chip 1 (CP1), the input/output circuit 10 receives the command <XXh> issued by the memory controller 300.

Thereafter, the data-out on the plane 3 (PL3) on which the prefetch has been executed is initiated as with the data-out on the plane 3 (PL3) in the chip 0 (CP0).

Next, as shown in FIG. 17, the memory controller 300 reserves the prefetch of read data in the cache read executed on the plane 0 (PL0) in the chip 1 (CP1).

More specifically, upon completion of the data-out on the plane 3 (PL3) in the chip 1 (CP1), the memory controller 300 issues the command <05h>, the address <Ad10>, and the command <E0h> in order to reserve the prefetch on the plane 0 (PL0) in the chip 1 (CP1).

In the chip 1 (CP1), the input/output circuit 10 receives the command <05h>, the address <Ad10>, and the command <E0h> each issued by the memory controller 300. Thereafter, the prefetch on the plane 0 (PL0) in the chip 1 (CP1) is reserved and initiated as with the reservation and execution of the prefetch on the plane 0 (PL0) in the chip 1 (CP1) described above. Upon receipt of the command <E0h> with the signal CB10 being in the busy state, the sequencer 30 in the chip 1 (CP1) executes the prefetch on the plane 0 (PL0) in the chip 1 (CP1) during a period in which the signal CB10 is in the busy state.

Next, the memory controller 300 executes the cache read on the plane 3 (PL3) in the chip 1 (CP1). The particulars of the aforementioned cache read executed in response to the command <00h>, the address <Ad13>, and the command <31h> being issued after issuance of the command <05h>, the address <Ad10>, and the command <E0h> are the same as those of the cache read on the plane 3 (PL3) in the chip 1 (CP1) described above. Upon initiation of the cache read, the sequencer 30 in the chip 1 (CP1) sets the signal CB13 to the busy state. Upon completion of the cache transfer on the plane 3 (PL3) in the chip 1 (CP1), the sequencer 30 sets the signal CB13 to the ready state.

Hereinafter, the command sequences corresponding to a period from E to K are repeated until all of data to be read in the planes 0 to 3 (PL0 to PL3) in the chip 0 (CP0) and the planes 0 to 3 (PL0 to PL3) in the chip 1 (CP1) are data-out.

1.3 Advantageous Effect

Figure 39:
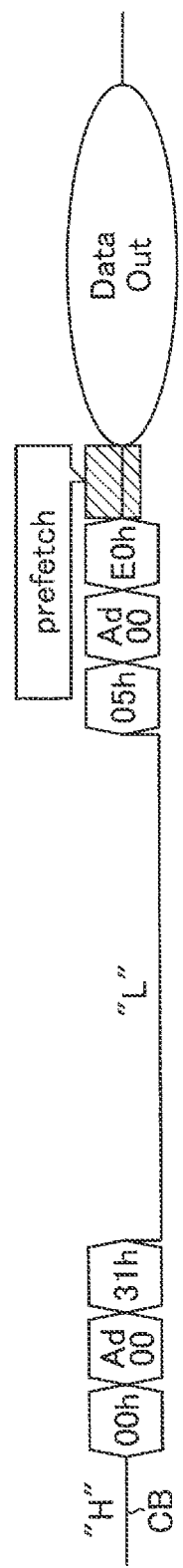
FIG. 39 is a diagram showing an operation of a NAND chip according to a comparative example.

FIG. 39 illustrates an operation of a NAND chip according to a comparative example. The NAND chip according to the comparative example accepts, from the memory controller 300, the command <00h>, the address <Ad00>, and the command <31h> for causing the cache read to execute, and then accepts the command <05h>, the address <Ad00>, and the command <E0h> for causing the data-out to execute. The NAND chip according to the comparative example executes the prefetch and the data-out by accepting the command "31h" issued by the memory controller 300 and then after transition of the signal CB to the ready state, accepting the command "05h".

On the other hand, in the memory system 100 according to the present embodiment, the memory controller 300 issues the command <05h>, the address <Ad00>, and the command <E0h> for reserving the prefetch with respect to the semiconductor memory device 200 during a period from when the command <00h>, the address <Ad00>, and the command <31h> for causing the cache read to execute are issued to when the command "XXh" for causing the data-out to execute is issued. The NAND chip according to the present embodiment is capable of accepting the command "05h" regardless of whether the signal CB is in the busy state or the ready state. This enables the NAND chip according to the present embodiment to reserve the prefetch in response to the command "05h" being accepted during a period from acceptance of the command "31h" issued by the memory controller 300 to acceptance of the command "XXh".

Figure 40:
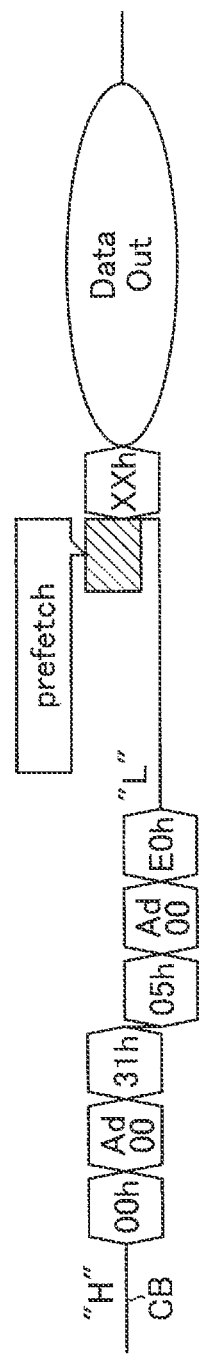
FIG. 40 is a diagram showing an operation of the NAND chip included in the memory system according to the first embodiment.

FIG. 40 illustrates an operation in the case where the command "05h" is accepted with the signal CB being in the busy state in the NAND chip according to the present embodiment. In this case, the sequencer 30 executes the prefetch subsequently to the cache transfer, and after execution of the prefetch, sets the signal CB to the ready state. By this, the data DAT read from the memory cell array 51 to the data register 54 is fetched from the data register 54 to the FIFO circuit 12 before transition of the signal CB to the ready state. This enables the data-out to be executed immediately after the signal CB transitions to the ready state.

With the configuration according to the present embodiment, the memory controller 300 can issue, with respect to each plane in the chip, the command "05h" during a period from issuance of the command "31h" to issuance of the command "XXh", regardless of whether the signal CB is in the busy state or the ready state. That is, the prefetch can be reserved during the read operation, so that a period until initiation of the data-out can be shortened as compared to a case in which the prefetch is reserved after completion of the read operation. Accordingly, the speed of operations of the memory system can be enhanced.

Furthermore, as shown in FIG. 8 to FIG. 17, in the memory system 100 according to the present embodiment, during a period in which the prefetch is executed in one of the NAND chips included in the semiconductor memory device 200 after issuance of the command <05h>, the address <Ad00>, and the command <E0h> for reserving the prefetch with respect to the one NAND chip, the memory controller 300 can issue a command for instructing, for example, the cache read with respect to the other NAND chips. Accordingly, in the configuration in which the plurality of NAND chips are coupled to the single data bus DB, the efficiency of use of the data bus DB can be enhanced by reducing a time period in which the data bus DB is not used.

2. Second Embodiment

The memory system 100 according to the second embodiment will be described. The memory system 100 according to the present embodiment corresponds to the memory system 100 according to the first embodiment modified by providing two FIFO circuits inside the input/output circuit 10 and providing four column address registers inside the address register 22. Hereinafter, the following description will in principle concentrate on the features different from the first embodiment.

2.1 Configuration of Input/Output Circuit 10

Figure 18:
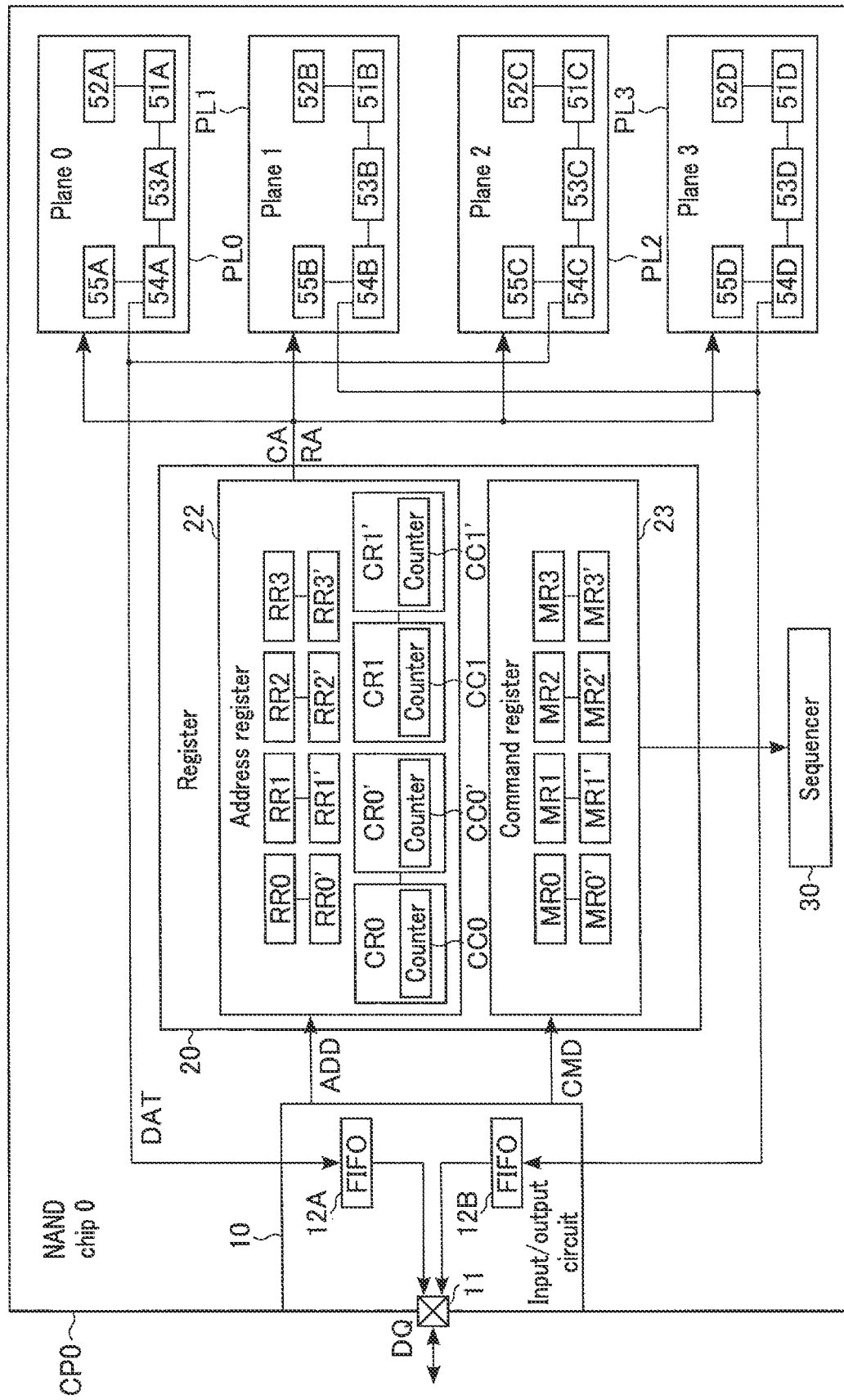
FIG. 18 is a block diagram showing a configuration of a NAND chip included in a memory system according to a second embodiment, focusing on an input/output circuit and a register.

A configuration of the input/output circuit 10 will be described with reference to FIG. 18. FIG. 18 is a block diagram showing a configuration of the NAND chip 0 (CP0) included in the memory system 100 according to the present embodiment, focusing on the input/output circuit 10 and the register 20. In FIG. 18, the status register 21 and the voltage generating circuit 40 are omitted.

The input/output circuit 10 includes the DQ pad 11 and the FIFO circuits 12A and 12B. The DQ pad 11 is coupled to data registers 54A and 54C via the FIFO circuit 12A. The DQ pad 11 is further coupled to the data registers 54B and 54D via the FIFO circuit 12B. The FIFO circuit 12A and 12B each have the same configuration as that of the FIFO circuit 12 illustrated in FIG. 6 according to the first embodiment.

2.2 Configuration of Register 20

A configuration of the register 20 will be described with reference to FIG. 18.

The address register 22 corresponds to the address register 22 illustrated in FIG. 6 according to the first embodiment modified to further include a column address register 1 (CR1) and a column address register 1' (CR1'). The column address register 1 (CR1) has the same configuration as that of the column address register 0 (CR0) illustrated in FIG. 6 according to the first embodiment. The column address register 1' (CR1') has the same configuration as that of the column address register 0' (CR0') illustrated in FIG. 6 according to the first embodiment.

The column address register 0 (CR0) is coupled to the input/output circuit 10 and the planes 0 and 2 (PL0 and PL2), and stores the column address CA of the planes 0 and 2 (PL0 and PL2) received from the input/output circuit 10. The column address register 0' (CR0') is coupled to the column address register 0 (CR0) and the planes 0 and 2 (PL0 and PL2), and stores the column address CA received (copied) from the column address register 0 (CR0).

The column address register 1 (CR1) is coupled to the input/output circuit 10 and the planes 1 and 3 (PL1 and PL3), and stores the column address CA of the planes 1 and 3 (PL1 and PL3) received from the input/output circuit 10. The column address register 1' (CR1') is coupled to the column address register 1 (CR1) and the planes 1 and 3 (PL1 and PL3), and stores the column address CA received (copied) from the column address register 1 (CR1).

The column address register 0 (CR0) transmits the column addresses CA to the column decoders 55A and 55C. More specifically, the column address register 0 (CR0) transmits the first column address CA of a plane designated by the column address CA to the column decoders 55A and 55C. When the first column address CA is transmitted to the column decoders 55A and 55C, the column address counter circuit CC0 increments the column address CA by only one, and the column address register 0 (CR0) transmits a column address CA subsequent to the first column address CA to the column decoders 55A and 55C. When the last column address CA is transmitted to the column decoders 55A and 55C, transmission of the column addresses CA to the column decoders 55A and 55C is completed. As with the column address register 0 (CR0), the column address register 0' (CR0') transmits the column addresses CA to the column decoders 55A and 55C.

The column address register 1 (CR1) transmits the column addresses CA to the column decoders 55B and 55D. More specifically, the column address register 1 (CR1) transmits the first column address CA of a plane designated by the column address CA to the column decoders 55B and 55D. When the first column address CA is transmitted to the column decoders 55B and 55D, the column address counter circuit CC1 increments the column address CA by only one, and the column address register 1 (CR1) transmits a column address CA subsequent to the first column address CA to the column decoders 55B and 55D. When the last column address CA is transmitted to the column decoders 55B and 55D, transmission of the column addresses CA to the column decoders 55B and 55D is completed. As with the column address register 1 (CR1), the column address register 1' (CR1') transmits the column addresses CA to the column decoders 55B and 55D.

2.3 Operation

An operation of the memory system 100 according to the present embodiment will be described with reference to FIG. 19 to FIG. 23. FIG. 19 to FIG. 23 are each a diagram showing an example of a command sequence in the read operation of the memory system 100 according to the present embodiment. The following will describe an exemplary case in which the signals CEn1 and CEn2 are the same signal (CEn1=CEn2=CEn), and data is repeatedly read from the plane 0 to the plane 3 (PL0 to PL3) in this order in the chip 0 (CP0). FIG. 19 to FIG. 23 each also show the signals CB00 to CB03 of each of the planes in the chip 0 (CP0). The same applies to the case in which data is read from the chip 1 (CP1). The read operation in the present embodiment corresponds to the single plane read.

First, as shown in FIG. 19, the memory controller 300 executes the normal read on the plane 0 (PL0) in the chip 0 (CP0).

More specifically, after setting the signal CEn to the "L" level, the memory controller 300 issues the command <00h>, the address <Ad00>, and the command <30h> in order to execute the normal read on the plane 0 (PL0) in the chip 0 (CP0).

In the chip 0 (CP0), the input/output circuit 10 receives the command <00h>, the address <Ad00>, and the command <30h> each issued by the memory controller 300. The input/output circuit 10 transmits the received command <00h> to the command register 0 (MR0) based on the address <Ad00>. The input/output circuit 10 transmits the row address RA of the received address <Ad00> to the row address register 0 (RR0), and transmits the column address CA of the received address <Ad00> to the column address register 0 (CR0). The input/output circuit 10 transmits the received command <30h> to the command register 0 (MR0) based on the address <Ad00>.

When the row address RA of the address <Ad00> is stored in the row address register 0 (RR0), the row address register 0 (RR0) transmits the row address RA to the row decoder 52A.

Upon receipt of the command <30h> from the command register 0 (MR0), the sequencer 30 in the chip 0 (CP0) initiates the normal read on the plane 0 (PL0). The sequencer 30 sets the signal CB00 to the busy state. The signal CB00 is stored in the status register 21. Upon completion of the normal read on the plane 0 (PL0) in the chip 0 (CP0), the sequencer 30 sets the signal CB00 to the ready state. This enables the plane 0 (PL0) in the chip 0 (CP0) to accept a subsequent command.

Next, the memory controller 300 executes the normal read on the plane 1 (PL1) in the chip 0 (CP0).

More specifically, after issuance of the command <00h>, the address <Ad00>, and the command <30h>, the memory controller 300 issues the command <00h>, the address <Ad01>, and the command <30h> in order to execute the normal read on the plane 1 (PL1) in the chip 0 (CP0).

In the chip 0 (CP0), the input/output circuit 10 receives the command <00h>, the address <Ad01>, and the command <30h> each issued by the memory controller 300. The input/output circuit 10 transmits the received command <00h> to the command register 1 (MR1) based on the address <Ad01>. The input/output circuit 10 transmits the row address RA of the received address <Ad01> to the row address register 1 (RR1), and transmits the column address CA of the received address <Ad01> to the column address register 1 (CR1). The input/output circuit 10 transmits the received command <30h> to the command register 1 (MR1) based on the address <Ad01>.

When the row address RA of the address <Ad01> is stored in the row address register 1 (RR1), the row address register 1 (RR1) transmits the row address RA to the row decoder 52B.

Upon receipt of the command <30h> from the command register 1 (MR1), the sequencer 30 in the chip 0 (CP0) initiates the normal read on the plane 1 (PL1). The sequencer 30 sets the signal CB01 to the busy state. The signal CB01 is stored in the status register 21. Upon completion of the normal read on the plane 1 (PL1) in the chip 0 (CP0), the sequencer 30 sets the signal CB01 to the ready state. This enables the plane 1 (PL1) in the chip 0 (CP0) to accept a subsequent command.

Next, the memory controller 300 executes the normal read on the plane 2 (PL2) in the chip 0 (CP0).

More specifically, after issuance of the command <00h>, the address <Ad01>, and the command <30h>, the memory controller 300 issues the command <00h>, the address <Ad02>, and the command <30h> in order to execute the normal read on the plane 2 (PL2) in the chip 0 (CP0).

In the chip 0 (CP0), the input/output circuit 10 receives the command <00h>, the address <Ad02>, and the command <30h> each issued by the memory controller 300. The input/output circuit 10 transmits the received command <00h> to the command register 2 (MR2) based on the address <Ad02>. The input/output circuit 10 transmits the row address RA of the received address <Ad02> to the row address register 2 (RR2), and transmits the column address CA of the received address <Ad02> to the column address register 0 (CR0). The input/output circuit 10 transmits the received command <30h> to the command register 2 (MR2) based on the address <Ad02>.

When the row address RA of the address <Ad02> is stored in the row address register 2 (RR2), the row address register 2 (RR2) transmits the row address RA to the row decoder 52C.

Upon receipt of the command <30h> from the command register 2 (MR2), the sequencer 30 in the chip 0 (CP0) initiates the normal read on the plane 2 (PL2). The sequencer 30 sets the signal CB02 to the busy state. The signal CB02 is stored in the status register 21. Upon completion of the normal read on the plane 2 (PL2) in the chip 0 (CP0), the sequencer 30 sets the signal CB02 to the ready state. This enables the plane 2 (PL2) in the chip 0 (CP0) to accept a subsequent command.

Next, the memory controller 300 executes the normal read on the plane 3 (PL3) in the chip 0 (CP0).

More specifically, after issuance of the command <00h>, the address <Ad02>, and the command <30h>, the memory controller 300 issues the command <00h>, the address <Ad03>, and the command <30h> in order to execute the normal read on the plane 3 (PL3) in the chip 0 (CP0).

In the chip 0 (CP0), the input/output circuit 10 receives the command <00h>, the address <Ad03>, and the command <30h> each issued by the memory controller 300. The input/output circuit 10 transmits the received command <00h> to the command register 3 (MR3) based on the address <Ad03>. The input/output circuit 10 transmits the row address RA of the received address <Ad03> to the row address register 3 (RR3), and transmits the column address CA of the received address <Ad03> to the column address register 1 (CR1). The input/output circuit 10 transmits the received command <30h> to the command register 3 (MR3) based on the address <Ad03>.

When the row address RA of the address <Ad03> is stored in the row address register 3 (RR3), the row address register 3 (RR3) transmits the row address RA to the row decoder 52D.

Upon receipt of the command <30h> from the command register 3 (MR3), the sequencer 30 in the chip 0 (CP0) initiates the normal read on the plane 3 (PL3). The sequencer 30 sets the signal CB03 to the busy state. The signal CB03 is stored in the status register 21. Upon completion of the normal read on the plane 3 (PL3) in the chip 0 (CP0), the sequencer 30 sets the signal CB03 to the ready state. This enables the plane 3 (PL3) in the chip 0 (CP0) to accept a subsequent command.

Next, as shown in FIG. 20, the memory controller 300 executes the status read on the plane 0 (PL0) in the chip 0 (CP0). The particulars of the aforementioned status read executed in response to the command <78h> and the address <Ad00> being issued after issuance of the command <00h>, the address <Ad03>, and the command <30h> are the same as those of the first embodiment.

Next, upon receipt of the signal CB00 indicative of the ready state from the status register 21, the memory controller 300 executes the cache read on the plane 0 (PL0) in the chip 0 (CP0).

More specifically, the memory controller 300 issues the command <00h>, the address <Ad00>, and the command <31h> in order to execute the cache read on the plane 0 (PL0) in the chip 0 (CP0).

In the chip 0 (CP0), the input/output circuit 10 receives the command <00h>, the address <Ad00>, and the command <31h> each issued by the memory controller 300. Thereafter, the cache read on the plane 0 (PL0) in the chip 0 (CP0) is initiated as with the normal read on the plane 0 (PL0) in the chip 0 (CP0) described above. The sequencer 30 in the chip 0 (CP0) sets the signal CB00 to the busy state.

Next, the memory controller 300 reserves the prefetch of read data in the normal read executed on the plane 0 (PL0) in the chip 0 (CP0).

More specifically, during a period in which the command <00h>, the address <Ad00>, and the command <31h> are issued and the cache read is executed (that is, a period in which the signal CB00 is in the busy state), the memory controller 300 issues the command <05h>, the address <Ad00>, and the command <E0h> in order to reserve the prefetch on the plane 0 (PL0) in the chip 0 (CP0).

In the chip 0 (CP0), the input/output circuit 10 receives the command <05h>, the address <Ad00>, and the command <E0h> each issued by the memory controller 300. The input/output circuit 10 transmits the received command <05h> to the command register 0 (MR0) based on the address <Ad00> and also copies the command <05h> to the command register 0' (MR0'). The input/output circuit 10 transmits the row address RA of the received address <Ad00> to the row address register 0 (RR0) and also copies the row address RA of the address <Ad00> to the row address register 0' (RR0'). The input/output circuit 10 transmits the column address CA of the received address <Ad00> to the column address register 0 (CR0) and also copies the column address CA of the address <Ad00> to the column address register 0' (CR0'). The input/output circuit 10 transmits the received command <E0h> to the command register 0 (MR0) based on the address <Ad00> and also copies the command <E0h> to the command register 0' (MR0').

When the row address RA of the address <Ad00> is copied to the row address register 0' (RR0'), the row address register 0' (RR0') transmits the row address RA to the row decoder 52A.

Upon receipt of the command <E0h> from the command register 0' (MR0'), the sequencer 30 in the chip 0 (CP0) reserves the prefetch on the plane 0 (PL0). The sequencer 30 then initiates the prefetch. Upon receipt of the command <E0h> with the signal CB00 being in the busy state, the sequencer 30 executes the prefetch on the plane 0 (PL0) in the chip 0 (CP0) during a period in which the signal CB00 is in the busy state. More specifically, upon receipt of the command <E0h> with the signal CB00 being in the busy state, the sequencer 30 executes the prefetch subsequently to the cache transfer.

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A and 55C. Based on a result of decoding the column address CA of the address <Ad00>, the column decoder 55A selects a corresponding latch circuit in the data register 54A. Data in the latch circuit selected in sequence is transmitted to the FIFO circuit 12A. Upon completion of the prefetch, the sequencer 30 sets the signal CB00 to the ready state.

Next, as shown in FIG. 20, the memory controller 300 executes the status read on the plane 1 (PL1) in the chip 0 (CP0). The particulars of the aforementioned status read executed in response to the command <78h> and the address <Ad01> being issued after issuance of the command <05h>, the address <Ad00>, and the command <E0h> are the same as those of the first embodiment.

Next, upon receipt of the signal CB01 indicative of the ready state from the status register 21, the memory controller 300 executes the cache read on the plane 1 (PL1) in the chip 0 (CP0).

More specifically, the memory controller 300 issues the command <00h>, the address <Ad01>, and the command <31h> in order to execute the cache read on the plane 1 (PL1) in the chip 0 (CP0).

In the chip 0 (CP0), the input/output circuit 10 receives the command <00h>, the address <Ad01>, and the command <31h> each issued by the memory controller 300. Thereafter, the cache read on the plane 1 (PL1) in the chip 0 (CP0) is initiated as with the normal read on the plane 1 (PL1) in the chip 0 (CP0) described above. The sequencer 30 in the chip 0 (CP0) sets the signal CB01 to the busy state.

Next, the memory controller 300 reserves the prefetch of read data in the normal read executed on the plane 1 (PL1) in the chip 0 (CP0).

More specifically, during a period in which the command <00h>, the address <Ad01>, and the command <31h> are issued and the cache read is executed (that is, a period in which the signal CB01 is in the busy state), the memory controller 300 issues the command <05h>, the address <Ad01>, and the command <E0h> in order to reserve the prefetch on the plane 1 (PL1) in the chip 0 (CP0).

In the chip 0 (CP0), the input/output circuit 10 receives the command <05h>, the address <Ad01>, and the command <E0h> each issued by the memory controller 300. The input/output circuit 10 transmits the received command <05h> to the command register 1 (MR1) based on the address <Ad01> and also copies the command <05h> to the command register 1' (MR1'). The input/output circuit 10 transmits the row address RA of the received address <Ad01> to the row address register 1 (RR1) and also copies the row address RA of the address <Ad01> to the row address register 1' (RR1'). The input/output circuit 10 transmits the column address CA of the received address <Ad01> to the column address register 1 (CR1) and also copies the column address CA of the address <Ad01> to the column address register 1' (CR1'). The input/output circuit 10 transmits the received command <E0h> to the command register 1 (MR1) based on the address <Ad01> and also copies the command <E0h> to the command register 1' (MR1').

When the row address RA of the address <Ad01> is copied to the row address register 1' (RR1'), the row address register 1' (RR1') transmits the row address RA to the row decoder 52B.

Upon receipt of the command <E0h> from the command register 1' (MR1'), the sequencer 30 in the chip 0 (CP0) reserves the prefetch on the plane 1 (PL1). The sequencer 30 then initiates the prefetch. Upon receipt of the command <E0h> with the signal CB01 being in the busy state, the sequencer 30 executes the prefetch on the plane 1 (PL1) in the chip 0 (CP0) during a period in which the signal CB01 is in the busy state. More specifically, upon receipt of the command <E0h> with the signal CB01 being in the busy state, the sequencer 30 executes the prefetch subsequently to the cache transfer.

Upon initiation of the prefetch, the sequencer 30 in the chip 0 (CP0) resets the counter value CNT of the column address counter circuit CC1' to 0. The column address register 1' (CR1') transmits the first to last column addresses CA to the column decoders 55B and 55D. Based on a result of decoding the column address CA of the address <Ad01>, the column decoder 55B selects a corresponding latch circuit in the data register 54B. Data in the latch circuit selected in sequence is transmitted to the FIFO circuit 12B. Upon completion of the prefetch, the sequencer 30 sets the signal CB01 to the ready state.

Next, as shown in FIG. 20, the memory controller 300 executes the status read on the plane 2 (PL2) in the chip 0 (CP0). The particulars of the aforementioned status read executed in response to the command <78h> and the address <Ad02> being issued after issuance of the command <05h>, the address <Ad01>, and the command <E0h> are the same as those of the first embodiment.

Next, upon receipt of the signal CB02 indicative of the ready state from the status register 21, the memory controller 300 executes the cache read on the plane 2 (PL2) in the chip 0 (CP0).

More specifically, the memory controller 300 issues the command <00h>, the address <Ad02>, and the command <31h> in order to execute the cache read on the plane 2 (PL2) in the chip 0 (CP0).

In the chip 0 (CP0), the input/output circuit 10 receives the command <00h>, the address <Ad02>, and the command <31h> each issued by the memory controller 300. Thereafter, the cache read on the plane 2 (PL2) in the chip 0 (CP0) is initiated as with the normal read on the plane 2 (PL2) in the chip 0 (CP0) described above. The sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

Figure 21:
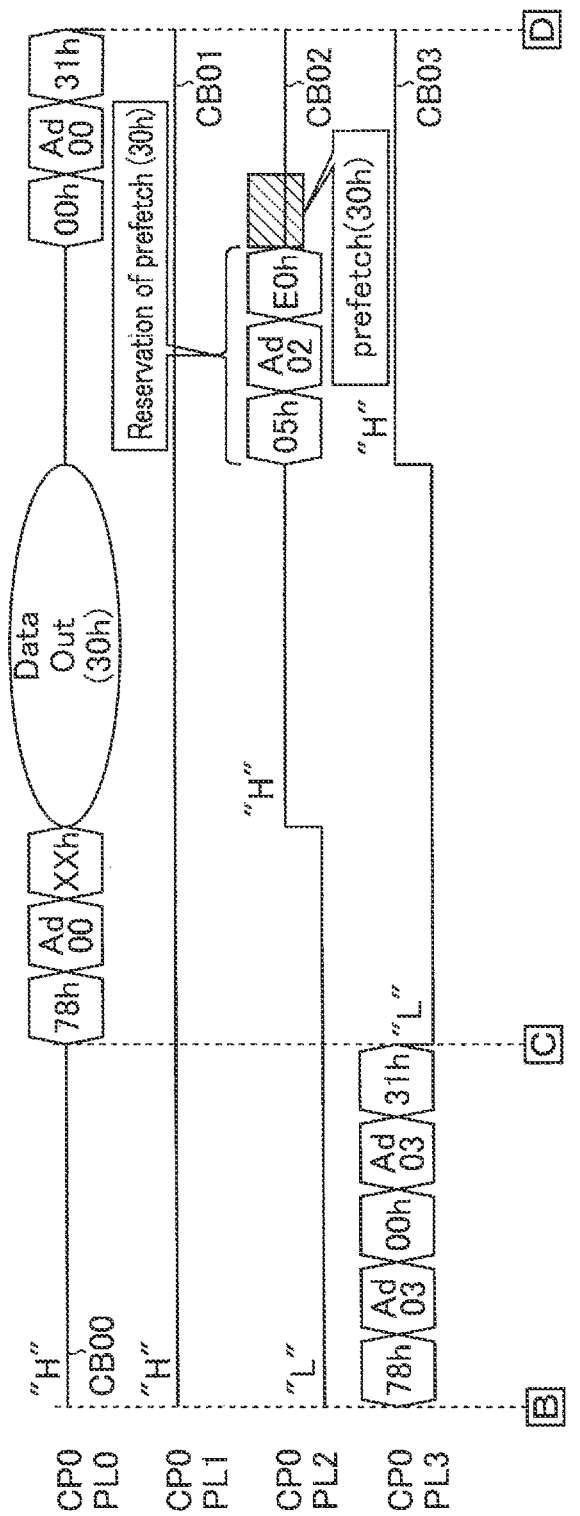
FIG. 21 is a diagram showing an example of the command sequence in the read operation of the memory system according to the second embodiment.

Next, as shown in FIG. 21, the memory controller 300 executes the status read on the plane 3 (PL3) in the chip 0 (CP0). The particulars of the aforementioned status read executed in response to the command <78h> and the address <Ad03> being issued after issuance of the command <00h>, the address <Ad02>, and the command <31h> are the same as those of the first embodiment.

Upon receipt of the signal CB03 indicative of the ready state from the status register 21, the memory controller 300 executes the cache read on the plane 3 (PL3) in the chip 0 (CP0).

More specifically, the memory controller 300 issues the command <00h>, the address <Ad03>, and the command <31h> in order to execute the cache read on the plane 3 (PL3) in the chip 0 (CP0).

In the chip 0 (CP0), the input/output circuit 10 receives the command <00h>, the address <Ad03>, and the command <31h> each issued by the memory controller 300. Thereafter, the cache read on the plane 3 (PL3) in the chip 0 (CP0) is initiated as with the normal read on the plane 3 (PL3) in the chip 0 (CP0) described above. The sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Next, as shown in FIG. 21, the memory controller 300 executes the status read on the plane 0 (PL0) in the chip 0 (CP0). The particulars of the aforementioned status read executed in response to the command <78h> and the address <Ad00> being issued after issuance of the command <00h>, the address <Ad03>, and the command <31h> are the same as those of the first embodiment.

Next, upon receipt of the signal CB00 indicative of the ready state from the status register 21, the memory controller 300 executes the data-out on the plane 0 (PL0) in the chip 0 (CP0). The particulars of the aforementioned data-out executed in response to issuance of the command <XXh> after the memory controller 300 receives the signal CB00 indicative of the ready state from the status register 21 (data-out on the plane 0 (PL0) on which the prefetch has been executed) are the same as those of the first embodiment.

Next, the memory controller 300 reserves the prefetch of read data in the normal read executed on the plane 2 (PL2) in the chip 0 (CP0).

More specifically, upon completion of the data-out on the plane 0 (PL0) in the chip 0 (CP0), the memory controller 300 issues the command <05h>, the address <Ad02>, and the command <E0h> in order to reserve the prefetch on the plane 2 (PL2) in the chip 0 (CP0).

In the chip 0 (CP0), the input/output circuit 10 receives the command <05h>, the address <Ad02>, and the command <E0h> each issued by the memory controller 300. The input/output circuit 10 transmits the received command <05h> to the command register 2 (MR2) based on the address <Ad02> and also copies the command <05h> to the command register 2' (MR2'). The input/output circuit 10 transmits the row address RA of the received address <Ad02> to the row address register 2 (RR2) and also copies the row address RA of the address <Ad02> to the row address register 2' (RR2'). The input/output circuit 10 transmits the column address CA of the received address <Ad02> to the column address register 0 (CR0) and also copies the column address CA of the address <Ad02> to the column address register 0' (CR0'). The input/output circuit 10 transmits the received command <E0h> to the command register 2 (MR2) based on the address <Ad02> and also copies the command <E0h> to the command register 2' (MR2').

When the row address RA of the address <Ad02> is copied to the row address register 2' (RR2'), the row address register 2' (RR2') transmits the row address RA to the row decoder 52C.

Upon receipt of the command <E0h> from the command register 2' (MR2'), the sequencer 30 in the chip 0 (CP0) reserves the prefetch on the plane 2 (PL2). The sequencer 30 then initiates the prefetch. Upon receipt of the command <E0h> with the signal CB02 being in the ready state, the sequencer 30 immediately executes the prefetch on the plane 2 (PL2) in the chip 0 (CP0).

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A and 55C. Based on a result of decoding the column address CA of the address <Ad02>, the column decoder 55C selects a corresponding latch circuit in the data register 54C. Data in the latch circuit selected in sequence is transmitted to the FIFO circuit 12A.

Next, the memory controller 300 executes the cache read on the plane 0 (PL0) in the chip 0 (CP0). The particulars of the aforementioned cache read executed in response to the command <00h>, the address <Ad00>, and the command <31h> being issued after issuance of the command <05h>, the address <Ad02>, and the command <E0h> are the same as those of the cache read on the plane 0 (PL0) in the chip 0 (CP0) described above. Upon initiation of the cache read, the sequencer 30 in the chip 0 (CP0) sets the signal CB00 to the busy state. Upon completion of the cache transfer on the plane 0 (PL0) in the chip 0 (CP0), the sequencer 30 sets the signal CB00 to the ready state.

Figure 22:
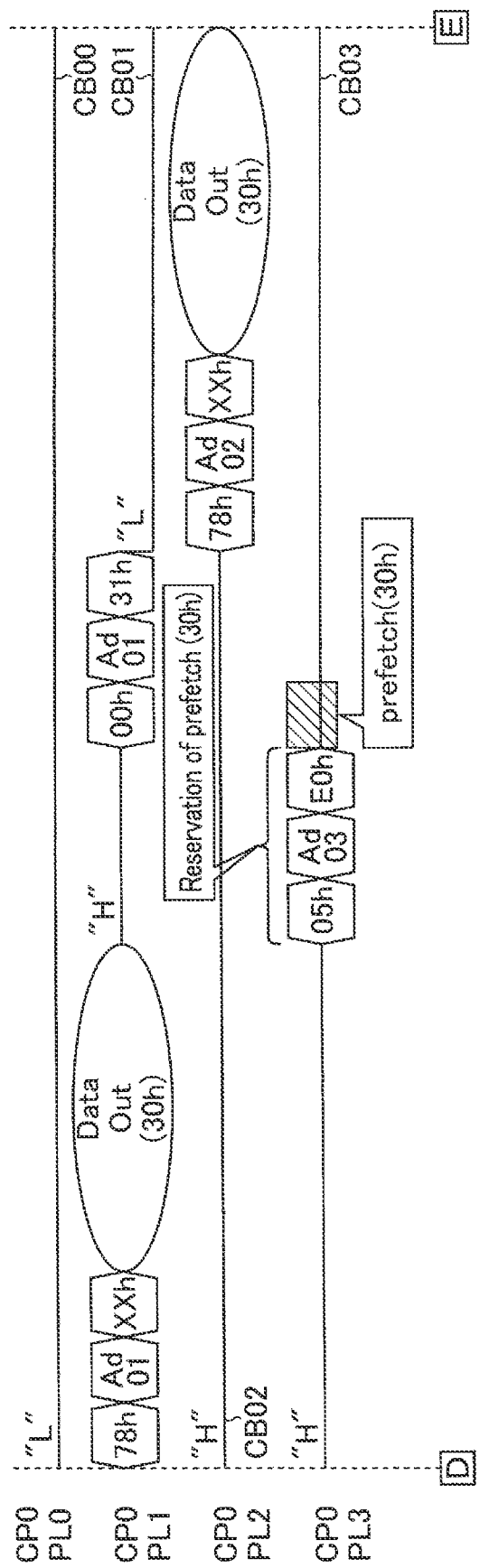
FIG. 22 is a diagram showing an example of the command sequence in the read operation of the memory system according to the second embodiment.

Next, as shown in FIG. 22, the memory controller 300 executes the status read on the plane 1 (PL1) in the chip 0 (CP0). The particulars of the aforementioned status read executed in response to the command <78h> and the address <Ad01> being issued after issuance of the command <00h>, the address <Ad00>, and the command <31h> are the same as those of the first embodiment.

Next, upon receipt of the signal CB01 indicative of the ready state from the status register 21, the memory controller 300 executes the data-out on the plane 1 (PL1) in the chip 0 (CP0). The particulars of the aforementioned data-out executed in response to issuance of the command <XXh> after the memory controller 300 receives the signal CB01 indicative of the ready state from the status register 21 (data-out on the plane 1 (PL1) on which the prefetch has been executed) are the same as those of the first embodiment.

Next, the memory controller 300 reserves the prefetch of read data in the normal read executed on the plane 3 (PL3) in the chip 0 (CP0).

More specifically, Upon completion of the data-out on the plane 1 (PL1) in the chip 0 (CP0), the memory controller 300 issues the command <05h>, the address <Ad03>, and the command <E0h> in order to reserve the prefetch on the plane 3 (PL3) in the chip 0 (CP0).

In the chip 0 (CP0), the input/output circuit 10 receives the command <05h>, the address <Ad03>, and the command <E0h> each issued by the memory controller 300. The input/output circuit 10 transmits the received command <05h> to the command register 3 (MR3) based on the address <Ad03> and also copies the command <05h> to the command register 3' (MR3'). The input/output circuit 10 transmits the row address RA of the received address <Ad03> to the row address register 3 (RR3) and also copies the row address RA of the address <Ad03> to the row address register 3' (RR3'). The input/output circuit 10 transmits the column address CA of the received address <Ad03> to the column address register 1 (CR1) and also copies the column address CA of the address <Ad03> to the column address register 1' (CR1'). The input/output circuit 10 transmits the received command <E0h> to the command register 3 (MR3) based on the address <Ad03> and also copies the command <E0h> to the command register 3' (MR3').

When the row address RA of the address <Ad03> is copied to the row address register 3' (RR3'), the row address register 3' (RR3') transmits the row address RA to the row decoder 52D.

Upon receipt of the command <E0h> from the command register 3' (MR3'), the sequencer 30 in the chip 0 (CP0)

reserves the prefetch on the plane 3 (PL3). The sequencer 30 then initiates the prefetch. Upon receipt of the command <E0h> with the signal CB03 being in the ready state, the sequencer 30 immediately executes the prefetch on the plane 3 (PL3) in the chip 0 (CP0).

Upon initiation of the prefetch, the sequencer 30 in the chip 0 (CP0) resets the counter value CNT of the column address counter circuit CC1' to 0. The column address register 1' (CR1') transmits the first to last column addresses CA to the column decoders 55B and 55D. Based on a result of decoding the column address CA of the address <Ad03>, the column decoder 55D selects a corresponding latch circuit in the data register 54D. Data in the latch circuit selected in sequence is transmitted to the FIFO circuit 12B.

Next, the memory controller 300 executes the cache read on the plane 1 (PL1) in the chip 0 (CP0). The particulars of the aforementioned cache read executed in response to the command <00h>, the address <Ad01>, and the command <31h> being issued after issuance of the command <05h>, the address <Ad03>, and the command <E0h> are the same as those of the cache read on the plane 1 (PL1) in the chip 0 (CP0) described above. Upon initiation of the cache read, the sequencer 30 in the chip 0 (CP0) sets the signal CB01 to the busy state. Upon completion of the cache transfer on the plane 1 (PL1) in the chip 0 (CP0), the sequencer 30 sets the signal CB01 to the ready state.

Next, as shown in FIG. 22, the memory controller 300 executes the status read on the plane 2 (PL2) in the chip 0 (CP0). The particulars of the aforementioned status read executed in response to the command <78h> and the address <Ad02> being issued after issuance of the command <00h>, the address <Ad01>, and the command <31h> are the same as those of the first embodiment.

Upon receipt of the signal CB02 indicative of the ready state from the status register 21, the memory controller 300 executes the data-out on the plane 2 (PL2) in the chip 0 (CP0). The particulars of the aforementioned data-out executed in response to issuance of the command <XXh> after the memory controller 300 receives the signal CB02 indicative of the ready state from the status register 21 (data-out on the plane 2 (PL2) on which the prefetch has been executed) are the same as those of the first embodiment.

Figure 23:
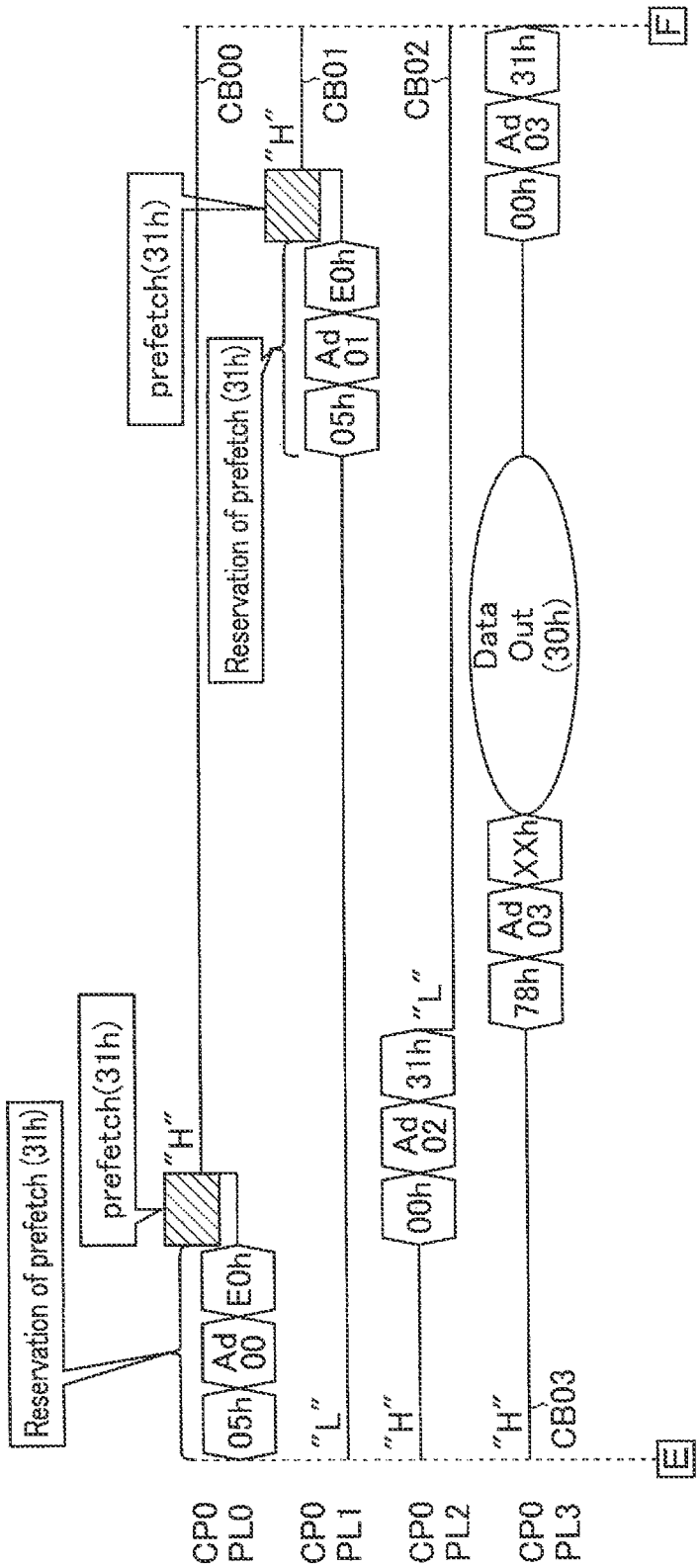
FIG. 23 is a diagram showing an example of the command sequence in the read operation of the memory system according to the second embodiment.

Next, as shown in FIG. 23, the memory controller 300 reserves the prefetch of read data in the cache read executed on the plane 0 (PL0) in the chip 0 (CP0).

More specifically, upon completion of the data-out on the plane 2 (PL2) in the chip 0 (CP0), the memory controller 300 issues the command <05h>, the address <Ad00>, and the command <E0h> in order to reserve the prefetch on the plane 0 (PL0) in the chip 0 (CP0).

In the chip 0 (CP0), the input/output circuit 10 receives the command <05h>, the address <Ad00>, and the command <E0h> each issued by the memory controller 300. Thereafter, the prefetch on the plane 0 (PL0) in the chip 0 (CP0) is reserved and initiated as with the reservation and execution of the prefetch on the plane 0 (PL0) in the chip 0 (CP0) described above. Upon receipt of the command <E0h> with the signal CB00 being in the busy state, the sequencer 30 in the chip 0 (CP0) executes the prefetch on the plane 0 (PL0) in the chip 0 (CP0) during a period in which the signal CB00 is in the busy state.

Next, the memory controller 300 executes the cache read on the plane 2 (PL2) in the chip 0 (CP0). The particulars of the aforementioned cache read executed in response to the command <00h>, the address <Ad02>, and the command <31h> being issued after issuance of the command <05h>, the address <Ad00>, and the command <E0h> are the same as those of the cache read on the plane 2 (PL2) in the chip 0 (CP0) described above. Upon initiation of the cache read, the sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

Next, as shown in FIG. 23, the memory controller 300 executes the status read on the plane 3 (PL3) in the chip 0 (CP0). The particulars of the aforementioned status read executed in response to the command <78h> and the address <Ad03> being issued after issuance of the command <00h>, the address <Ad02>, and the command <31h> are the same as those of the first embodiment.

Next, upon receipt of the signal CB03 indicative of the ready state from the status register 21, the memory controller 300 executes the data-out on the plane 3 (PL3) in the chip 0 (CP0). The particulars of the aforementioned data-out executed in response to issuance of the command <XXh> after the memory controller 300 receives the signal CB03 indicative of the ready state from the status register 21 (data-out on the plane 3 (PL3) on which the prefetch has been executed) are the same as those of the first embodiment.

Next, the memory controller 300 reserves the prefetch of read data in the cache read executed on the plane 1 (PL1) in the chip 0 (CP0).

More specifically, upon completion of the data-out on the plane 3 (PL3) in the chip 0 (CP0), the memory controller 300 issues the command <05h>, the address <Ad01>, and the command <E0h> in order to reserve the prefetch of the plane 1 (PL1) in the chip 0 (CP0).

In the chip 0 (CP0), the input/output circuit 10 receives the command <05h>, the address <Ad01>, and the command <E0h> each issued by the memory controller 300. Thereafter, the prefetch on the plane 1 (PL1) in the chip 0 (CP0) is reserved and initiated as with the reservation and execution of the prefetch on the plane 1 (PL1) in the chip 0 (CP0) described above. Upon receipt of the command <E0h> with the signal CB01 being in the busy state, the sequencer 30 in the chip 0 (CP0) executes the prefetch on the plane 1 (PL1) in the chip 0 (CP0) during a period in which the signal CB01 is in the busy state.

Next, the memory controller 300 executes the cache read on the plane 3 (PL3) in the chip 0 (CP0). The particulars of the aforementioned cache read executed in response to the command <00h>, the address <Ad03>, and the command <31h> being issued after issuance of the command <05h>, the address <Ad01>, and the command <E0h> are the same as those of the cache read on the plane 3 (PL3) in the chip 0 (CP0) described above. Upon initiation of the cache read, the sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Hereinafter, the command sequences corresponding to a period from C to F are repeated until all of data to be read in the planes 0 to 3 (PL0 to PL3) in the chip 0 (CP0) are data-out.

2.4 Advantageous Effect

With the configuration according to the present embodiment, as with the first embodiment, the prefetch can be reserved during the read operation, so that a period until initiation of the data-out can be shortened as compared to a case in which the prefetch is reserved after completion of the read operation. Accordingly, the speed of operations of the memory system can be enhanced.

3. Third Embodiment

The memory system 100 according to a third embodiment will be described. The memory system 100 according to the present embodiment corresponds to the memory system 100 according to the first embodiment modified by providing a bus switch BSW in the NAND chip 0 (CP0). Hereinafter, the following description will in principle concentrate on the features different from the first embodiment.

3.1 Configuration of Input/Output Circuit 10

A configuration of the input/output circuit 10 will be described with reference to FIG. 24. FIG. 24 is a block diagram showing a configuration of the NAND chip 0 (CP0) included in the memory system 100 according to the present embodiment, focusing on the input/output circuit 10 and the register 20. In FIG. 24, the status register 21 and the voltage generating circuit 40 are omitted.

The NAND chip 0 (CP0) includes the bus switch BSW. The bus switch BSW is coupled to the FIFO circuit 12. The bus switch BSW can be coupled to the data registers 54A to 54D. The bus switch BSW is configured in such a manner that one of the data registers 54A to 54D is selectively coupled thereto.

3.2 Overview of Data Flow

An overview of data flow in the read operation of the memory system 100 according to the present embodiment will be described with reference to FIG. 25. The following will describe an exemplary case in which n-bit data DAT is read from the memory cell arrays 51A to 51D to the data registers 54A to 54D, respectively. FIG. 25 omits a period in which the command CMD and the address ADD issued by the memory controller 300 are transmitted from the memory controller 300 to the DQ pad 11.

First, data DAT of n bits (hereinafter referred to as bits 1 to n, which respectively correspond to 1 to n in FIG. 25) is stored in the data register 54A in the plane 0 (PL0). The bits 1 to n each correspond, in order from the bit 1, to a count-up of the counter value CNT of the column address counter circuit CC0.

In this state, the bus switch BSW is coupled to the data register 54A. In the plane 0 (PL0), the prefetch is then initiated. The bits 1 to n are transferred in order from the bit 1 from the data register 54A to the FIFO circuit 12.

Data of the bits 1 to n transferred to the FIFO circuit 12 is data-out in order of transfer via the DQ pad 11.

Upon completion of the transfer of data from the data register 54A to the FIFO circuit 12, the bus switch BSW switches its coupling from the data register 54A to the data register 54B. In the plane 1 (PL1), the prefetch is then initiated. Data DAT of n bits stored in the data register 54B (hereinafter referred to as bits n+1 to 2n, which respectively correspond to n+1 to 2n in FIG. 25) is transferred in order from the bit n+1 from the data register 54B to the FIFO circuit 12.

Data of the bits n+1 to 2n transferred to the FIFO circuit 12 is data-out in order of transfer via the DQ pad 11.

Upon completion of the transfer of data from the data register 54B to the FIFO circuit 12, the bus switch BSW switches its coupling from the data register 54B to the data register 54C. In the plane 2 (PL2), the prefetch is then initiated. Data DAT of n bits stored in the data register 54C (hereinafter referred to as bits 2n+1 to 3n, which respectively correspond to 2n+1 to 3n in FIG. 25) is transferred in order from the bit 2n+1 from the data register 54C to the FIFO circuit 12.

Data of the bits 2n+1 to 3n transferred to the FIFO circuit 12 is data-out in order of transfer via the DQ pad 11.

Upon completion of the transfer of data from the data register 54C to the FIFO circuit 12, the bus switch BSW switches its coupling from the data register 54C to the data register 54D. In the plane 3 (PL3), the prefetch is then initiated. Data DAT of n bits stored in the data register 54D (hereinafter referred to as bits 3n+1 to 4n, which respectively correspond 3n+1 to 4n in FIG. 25) is transferred in order from the bit 3n+1 from the data register 54D to the FIFO circuit 12.

Data of the bits 3n+1 to 4n transferred to the FIFO circuit 12 is data-out in order of transfer via the DQ pad 11.

The configuration from the bus switch BSW to the FIFO circuit 12 may be composed of a wave pipeline and the FIFO circuit 12.

3.3 Operation

An operation of the memory system 100 according to the present embodiment will be described with reference to FIG. 26 to FIG. 29. FIG. 26 to FIG. 29 are each a diagram showing an example of a command sequence in the read operation of the memory system 100 according to the present embodiment. The following will describe an exemplary case in which the signals CEn1 and CEn2 are the same signal (CEn1=CEn2=CEn), and data is repeatedly read from the plane 0 to the plane 3 (PL0 to PL3) in this order in the chip 0 (CP0). FIG. 26 to FIG. 29 each also show the signals CB00 to CB03 of each of the planes in the chip 0 (CP0). The same applies to the case in which data is read from the chip 1 (CP1).

The read operation in the present embodiment corresponds to a multi-plane read. Throughout this description, the "multi-plane read" means an operation in which the data DAT are simultaneously read from the respective planes in a target chip.

First, as shown in FIG. 26, the memory controller 300 executes the normal read on the plane 0 (PL0) in the chip 0 (CP0).

More specifically, after setting the signal CEn to the "L" level, the memory controller 300 issues the command <00h>, the address <Ad00>, and a command <32h> in order to execute the normal read on the plane 0 (PL0) in the chip 0 (CP0). The command "32h" is a command for causing the normal read in the multi-plane read to execute.

In the chip 0 (CP0), the input/output circuit 10 receives the command <00h>, the address <Ad00>, and the command <32h> each issued by the memory controller 300. The input/output circuit 10 transmits the received command <00h> to the command register 0 (MR0) based on the address <Ad00>. The input/output circuit 10 transmits the row address RA of the received address <Ad00> to the row address register 0 (RR0), and transmits the column address CA of the received address <Ad00> to the column address register 0 (CR0). The input/output circuit 10 transmits the received command <32h> to the command register 0 (MR0) based on the address <Ad00>.

When the row address RA of the address <Ad00> is stored in the row address register 0 (RR0), the row address register 0 (RR0) transmits the row address RA to the row decoder 52A.

Next, the memory controller 300 executes the normal read on the plane 1 (PL1) in the chip 0 (CP0).

More specifically, after issuance of the command <00h>, the address <Ad00>, and the command <32h>, the memory controller 300 issues the command <00h>, the address <Ad01>, and the command <32h> in order to execute the normal read on the plane 1 (PL1) in the chip 0 (CP0).

In the chip 0 (CP0), the input/output circuit 10 receives the command <00h>, the address <Ad01>, and the command <32h> each issued by the memory controller 300. The input/output circuit 10 transmits the received command <00h> to the command register 1 (MR1) based on the address <Ad01>. The input/output circuit 10 transmits the row address RA of the received address <Ad01> to the row address register 1 (RR1), and transmits the column address CA of the received address <Ad01> to the column address register 0 (CR0). The input/output circuit 10 transmits the received command <32h> to the command register 1 (MR1) based on the address <Ad01>.

When the row address RA of the address <Ad01> is stored in the row address register 1 (RR1), the row address register 1 (RR1) transmits the row address RA to the row decoder 52B.

Next, the memory controller 300 executes the normal read on the plane 2 (PL2) in the chip 0 (CP0).

More specifically, after issuance of the command <00h>, the address <Ad01>, and the command <32h>, the memory controller 300 issues the command <00h>, the address <Ad02>, and the command <32h> in order to execute the normal read on the plane 2 (PL2) in the chip 0 (CP0).

In the chip 0 (CP0), the input/output circuit 10 receives the command <00h>, the address <Ad02>, and the command <32h> each issued by the memory controller 300. The input/output circuit 10 transmits the received command <00h> to the command register 2 (MR2) based on the address <Ad02>. The input/output circuit 10 transmits the row address RA of the received address <Ad02> to the row address register 2 (RR2), and transmits the column address CA of the received address <Ad02> to the column address register 0 (CR0). The input/output circuit 10 transmits the received command <32h> to the command register 2 (MR2) based on the address <Ad02>.

When the row address RA of the address <Ad02> is stored in the row address register 2 (RR2), the row address register 2 (RR2) transmits the row address RA to the row decoder 52C.

Next, the memory controller 300 executes the normal read on the plane 3 (PL3) in the chip 0 (CP0).

More specifically, after issuance of the command <00h>, the address <Ad02>, and the command <32h>, the memory controller 300 issues the command <00h>, the address <Ad03>, and the command <30h> in order to execute the normal read on the plane 3 (PL3) in the chip 0 (CP0).

In the chip 0 (CP0), the input/output circuit 10 receives the command <00h>, the address <Ad03>, and the command <30h> each issued by the memory controller 300. The input/output circuit 10 transmits the received command <00h> to the command register 3 (MR3) based on the address <Ad03>. The input/output circuit 10 transmits the row address RA of the received address <Ad03> to the row address register 3 (RR3), and transmits the column address CA of the received address <Ad03> to the column address register 0 (CR0). The input/output circuit 10 transmits the received command <30h> to the command register 3 (MR3) based on the address <Ad03>.

When the row address RA of the address <Ad03> is stored in the row address register 3 (RR3), the row address register 3 (RR3) transmits the row address RA to the row decoder 52D.

Upon receipt of the command <30h> from the command register 3 (MR3), the sequencer 30 in the chip 0 (CP0) initiates the normal read on the planes 0 to 3 (PL0 to PL3). The sequencer 30 sets the signals CB00 to CB03 to the busy state. The signals CB00 to CB03 are stored in the status register 21. Upon completion of the normal read on the planes 0 to 3 (PL0 to PL3) in the chip 0 (CP0), the sequencer 30 sets the signals CB00 to CB03 to the ready state.

Figure 27:
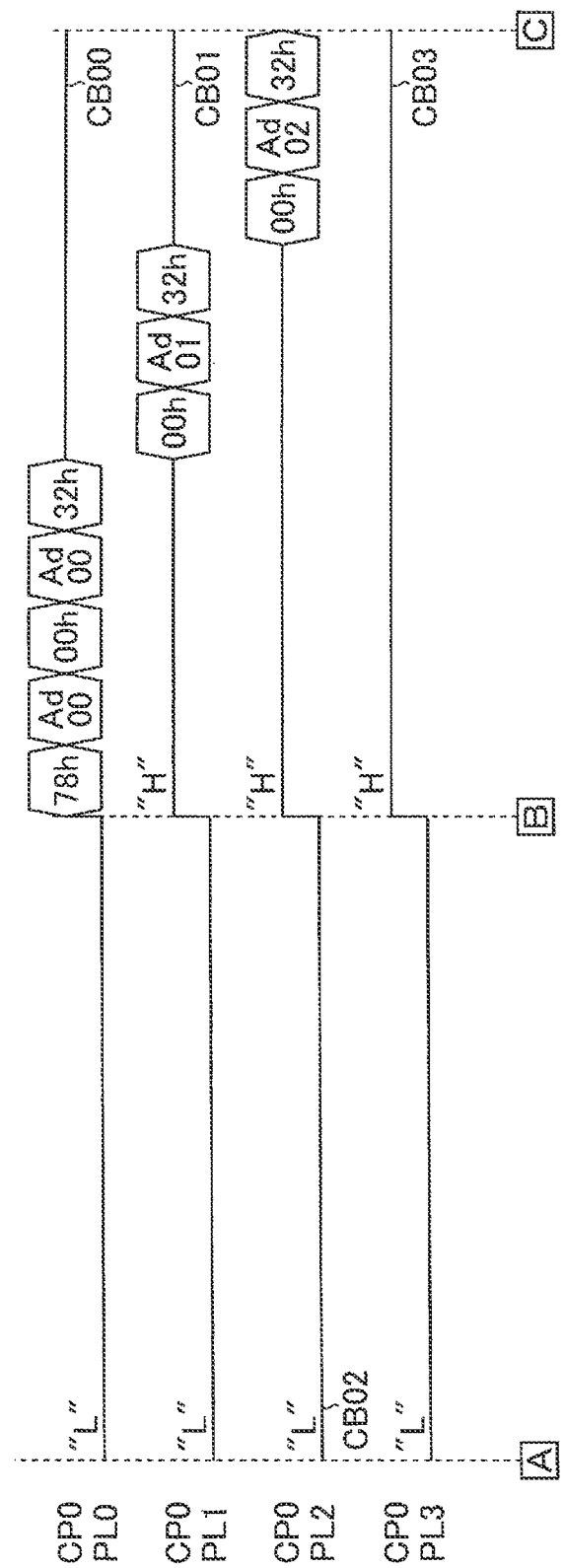
FIG. 27 is a diagram showing an example of the command sequence in the read operation of the memory system according to the third embodiment.

Next, as shown in FIG. 27, the memory controller 300 executes the status read on the plane 0 (PL0) in the chip 0 (CP0).

More specifically, the memory controller 300 issues the command <78h> and the address <Ad00> in order to execute the status read on the plane 0 (PL0) in the chip 0 (CP0).

The sequencer 30 in the chip 0 (CP0) transmits the status information STS on the signals CB00 to CB03 corresponding to the addresses <Ad00> to <Ad03> to the memory controller 300.

Next, upon receipt of signals CB00 to CB03 indicative of the ready state from the status register 21, the memory controller 300 executes the normal read on the plane 0 (PL0) in the chip 0 (CP0).

More specifically, the memory controller 300 issues the command <00h>, the address <Ad00>, and the command <32h> in order to execute the normal read on the plane 0 (PL0) in the chip 0 (CP0).

In the chip 0 (CP0), the input/output circuit 10 receives the command <00h>, the address <Ad00>, and the command <32h> each issued by the memory controller 300. Thereafter, as with the normal read on the plane 0 (PL0) in the chip 0 (CP0) described above, the command <00h> and the command <32h> are transmitted to the command register 0 (MR0), and the row address RA of the address <Ad00> is transmitted to the row decoder 52A via the row address register 0 (RR0).

Next, the memory controller 300 executes the normal read on the plane 1 (PL1) in the chip 0 (CP0).

More specifically, after issuance of the command <00h>, the address <Ad00>, and the command <32h>, the memory controller 300 issues the command <00h>, the address <Ad01>, and the command <32h> in order to execute the normal read on the plane 1 (PL1) in the chip 0 (CP0).

In the chip 0 (CP0), the input/output circuit 10 receives the command <00h>, the address <Ad01>, and the command <32h> each issued by the memory controller 300. Thereafter, as with the normal read on the plane 1 (PL1) in the chip 0 (CP0) described above, the command <00h> and the command <32h> are transmitted to the command register 1 (MR1), and the row address RA of the address <Ad01> is transmitted to the row decoder 52B via the row address register 1 (RR1).

Next, the memory controller 300 executes the normal read on the plane 2 (PL2) in the chip 0 (CP0).

More specifically, after issuance of the command <00h>, the address <Ad01>, and the command <32h>, the memory controller 300 issues the command <00h>, the address <Ad02>, and the command <32h> in order to execute the normal read on the plane 2 (PL2) in the chip 0 (CP0).

In the chip 0 (CP0), the input/output circuit 10 receives the command <00h>, the address <Ad02>, and the command <32h> each issued by the memory controller 300. Thereafter, as with the normal read on the plane 2 (PL2) in the chip 0 (CP0) described above, the command <00h> and the command <32h> are transmitted to the command register 2 (MR2), and the row address RA of the address <Ad02> is transmitted to the row decoder 52C via the row address register 2 (RR2).

Next, the memory controller 300 executes the cache read on the plane 3 (PL3) in the chip 0 (CP0).

More specifically, after issuance of the command <00h>, the address <Ad02>, and the command <32h>, the memory controller 300 issues the command <00h>, the address <Ad03>, and the command <31h> in order to execute the cache read on the plane 3 (PL3) in the chip 0 (CP0).

In the chip 0 (CP0), the input/output circuit 10 receives the command <00h>, the address <Ad03>, and the command <31h> each issued by the memory controller 300. Thereafter, as with the normal read on the plane 3 (PL3) in the chip 0 (CP0) described above, the command <00h> and the command <31h> are transmitted to the command register 3 (MR3), and the row address RA of the address <Ad03> is transmitted to the row decoder 52D via the row address register 3 (RR3).

Upon receipt of the command <31h> from the command register 3 (MR3), the sequencer 30 in the chip 0 (CP0) initiates the normal read on the planes 0 to 2 (PL0 to PL2), and initiates the cache read on the plane 3 (PL3) in the chip 0 (CP0). The sequencer 30 sets the signals CB00 to CB03 to the busy state.

Next, as shown in FIG. 28, the memory controller 300 reserves the prefetch of read data in the normal read executed on the plane 0 (PL0) in the chip 0 (CP0).

More specifically, during a period in which the command <00h>, the address <Ad03>, and the command <31h> are issued and the cache read is executed (that is, a period in which the signal CB00 is in the busy state), the memory controller 300 issues the command <05h>, the address <Ad00>, and the command <E0h> in order to reserve the prefetch on the plane 0 (PL0) in the chip 0 (CP0).

In the chip 0 (CP0), the input/output circuit 10 receives the command <05h>, the address <Ad00>, and the command <E0h> each issued by the memory controller 300. The input/output circuit 10 transmits the received command <05h> to the command register 0 (MR0) based on the address <Ad00> and also copies the command <05h> to the command register 0' (MR0'). The input/output circuit 10 transmits the row address RA of the received address <Ad00> to the row address register 0 (RR0) and also copies the row address RA of the address <Ad00> to the row address register 0' (RR0'). The input/output circuit 10 transmits the column address CA of the received address <Ad00> to the column address register 0 (CR0) and also copies the column address CA of the address <Ad00> to the column address register 0' (CR0'). The input/output circuit 10 transmits the received command <E0h> to the command register 0 (MR0) based on the address <Ad00> and also copies the command <E0h> to the command register 0' (MR0').

When the row address RA of the address <Ad00> is copied to the row address register 0' (RR0'), the row address register 0' (RR0') transmits the row address RA to the row decoder 52A.

Upon receipt of the command <E0h> from the command register 0' (MR0'), the sequencer 30 in the chip 0 (CP0) couples the bus switch BSW to the data register 54A and reserves the prefetch on the plane 0 (PL0). The sequencer 30 then initiates the prefetch. That is, transfer of data from the data register 54A to the FIFO circuit 12 is initiated. Upon receipt of the command <E0h> with the signal CB00 being in the busy state, the sequencer 30 executes the prefetch on the plane 0 (PL0) in the chip 0 (CP0) during a period in which the signal CB00 is in the busy state. More specifically, upon receipt of the command <E0h> with the signal CB00 being in the busy state, the sequencer 30 executes the prefetch subsequently to the cache transfer.

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A to 55D. Based on a result of decoding the column address CA of the address <Ad00>, the column decoder 55A selects a corresponding latch circuit in the data register 54A. Data in the latch circuit selected in sequence is transmitted to the FIFO circuit 12.

Next, as shown in FIG. 28, the memory controller 300 executes the status read on the plane 0 (PL0) in the chip 0 (CP0). The particulars of the aforementioned status read executed in response to the command <78h> and the address <Ad00> being issued after issuance of the command <05h>, the address <Ad00>, and the command <E0h> are the same as those of the status read on the plane 0 (PL0) in the chip 0 (CP0) described above.

Next, upon receipt of the signals CB00 to CB03 indicative of the ready state from the status register 21, the memory controller 300 executes the data-out on the plane 0 (PL0) in the chip 0 (CP0).

More specifically, the memory controller 300 issues a command <YYh> in order to execute the data-out on the plane 0 (PL0) in the chip 0 (CP0). The command "YYh" is a command for selecting a chip and a plurality of planes in the chip and causing the data-out to execute.

In the chip 0 (CP0), the input/output circuit 10 receives the command <YYh> issued by the memory controller 300. The input/output circuit 10 transmits the received command <YYh> to the command register 0 (MR0).

Upon receipt of the command <YYh> from the command register 0 (MR0), the sequencer 30 in the chip 0 (CP0) initiates the data-out on the plane 0 (PL0) on which the prefetch has been executed.

On the plane 0 (PL0) in the chip 0 (CP0), upon completion of transfer of data from the data register 54A to the FIFO circuit 12, the sequencer 30 in the chip 0 (CP0) couples the bus switch BSW to the data register 54B, as shown in FIG. 24, FIG. 25, and FIG. 28. When the coupling of the bus switch BSW is switched to the data register 54B in a course of the data-out on the plane 0 (PL0) in the chip 0 (CP0), the sequencer 30 initiates the prefetch on the plane 1 (PL1) in the chip 0 (CP0). That is, transfer of data from the data register 54B to the FIFO circuit 12 is initiated.

Next, the memory controller 300 executes the data-out on the plane 1 (PL1) in the chip 0 (CP0).

More specifically, upon completion of the data-out on the plane 0 (PL0) in the chip 0 (CP0), the sequencer 30 in the chip 0 (CP0) initiates the data-out on the plane 1 (PL1) on which the prefetch has been executed.

In the plane 1 (PL1) in the chip 0 (CP0), upon completion of transfer of data from the data register 54B to the FIFO circuit 12, the sequencer 30 in the chip 0 (CP0) couples the bus switch BSW to the data register 54C, as shown in FIG. 24, FIG. 25, and FIG. 29. When the coupling of the bus switch BSW is switched to the data register 54C in a course of the data-out on the plane 1 (PL1) in the chip 0 (CP0), the sequencer 30 initiates the prefetch on the plane 2 (PL2) in the chip 0 (CP0). That is, transfer of data from the data register 54C to the FIFO circuit 12 is initiated.

Next, the memory controller 300 executes the data-out on the plane 2 (PL2) in the chip 0 (CP0).

More specifically, upon completion of the data-out on the plane 1 (PL1) in the chip 0 (CP0), the sequencer 30 in the chip 0 (CP0) initiates the data-out on the plane 2 (PL2) on which the prefetch has been executed.

In the plane 2 (PL2) in the chip 0 (CP0), upon completion of transfer of data from the data register 54C to the FIFO circuit 12, the sequencer 30 in the chip 0 (CP0) couples the bus switch BSW to the data register 54D, as shown in FIG. 24, FIG. 25, and FIG. 29. When the coupling of the bus switch BSW is switched to the data register 54D in a course of the data-out on the plane 2 (PL2) in the chip 0 (CP0), the sequencer 30 initiates the prefetch on the plane 3 (PL3) in the chip 0 (CP0). That is, transfer of data from the data register 54D to the FIFO circuit 12 is initiated.

As described above, in the present embodiment, the prefetch of the plane p+1 can be executed during a period in which the data-out on the plane p (where p is an integer ranging from 0 to 2) in the chip 0 (CP0) is executed.

Next, the memory controller 300 executes the data-out on the plane 3 (PL3) in the chip 0 (CP0).

More specifically, upon completion of the data-out on the plane 2 (PL2) in the chip 0 (CP0), the sequencer 30 in the chip 0 (CP0) initiates the data-out on the plane 3 (PL3) on which the prefetch has been executed.

Upon completion of the data-out on the plane 3 (PL3) in the chip 0 (CP0), the command sequences corresponding to a period from B to E are repeated until all of data to be read in the planes 0 to 3 (PL0 to PL3) in the chip 0 (CP0) are data-out.

3.4 Advantageous Effect

With the configuration according to the present embodiment, as with the first embodiment, the prefetch can be reserved during the read operation, so that a period until initiation of the data-out can be shortened as compared to a case in which the prefetch is reserved after completion of the read operation. Furthermore, the prefetch on the plane p+1 can be executed during a period in which the data-out on the plane p in a chip is executed. Therefore, a period until initiation of the data-out on the plane p+1 can be shortened by a period in which the data-out on the plane p and the prefetch on the plane p+1 are overlapped. Accordingly, the speed of operations of the memory system can be enhanced.

4. Fourth Embodiment

The memory system 100 according to a fourth embodiment will be described. The memory system 100 according to the present embodiment corresponds to the memory system 100 according to the first embodiment modified by providing one column address register inside the address register 22. Hereinafter, the following description will in principle concentrate on the features different from the first embodiment.

4.1 Configuration of Register 20

A configuration of the register 20 will be described with reference to FIG. 30. FIG. 30 is a block diagram showing a configuration of the NAND chip 0 (CP0) included in the memory system 100 according to the present embodiment, focusing on the input/output circuit 10 and the register 20. In FIG. 30, the status register 21 and the voltage generating circuit 40 are omitted.

As shown in FIG. 30, the address register 22 has the same configuration as the configuration in which the column address register 0' (CR0') is omitted from the address register 22 illustrated in FIG. 6 according to the first embodiment.

4.2 Operation

An operation of the memory system 100 according to the present embodiment will be described with reference to FIG. 31 to FIG. 35. FIG. 31 to FIG. 35 are each a diagram showing an example of a command sequence in the read operation of the memory system 100 according to the present embodiment. The following will describe an exemplary case in which the signals CEn1 and CEn2 are the same signal (CEn1=CEn2=CEn), and data is repeatedly read from the plane 0 to the plane 3 (PL0 to PL3) in this order in the chip 0 (CP0). FIG. 31 to FIG. 35 each also show the signals CB00 to CB03 of each of the planes in the chip 0 (CP0). The same applies to the case in which data is read from the chip 1 (CP1). The read operation in the present embodiment corresponds to the single plane read.

First, the memory controller 300 executes the normal read in order of the planes 0 to 3 (PL0 to PL3) in the chip 0 (CP0). The command sequence and the signals CB00 to CB03 during a period from when the memory controller 300 sets the signal CEn to the "L" level to when the normal read is executed on the plane 3 (PL3) in the chip 0 (CP0) are the same as those during a period until A shown in FIG. 19 according to the second embodiment. During this period, the input/output circuit 10 transmits the address CA of the received address <Ad01> to the column address register 0 (CR0). The input/output circuit 10 transmits the column address CA of the received address <Ad03> to the column address register 0 (CR0). The rest of the operation in this period is the same as that of the second embodiment.

Next, as shown in FIG. 31, the memory controller 300 executes the status read on the plane 0 (PL0) in the chip 0 (CP0). The particulars of the aforementioned status read executed in response to the command <78h> and the address <Ad00> being issued after issuance of the command <00h>, the address <Ad03>, and the command <30h> are the same as those of the first embodiment.

Upon receipt of the signal CB00 indicative of the ready state from the status register 21, the memory controller 300 executes the cache read on the plane 0 (PL0) in the chip 0 (CP0). The particulars of the aforementioned cache read executed in response to issuance of the command <00h>, the address <Ad00>, the command <31h> after the memory controller 300 receives the signal CB00 indicative of the ready state from the status register 21 are the same as those of the first embodiment. Upon initiation of the cache read, the sequencer 30 in the chip 0 (CP0) sets the signal CB00 to the busy state. Upon completion of the cache transfer on the plane 0 (PL0) in the chip 0 (CP0), the sequencer 30 sets the signal CB00 to the ready state.

Next, the memory controller 300 executes the status read on the plane 1 (PL1) in the chip 0 (CP0). The particulars of the aforementioned status read executed in response to the command <78h> and the address <Ad01> being issued after issuance of the command <00h>, the address <Ad00>, and the command <31h> are the same as those of the first embodiment.

Upon receipt of the signal CB01 indicative of the ready state from the status register 21, the memory controller 300 executes the cache read on the plane 1 (PL1) in the chip 0 (CP0). The particulars of the aforementioned cache read executed in response to issuance of the command <00h>, the address <Ad01>, and the command <31h> after the memory controller 300 receives the signal CB01 indicative of the ready state from the status register 21 are the same as those of the first embodiment. Upon initiation of the cache read, the sequencer 30 in the chip 0 (CP0) sets the signal CB01 to the busy state. Upon completion of the cache transfer on the plane 1 (PL1) in the chip 0 (CP0), the sequencer 30 sets the signal CB01 to the ready state.

Next, the memory controller 300 executes the status read on the plane 2 (PL2) in the chip 0 (CP0). The particulars of the aforementioned status read executed in response to the command <78h> and the address <Ad02> being issued after issuance of the command <00h>, the address <Ad01>, and the command <31h> are the same as those of the first embodiment.

Upon receipt of the signal CB02 indicative of the ready state from the status register 21, the memory controller 300 executes the cache read on the plane 2 (PL2) in the chip 0 (CP0). The particulars of the aforementioned cache read executed in response to issuance of the command <00h>, the address <Ad02>, and the command <31h> after the memory controller 300 receives the signal CB02 indicative of the ready state from the status register 21 are the same as those of the first embodiment. Upon initiation of the cache read, the sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

Next, the memory controller 300 executes the status read on the plane 3 (PL3) in the chip 0 (CP0). The particulars of the aforementioned status read executed in response to the command <78h> and the address <Ad03> being issued after issuance of the command <00h>, the address <Ad02>, and the command <31h> are the same as those of the first embodiment.

Upon receipt of the signal CB03 indicative of the ready state from the status register 21, the memory controller 300 executes the cache read on the plane 3 (PL3) in the chip 0 (CP0). The particulars of the aforementioned cache read executed in response to issuance of the command <00h>, the address <Ad03>, and the command <31h> after the memory controller 300 receives the signal CB03 indicative of the ready state from the status register 21 are the same as those of the first embodiment. Upon initiation of the cache read, the sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Figure 32:
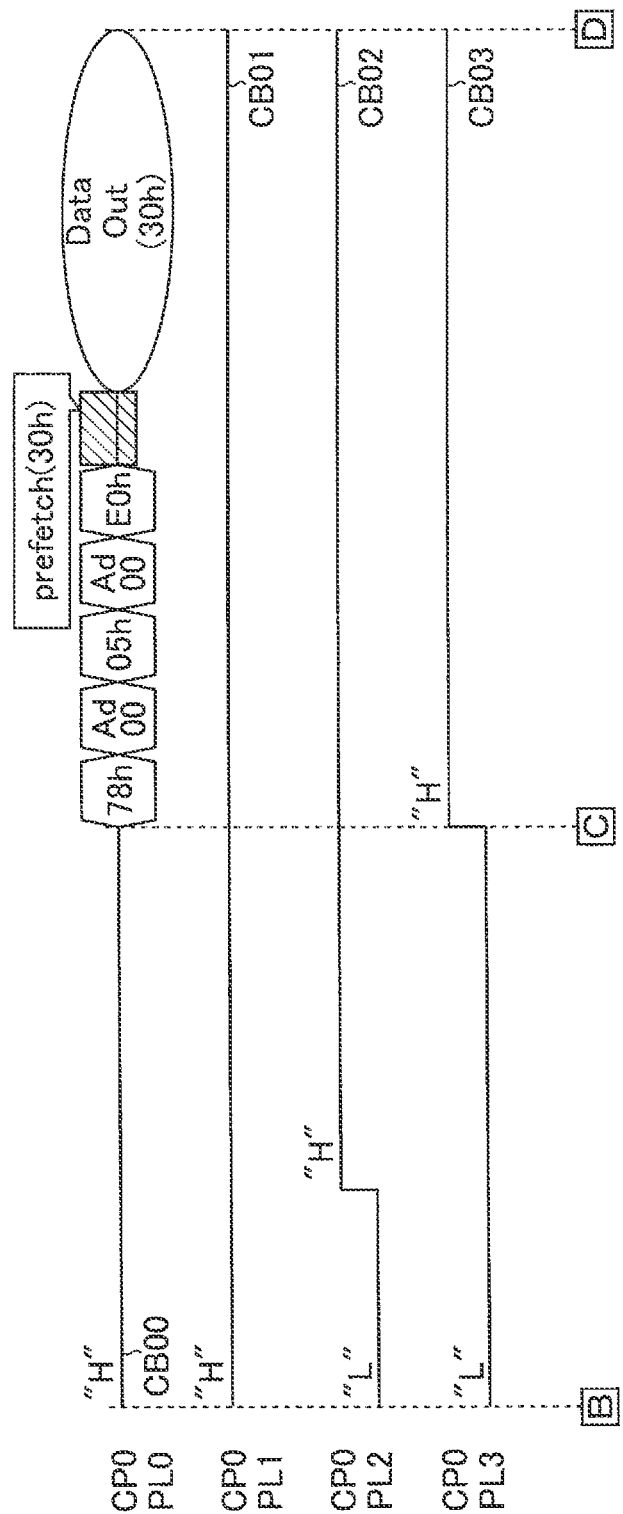
FIG. 32 is a diagram showing an example of the command sequence in the read operation of the memory system according to the fourth embodiment.

Next, as shown in FIG. 32, the memory controller 300 executes the status read on the plane 0 (PL0) in the chip 0 (CP0). The particulars of the aforementioned status read executed in response to the command <78h> and the address <Ad00> being issued after issuance of the command <00h>, the address <Ad03>, and the command <31h> are the same as those of the first embodiment.

Next, upon receipt of the signal CB00 indicative of the ready state from the status register 21, the memory controller 300 executes the prefetch on the plane 0 (PL0) in the chip 0 (CP0).

More specifically, the memory controller 300 issues the command <05h>, the address <Ad00>, and the command <E0h> in order to execute the prefetch on the plane 0 (PL0) in the chip 0 (CP0).

In the chip 0 (CP0), the input/output circuit 10 receives the command <05h>, the address <Ad00>, and the command <E0h> each issued by the memory controller 300. The input/output circuit 10 transmits the received command <05h> to the command register 0 (MR0) based on the address <Ad00>. The input/output circuit 10 transmits the row address RA of the received address <Ad00> to the row address register 0 (RR0). The input/output circuit 10 transmits the column address CA of the received address <Ad00> to the column address register 0 (CR0). The input/output circuit 10 transmits the received command <E0h> to the command register 0 (MR0) based on the address <Ad00>.

When the row address RA of the address <Ad00> is stored in the row address register 0 (RR0), the row address register 0 (RR0) transmits the row address RA to the row decoder 52A.

Upon receipt of the command <E0h> from the command register 0 (MR0), the sequencer 30 in the chip 0 (CP0) initiates the prefetch on the plane 0 (PL0). Upon receipt of the command <E0h> with the signal CB00 being in the ready state, the sequencer 30 immediately executes the prefetch on the plane 0 (PL0) in the chip 0 (CP0). More specifically, the sequencer 30 resets the counter value CNT of the column address counter circuit CC0 to 0. The column address register 0 (CR0) transmits the first to last column addresses CA to the column decoders 55A to 55D. Based on a result of decoding the column address CA of the address <Ad00>, the column decoder 55A selects a corresponding latch circuit in the data register 54A. Data in the latch circuit selected in sequence is transmitted to the FIFO circuit 12.

Next, the memory controller 300 executes the data-out on the plane 0 (PL0) in the chip 0 (CP0).

More specifically, upon completion of the prefetch on the plane 0 (PL0) in the chip 0 (CP0), the sequencer 30 in the chip 0 (CP0) initiates the data-out on the plane 0 (PL0) on which the prefetch has been executed.

Figure 33:
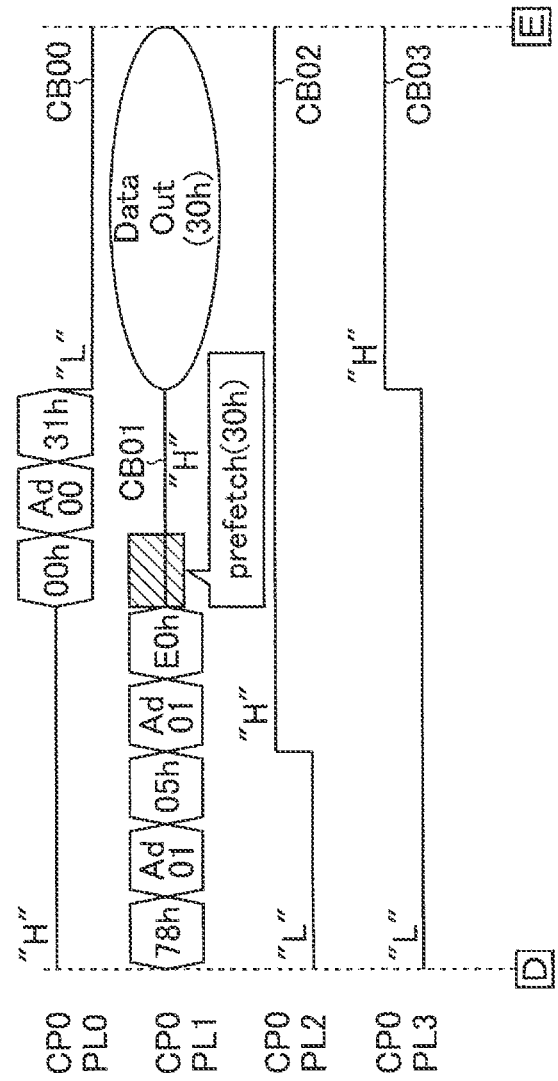
FIG. 33 is a diagram showing an example of the command sequence in the read operation of the memory system according to the fourth embodiment.

Next, as shown in FIG. 33, the memory controller 300 executes the status read on the plane 1 (PL1) in the chip 0 (CP0). The particulars of the aforementioned status read executed in response to the command <78h> and the address <Ad01> being issued after completion of the data-out on the plane 0 (PL0) in the chip 0 (CP0) are the same as those of the first embodiment.

Next, upon receipt of the signal CB01 indicative of the ready state from the status register 21, the memory controller 300 executes the prefetch on the plane 1 (PL1) in the chip 0 (CP0).

More specifically, the memory controller 300 issues the command <05h>, the address <Ad01>, and the command <E0h> in order to execute the prefetch on the plane 1 (PL1) in the chip 0 (CP0).

In the chip 0 (CP0), the input/output circuit 10 receives the command <05h>, the address <Ad01>, and the command <E0h> each issued by the memory controller 300. The input/output circuit 10 transmits the received command <05h> to the command register 1 (MR1) based on the address <Ad01>. The input/output circuit 10 transmits the row address RA of the received address <Ad01> to the row address register 1 (RR1). The input/output circuit 10 transmits the column address CA of the received address <Ad01> to the column address register 0 (CR0). The input/output circuit 10 transmits the received command <E0h> to the command register 1 (MR1) based on the address <Ad01>.

When the row address RA of the address <Ad01> is stored in the row address register 1 (RR1), the row address register 1 (RR1) transmits the row address RA to the row decoder 52B.

Upon receipt of the command <E0h> from the command register 1 (MR1), the sequencer 30 in the chip 0 (CP0) initiates the prefetch on the plane 1 (PL1). Upon receipt of the command <E0h> with the signal CB01 being in the ready state, the sequencer 30 immediately executes the prefetch on the plane 1 (PL1) in the chip 0 (CP0). More specifically, the sequencer 30 resets the counter value CNT of the column address counter circuit CC0 to 0. The column address register 0 (CR0) transmits the first to last column addresses CA to the column decoders 55A to 55D. Based on a result of decoding the column address CA of the address <Ad01>, the column decoder 55B selects a corresponding latch circuit in the data register 54B. Data in the latch circuit selected in sequence is transmitted to the FIFO circuit 12.

Next, the memory controller 300 executes the cache read on the plane 0 (PL0) in the chip 0 (CP0). The particulars of the aforementioned cache read executed in response to the command <00h>, the address <Ad00>, and the command <31h> being issued after issuance of the command <05h>, the address <Ad01>, and the command <E0h> are the same as those of the first embodiment. Upon initiation of the cache read, the sequencer 30 in the chip 0 (CP0) sets the signal CB00 to the busy state. Upon completion of the cache transfer on the plane 0 (PL0) in the chip 0 (CP0), the sequencer 30 sets the signal CB00 to the ready state.

Next, the memory controller 300 executes the data-out on the plane 1 (PL1) in the chip 0 (CP0).

More specifically, when the command <00h>, the address <Ad00>, and the command <31h> is issued and the prefetch on the plane 1 (PL1) in the chip 0 (CP0) is completed, the sequencer 30 in the chip 0 (CP0) initiates the data-out on the plane 1 (PL1) on which the prefetch has been executed.

Figure 34:
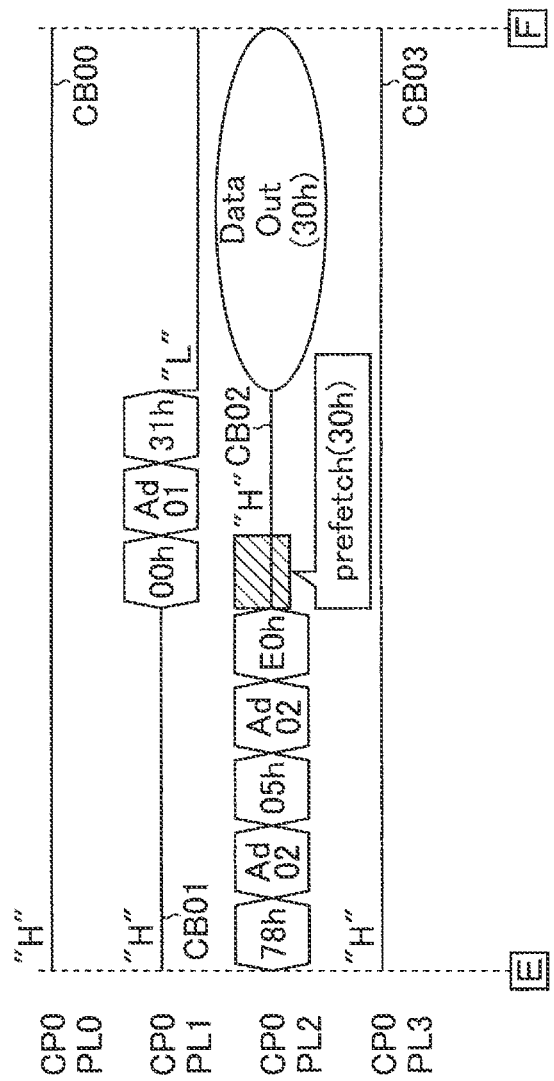
FIG. 34 is a diagram showing an example of the command sequence in the read operation of the memory system according to the fourth embodiment.

Next, as shown in FIG. 34, the memory controller 300 executes the status read on the plane 2 (PL2) in the chip 0 (CP0). The particulars of the aforementioned status read executed in response to the command <78h> and the address <Ad02> being issued after completion of the data-out on the plane 1 (PL1) in the chip 0 (CP0) are the same as those of the first embodiment.

Next, upon receipt of the signal CB02 indicative of the ready state from the status register 21, the memory controller 300 executes the prefetch on the plane 2 (PL2) in the chip 0 (CP0).

More specifically, the memory controller 300 issues the command <05h>, the address <Ad02>, and the command <E0h> in order to execute the prefetch on the plane 2 (PL2) in the chip 0 (CP0).

In the chip 0 (CP0), the input/output circuit 10 receives the command <05h>, the address <Ad02>, and the command <E0h> each issued by the memory controller 300. The input/output circuit 10 transmits the received command <05h> to the command register 2 (MR2) based on the address <Ad02>. The input/output circuit 10 transmits the row address RA of the received address <Ad02> to the row address register 2 (RR2). The input/output circuit 10 transmits the column address CA of the received address <Ad02> to the column address register 0 (CR0). The input/output circuit 10 transmits the received command <E0h> to the command register 2 (MR2) based on the address <Ad02>.

When the row address RA of the address <Ad02> is stored in the row address register 2 (RR2), the row address register 2 (RR2) transmits the row address RA to the row decoder 52C.

Upon receipt of the command <E0h> from the command register 2 (MR2), the sequencer 30 in the chip 0 (CP0) initiates the prefetch on the plane 2 (PL2). Upon receipt of the command <E0h> with the signal CB02 being in the ready state, the sequencer 30 immediately executes the prefetch on the plane 2 (PL2) in the chip 0 (CP0). More specifically, upon initiation of the prefetch, the sequencer 30 resets the counter value CNT of the column address counter circuit CC0 to 0. The column address register 0 (CR0) transmits the first to last column addresses CA to the column decoders 55A to 55D. Based on a result of decoding the column address CA of the address <Ad02>, the column decoder 55C selects a corresponding latch circuit in the data register 54C. Data in the latch circuit selected in sequence is transmitted to the FIFO circuit 12.

Next, the memory controller 300 executes the cache read on the plane 1 (PL1) in the chip 0 (CP0). The particulars of the aforementioned cache read executed in response to the command <00h>, the address <Ad01>, and the command <31h> being issued after issuance of the command <05h>, the address <Ad02>, and the command <E0h> are the same as those of the first embodiment. Upon initiation of the cache read, the sequencer 30 in the chip 0 (CP0) sets the signal CB01 to the busy state. Upon completion of the cache transfer on the plane 1 (PL1) in the chip 0 (CP0), the sequencer 30 sets the signal CB01 to the ready state.

Next, the memory controller 300 executes the data-out on the plane 2 (PL2) in the chip 0 (CP0).

More specifically, when the command <00h>, the address <Ad01>, and the command <31h> is issued and the prefetch on the plane 2 (PL2) in the chip 0 (CP0) is completed, the sequencer 30 in the chip 0 (CP0) initiates the data-out on the plane 2 (PL2) on which the prefetch has been executed.

Next, as shown in FIG. 35, the memory controller 300 executes the status read on the plane 3 (PL3) in the chip 0 (CP0). The particulars of the aforementioned status read executed in response to the command <78h> and the address <Ad03> being issued after completion of the data-out on the plane 2 (PL2) in the chip 0 (CP0) are the same as those of the first embodiment.

Next, upon receipt of the signal CB03 indicative of the ready state from the status register 21, the memory controller 300 executes the prefetch on the plane 3 (PL3) in the chip 0 (CP0).

More specifically, the memory controller 300 issues the command <05h>, the address <Ad03>, and the command <E0h> in order to execute the prefetch on the plane 3 (PL3) in the chip 0 (CP0).

In the chip 0 (CP0), the input/output circuit 10 receives the command <05h>, the address <Ad03>, and the command <E0h> each issued by the memory controller 300. The input/output circuit 10 transmits the received command <05h> to the command register 3 (MR3) based on the address <Ad03>. The input/output circuit 10 transmits the row address RA of the received address <Ad03> to the row address register 3 (RR3). The input/output circuit 10 transmits the column address CA of the received address <Ad03> to the column address register 0 (CR0). The input/output circuit 10 transmits the received command <E0h> to the command register 3 (MR3) based on the address <Ad03>.

When the row address RA of the address <Ad03> is stored in the row address register 3 (RR3), the row address register 3 (RR3) transmits the row address RA to the row decoder 52D.

Upon receipt of the command <E0h> from the command register 3 (MR3), the sequencer 30 in the chip 0 (CP0) initiates the prefetch on the plane 3 (PL3). Upon receipt of the command <E0h> with the signal CB03 being in the ready state, the sequencer 30 immediately executes the prefetch on the plane 3 (PL3) in the chip 0 (CP0). More specifically, upon initiation of the prefetch, the sequencer 30 resets the counter value CNT of the column address counter circuit CC0 to 0. The column address register 0 (CR0) transmits the first to last column addresses CA to the column decoders 55A to 55D. Based on a result of decoding the column address CA of the address <Ad03>, the column decoder 55D selects a corresponding latch circuit in the data register 54D. Data in the latch circuit selected in sequence is transmitted to the FIFO circuit 12.

Next, the memory controller 300 executes the cache read on the plane 2 (PL2) in the chip 0 (CP0). The particulars of the aforementioned cache read executed in response to the command <00h>, the address <Ad02>, and the command <31h> being issued after issuance of the command <05h>, the address <Ad03>, and the command <E0h> are the same as those of the first embodiment. Upon initiation of the cache read, the sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

As described above, in the present embodiment, the prefetch on the plane q+1 can be executed during a period in which the memory controller 300 transmits the command <00h>, an address <Ad0q>, and the command <31h> on a plane q (where q is an integer ranging from 0 to 2) in the chip 0 (CP0).

Next, the memory controller 300 executes the data-out on the plane 3 (PL3) in the chip 0 (CP0).

More specifically, when the command <00h>, the address <Ad02>, and the command <31h> is issued and the prefetch on the plane 3 (PL3) in the chip 0 (CP0) is completed, the sequencer 30 in the chip 0 (CP0) initiates the data-out on the plane 3 (PL3) on which the prefetch has been executed.

Next, the memory controller 300 executes the cache read on the plane 3 (PL3) in the chip 0 (CP0). The particulars of the aforementioned cache read executed in response to the command <00h>, the address <Ad03>, and the command <31h> being issued after completion of the data-out on the plane 3 (PL3) in the chip 0 (CP0) are the same as those of the first embodiment. Upon initiation of the cache read, the sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Hereinafter, the command sequences corresponding to a period from C to G are repeated until all of data to be read in the planes 0 to 3 (PL0 to PL3) in the chip 0 (CP0) are data-out.

4.3 Advantageous Effect

With the configuration according to the present embodiment, the memory controller 300 can issue the command "31h" on the plane q after issuance of the command "05h" on the plane q+1 in a chip and before initiation of the data-out on the plane q+1. That is, the prefetch on the plane q+1 can be executed during a period in which the memory controller 300 transmits the command <00h>, the address <Ad0q>, and the command <31h> on the plane q in the chip 0 (CP0). Therefore, a period until initiation of the data-out on the plane q+1 can be shortened by a period in which the transmission of the command <00h>, the address <Ad0q>, and the command <31h> on the plane q and the prefetch on the plane q+1 are overlapped. Accordingly, the speed of operations of the memory system can be enhanced.

5. Fifth Embodiment

The memory system 100 according to a fifth embodiment will be described. The memory system 100 according to the present embodiment corresponds to the memory system 100 according to the third embodiment modified to read data through the single plane read. Hereinafter, the following description will in principle concentrate on the feature different from the third embodiment.

5.1 Operation

Figure 37:
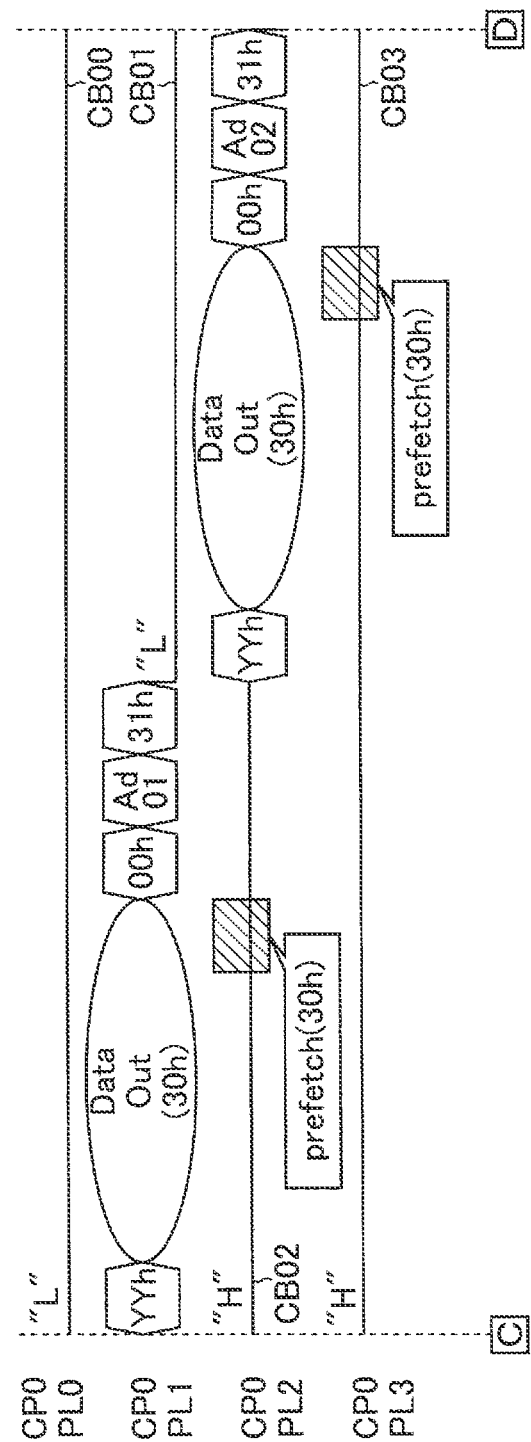
FIG. 37 is a diagram showing an example of the command sequence in the read operation of the memory system according to the fifth embodiment.
Figure 38:
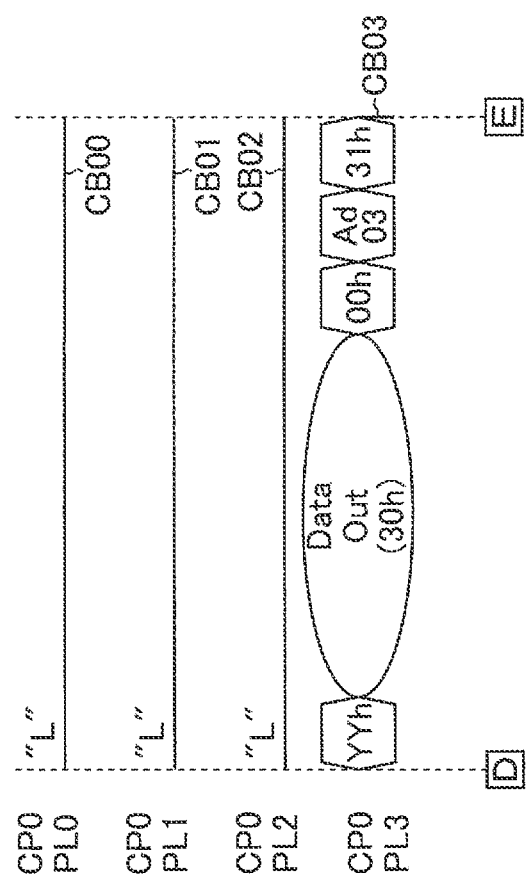
FIG. 38 is a diagram showing an example of the command sequence in the read operation of the memory system according to the fifth embodiment.

An operation of the memory system 100 according to the present embodiment will be described with reference to FIG. 36 to FIG. 38. FIG. 36 to FIG. 38 are each a diagram showing an example of a command sequence in the read operation of the memory system 100 according to the present embodiment. The following will describe an exemplary case in which the signals CEn1 and CEn2 are the same signal (CEn1=CEn2=CEn), and data is repeatedly read from the plane 0 to the plane 3 (PL0 to PL3) in this order in the chip 0 (CP0). FIG. 36 to FIG. 38 each also show the signals CB00 to CB03 of each of the planes in the NAND chip 0 (CP0). The same applies to the case in which data is read from the chip 1 (CP1). The read operation in the present embodiment corresponds to the single plane read.

First, the memory controller 300 executes the normal read in order of the planes 0 to 3 (PL0 to PL3) in the chip 0 (CP0). The command sequence and the signals CB00 to CB03 during a period from when the memory controller 300 sets the signal CEn to the "L" level to when the normal read is executed on the plane 3 (PL3) in the chip 0 (CP0) are the same as those during a period until A shown in FIG. 19 according to the second embodiment. Note that the operation in this period is the same as that of the fourth embodiment.

Next, the memory controller 300 executes the status read and the cache read in order of the planes 0 to 3 (PL0 to PL3) in the chip 0 (CP0). The command sequence and the signals CB00 to CB03 during a period from execution of the normal read on the plane 3 (PL3) in the chip 0 (CP0) to execution of the cache read on the plane 3 (PL3) in the chip 0 (CP0) are the same as those during a period from A to B shown in FIG. 31 according to the fourth embodiment. Note that the operation in this period is the same as that of the fourth embodiment.

Next, the memory controller 300 reserves prefetch of read data in the normal read executed on the plane 0 (PL0) in the chip 0 (CP0).

More specifically, as shown in FIG. 36, the memory controller 300 issues the command <05h>, the address <Ad00>, and the command <E0h> in order to reserve the prefetch on the plane 0 (PL0) in the chip 0 (CP0). As with the third embodiment, the memory controller 300 can issue the command <05h>, the address <Ad00>, and the command <E0h> during a period in which the command <00h>, the address <Ad03>, and the command <31h> are issued and the cache read is executed (that is, a period in which the signal CB00 is in the busy state).

In the chip 0 (CP0), the input/output circuit 10 receives the command <05h>, the address <Ad00>, and the command <E0h> each issued by the memory controller 300. The input/output circuit 10 transmits the received command <05h> to the command register 0 (MR0) based on the address <Ad00> and also copies the command <05h> to the command register 0' (MR0'). The input/output circuit 10 transmits the row address RA of the received address <Ad00> to the row address register 0 (RR0) and also copies the row address RA of the address <Ad00> to the row address register 0' (RR0'). The input/output circuit 10 transmits the column address CA of the received address <Ad00> to the column address register 0 (CR0) and also copies the column address CA of the address <Ad00> to the column address register 0' (CR0'). The input/output circuit 10 transmits the received command <E0h> to the command register 0 (MR0) based on the address <Ad00> and also copies the command <E0h> to the command register 0' (MR0').

When the row address RA of the address <Ad00> is copied to the row address register 0' (RR0'), the row address register 0' (RR0') transmits the row address RA to the row decoder 52A.

Upon receipt of the command <E0h> from the command register 0' (MR0'), the sequencer 30 in the chip 0 (CP0) couples the bus switch BSW to the data register 54A and reserves the prefetch on the plane 0 (PL0). The sequencer 30 then initiates the prefetch. That is, transfer of data from the data register 54A to the FIFO circuit 12 is initiated. Upon receipt of the command <E0h> with the signal CB00 being in the ready state, the sequencer 30 immediately executes the prefetch on the plane 0 (PL0) in the chip 0 (CP0). As with the third embodiment, in the case of receiving the command <E0h> with the signal CB00 being in the busy state, the sequencer 30 executes the prefetch on the plane 0 (PL0) in the chip 0 (CP0) during a period in which the signal CB00 is in the busy state. More specifically, upon receipt of the command <E0h> with the signal CB00 being in the busy state, the sequencer 30 executes the prefetch subsequently to the cache transfer.

Upon initiation of the prefetch, the sequencer 30 in the chip 0 (CP0) resets the counter value CNT of the column address counter circuit CC0' to 0. The column address register 0' (CR0') transmits the first to last column addresses CA to the column decoders 55A to 55D. Based on a result of decoding the column address CA of the address <Ad00>, the column decoder 55A selects a corresponding latch circuit in the data register 54A. Data in the latch circuit selected in sequence is transmitted to the FIFO circuit 12.

Next, the memory controller 300 executes the status read on the plane 0 (PL0) in the chip 0 (CP0). The particulars of the aforementioned status read executed in response to the command <78h> and the address <Ad00> being issued after issuance of the command <05h>, the address <Ad00>, and the command <E0h> are the same as those of the first embodiment.

Upon receipt of the signal CB00 indicative of the ready state from the status register 21, the memory controller 300 executes the data-out on the plane 0 (PL0) in the chip 0 (CP0).

More specifically, the memory controller 300 issues the command <YYh> in order to execute the data-out on the plane 0 (PL0) in the chip 0 (CP0).

In the chip 0 (CP0), the input/output circuit 10 receives the command <YYh> issued by the memory controller 300. The input/output circuit 10 transmits the received command <YYh> to the command register 0 (MR0).

Upon receipt of the command <YYh> from the command register 0 (MR0), the sequencer 30 in the chip 0 (CP0) initiates the data-out on the plane 0 (PL0) on which the prefetch has been executed.

On the plane 0 (PL0) in the chip 0 (CP0), upon completion of transfer of data from the data register 54A to the FIFO circuit 12, the sequencer 30 in the chip 0 (CP0) couples the bus switch BSW to the data register 54B, as shown in FIG. 24, FIG. 25, and FIG. 36. When the coupling of the bus switch BSW is switched to the data register 54B in a course of the data-out on the plane 0 (PL0) in the chip 0 (CP0), the sequencer 30 initiates the prefetch on the plane 1 (PL1) in the chip 0 (CP0). That is, transfer of data from the data register 54B to the FIFO circuit 12 is initiated.

Next, the memory controller 300 executes the cache read on the plane 0 (PL0) in the chip 0 (CP0). The particulars of the aforementioned cache read executed in response to the command <00h>, the address <Ad00>, and the command <31h> being issued after completion of the data-out on the plane 0 (PL0) in the chip 0 (CP0) are the same as those of the first embodiment. Upon initiation of the cache read, the sequencer 30 in the chip 0 (CP0) sets the signal CB00 to the busy state. Upon completion of the cache transfer on the plane 0 (PL0) in the chip 0 (CP0), the sequencer 30 sets the signal CB00 to the ready state.

Next, as shown in FIG. 37, the memory controller 300 executes the data-out on the plane 1 (PL1) in the chip 0 (CP0).

More specifically, after issuance of the command <00h>, the address <Ad00>, and the command <31h>, the memory controller 300 issues the command <YYh> in order to execute the data-out on the plane 1 (PL1) in the chip 0 (CP0).

In the chip 0 (CP0), the input/output circuit 10 receives the command <YYh> issued by the memory controller 300. The input/output circuit 10 transmits the received command <YYh> to the command register 1 (MR1).

Upon receipt of the command <YYh> from the command register 1 (MR1), the sequencer 30 in the chip 0 (CP0) initiates the data-out on the plane 1 (PL1) on which the prefetch has been executed.

On the plane 1 (PL1) in the chip 0 (CP0), upon completion of transfer of data from the data register 54B to the FIFO circuit 12, the sequencer 30 in the chip 0 (CP0) couples the bus switch BSW to the data register 54C, as shown in FIG. 24, FIG. 25, and FIG. 37. When the coupling of the bus switch BSW is switched to the data register 54C in a course of the data-out on the plane 1 (PL1) in the chip 0 (CP0), the sequencer 30 initiates the prefetch on the plane 2 (PL2) in the chip 0 (CP0). That is, transfer of data from the data register 54C to the FIFO circuit 12 is initiated.

Next, the memory controller 300 executes the cache read on the plane 1 (PL1) in the chip 0 (CP0). The particulars of the aforementioned cache read executed in response to the command <00h>, the address <Ad01>, and the command <31h> being issued after completion of the data-out on the plane 1 (PL1) in the chip 0 (CP0) are the same as those of the first embodiment. Upon initiation of the cache read, the sequencer 30 in the chip 0 (CP0) sets the signal CB01 to the busy state. Upon completion of the cache transfer on the plane 1 (PL1) in the chip 0 (CP0), the sequencer 30 sets the signal CB01 to the ready state.

Next, as shown in FIG. 37, the memory controller 300 executes the data-out on the plane 2 (PL2) in the chip 0 (CP0).

More specifically, after issuance of the command <00h>, the address <Ad01>, and the command <31h>, the memory controller 300 issues the command <YYh> in order to execute the data-out on the plane 2 (PL2) in the chip 0 (CP0).

In the chip 0 (CP0), the input/output circuit 10 receives the command <YYh> issued by the memory controller 300. The input/output circuit 10 transmits the received command <YYh> to the command register 2 (MR2).

Upon receipt of the command <YYh> from the command register 2 (MR2), the sequencer 30 in the chip 0 (CP0) initiates the data-out on the plane 2 (PL2) on which the prefetch has been executed.

On the plane 2 (PL2) in the chip 0 (CP0), upon completion of transfer of data from the data register 54C to the FIFO circuit 12, the sequencer 30 in the chip 0 (CP0) couples the bus switch BSW to the data register 54D, as shown in FIG. 24, FIG. 25, and FIG. 37. When the coupling of the bus switch BSW is switched to the data register 54D in a course of the data-out on the plane 2 (PL2) in the chip 0 (CP0), the sequencer 30 initiates the prefetch on the plane 3 (PL3) in the chip 0 (CP0). That is, transfer of data from the data register 54D to the FIFO circuit 12 is initiated.

Next, the memory controller 300 executes the cache read on the plane 2 (PL2) in the chip 0 (CP0). The particulars of the aforementioned cache read executed in response to the command <00h>, the address <Ad02>, and the command <31h> being issued after completion of the data-out on the plane 2 (PL2) in the chip 0 (CP0) are the same as those of the first embodiment. Upon initiation of the cache read, the sequencer 30 in the chip 0 (CP0) sets the signal CB02 to the busy state. Upon completion of the cache transfer on the plane 2 (PL2) in the chip 0 (CP0), the sequencer 30 sets the signal CB02 to the ready state.

Next, as shown in FIG. 38, the memory controller 300 executes the data-out on the plane 3 (PL3) in the chip 0 (CP0).

More specifically, after issuance of the command <00h>, the address <Ad02>, and the command <31h>, the memory controller 300 issues the command <YYh> in order to execute the data-out on the plane 3 (PL3) in the chip 0 (CP0).

In the chip 0 (CP0), the input/output circuit 10 receives the command <YYh> issued by the memory controller 300. The input/output circuit 10 transmits the received command <YYh> to the command register 3 (MR3).

Upon receipt of the command <YYh> from the command register 3 (MR3), the sequencer 30 in the chip 0 (CP0) initiates the data-out on the plane 3 (PL3) on which the prefetch has been executed.

Next, the memory controller 300 executes the cache read on the plane 3 (PL3) in the chip 0 (CP0). The particulars of the aforementioned cache read executed in response to the command <00h>, the address <Ad03>, and the command <31h> being issued after completion of the data-out on the plane 3 (PL3) in the chip 0 (CP0) are the same as those of the first embodiment. Upon initiation of the cache read, the sequencer 30 in the chip 0 (CP0) sets the signal CB03 to the busy state. Upon completion of the cache transfer on the plane 3 (PL3) in the chip 0 (CP0), the sequencer 30 sets the signal CB03 to the ready state.

Hereinafter, the command sequences corresponding to a period from B to E are repeated until all of data to be read in the planes 0 to 3 (PL0 to PL3) in the chip 0 (CP0) are data-out.

5.2 Advantageous Effect

With the configuration according to the present embodiment, as with the first embodiment, the prefetch can be reserved during the read operation, so that a period until initiation of the data-out can be shortened as compared to a case in which the prefetch is reserved after completion of the read operation. Furthermore, as with the third embodiment, the prefetch on the plane p+1 can be executed during a period in which the data-out on the plane p in a chip is executed. Therefore, a period until initiation of the data-out of the plane p+1 can be shortened by a period in which the data-out on the plane p and the prefetch on the plane p+1 are overlapped. Accordingly, the speed of operations of the memory system can be enhanced.

6. Modification, etc.

As described above, a memory system according to an embodiment includes: a first chip (CP0) including a first plane (PL0) and a first input/output circuit (10); and a controller (300) which is capable of issuing a command for controlling the first chip. The first plane includes: a first memory cell array (51A) having a plurality of first memory cell transistors (MC); and a first latch circuit (54A) which is capable of storing first read data read from the first memory cell array. The first input/output circuit includes a first FIFO circuit (12 (12A)) which is capable of fetching the first read data from the first latch circuit. The controller is capable of transmitting to the first chip a first command (05h) for ordering fetching of the first read data from the first latch circuit to the first FIFO circuit during a period in which a read operation is executed on the first plane.

The embodiments are not limited to those described in the above, and various modifications can be made.

The FIFO circuit may be a First In Last Out (FILO) circuit.

Moreover, in the embodiments described above, a NAND flash memory was described as an example of a semiconductor memory device; however, the embodiment is not limited to a NAND flash memory, and is applicable to other semiconductor memories in general. Furthermore, the present embodiment is applicable to various memory devices other than a semiconductor memory.

While several embodiments have been described, these embodiments have been presented by way of example and are not intended to limit the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

The invention claimed is:

1. A memory system comprising:
a first chip including a first plane and a first input/output circuit; and
a controller configured to issue a command for controlling the first chip,
wherein:
the first plane includes:
a first memory cell array having a plurality of first memory cell transistors; and
a first latch circuit configured to store first read data read from the first memory cell array,
the first input/output circuit includes a first FIFO circuit configured to fetch the first read data from the first latch circuit, and
the controller is configured to transmit a read command for ordering execution of a read operation to the first plane, and thereafter, to transmit, to the first chip, a first command for ordering fetching of the first read data from the first latch circuit to the first FIFO circuit during a period in which the read operation is executed on the first plane, the read command including address information indicating the first plane, and the first command including the address information.

2. The memory system according to claim 1, wherein the first read data is fetched from the first latch circuit to the first FIFO circuit during the period in which the read operation is executed on the first plane.

3. The memory system according to claim 1, further comprising a second chip including a second plane and a second input/output circuit,
wherein:
the second plane includes:
a second memory cell array having a plurality of second memory cell transistors; and
a second latch circuit configured to store second read data read from the second memory cell array,
the second input/output circuit includes a second FIFO circuit configured to fetch the second read data from the second latch circuit,
the controller is configured to issue a command for controlling the second chip, and
the controller is configured to transmit, to the second chip, a second command for ordering fetching of the second read data from the second latch circuit to the second FIFO circuit during a period in which a read operation is executed on the second plane after transmission of the first command to the first chip.

4. The memory system according to claim 3, wherein the second read data is fetched from the second latch circuit to the second FIFO circuit during a period in which the read operation is executed on the second plane.

5. The memory system according to claim 3, wherein:
the first chip further includes a third plane,
the third plane includes:
- a third memory cell array having a plurality of third memory transistors; and
- a third latch circuit configured to store third read data read from the third memory cell array, the first FIFO circuit is configured to fetch the third read data from the third latch circuit, and
the controller is configured to (i) transmit, to the first chip, a third command for ordering outputting of the first read data from the first FIFO circuit to the controller after transmission of the second command to the second chip, and (ii) transmit, to the first chip, a fourth command for ordering fetching of the third read data from the third latch circuit to the first FIFO circuit after outputting of the first read data from the first FIFO circuit to the controller based on the third command.

6. The memory system according to claim 1, wherein:
the first chip further includes a second plane,
the second plane includes:
- a second memory cell array having a plurality of second memory cell transistors; and
- a second latch circuit configured to store second read data read from the second memory cell array, the first input/output circuit further includes a second FIFO circuit configured to fetch the second read data from the second latch circuit, and
the controller is configured to transmit, to the first chip, a second command for ordering fetching of the second read data from the second latch circuit to the second FIFO circuit during a period in which a read operation is executed on the second plane.

7. The memory system according to claim 6, wherein the second read data is fetched from the second latch circuit to the second FIFO circuit during a period in which the read operation is executed on the second plane.

8. The memory system according to claim 6, wherein:
the first chip further includes a third plane,
the third plane includes:
- a third memory cell array having a plurality of third memory transistors; and
- a third latch circuit configured to store third read data read from the third memory cell array, the first FIFO circuit is configured to fetch the third read data from the third latch circuit, and
the controller is configured to (i) transmit, to the first chip, a third command for ordering outputting of the first read data from the first FIFO circuit to the controller after transmission of the second command to the first chip, and (ii) transmit, to the first chip, a fourth command for ordering fetching of the third read data from the third latch circuit to the first FIFO circuit after outputting of the first read data from the first FIFO circuit to the controller based on the third command.

9. The memory system according to claim 1, wherein:
the first chip further includes a second plane,
the second plane includes:
- a second memory cell array having a plurality of second memory cell transistors; and
- a second latch circuit configured to store second read data read from the second memory cell array, the first FIFO circuit is capable of fetching the second read data from the second latch circuit, and
the controller transmits to the first chip a second command for ordering outputting of the first read data from the first FIFO circuit to the controller after transmission of the first command to the first chip, and the second read data is fetched from the second latch circuit to the first FIFO circuit during a period in which the first read data is output from the first FIFO circuit to the controller based on the second command.

10. The memory system according to claim 9, further comprising a switch configured to switch between coupling of the first FIFO circuit to the first latch circuit and coupling of the first FIFO circuit to the second latch circuit,
wherein after transferring of the first read data from the first latch circuit to the first FIFO circuit, the switch is switched from the coupling of the first FIFO circuit to the first latch circuit to the coupling of the first FIFO circuit to the second latch circuit.

11. The memory system according to claim 9, wherein the controller is configured to transmit the first command to the first chip during a period in which the read operation is executed on the first plane and the second plane.

12. A memory system comprising:
a chip including a first plane, a second plane, and an input/output circuit; and
a controller configured to issue a command for controlling the chip,
wherein the first plane includes:
- a first memory cell array having a plurality of first memory cell transistors; and
- a first latch circuit configured to store first read data read from the first memory cell array, the second plane includes:
- a second memory cell array having a plurality of second memory cell transistors; and
- a second latch circuit configured to store second read data read from the second memory cell array, the input/output circuit includes a FIFO circuit configured to fetch the first read data from the first latch circuit and to fetch the second read data from the second latch circuit,
the controller is configured to transmit, to the chip, a first command for ordering fetching of the second read data from the second latch circuit to the FIFO circuit, and
the controller is configured to issue, with respect to the first plane, a second command for executing a read of the first read data from the first memory cell array to the first latch circuit, after transmission of the first command to the chip and before initiation of outputting of the second read data from the FIFO circuit to the controller.

* * * * *